United States Patent
Kumaki et al.

(10) Patent No.: US 9,904,172 B2
(45) Date of Patent: *Feb. 27, 2018

(54) SHRINK MATERIAL AND PATTERN FORMING PROCESS

(71) Applicant: SHIN-ETSU CHEMICAL CO., LTD., Tokyo (JP)

(72) Inventors: Kentaro Kumaki, Joetsu (JP); Satoshi Watanabe, Joetsu (JP); Koji Hasegawa, Joetsu (JP); Daisuke Domon, Joetsu (JP); Kenji Yamada, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/961,046

(22) Filed: Dec. 7, 2015

(65) Prior Publication Data
US 2016/0161850 A1    Jun. 9, 2016

(30) Foreign Application Priority Data

Dec. 8, 2014 (JP) .................................. 2014-248080
Apr. 6, 2015 (JP) .................................. 2015-077690

(51) Int. Cl.
*G03F 7/40* (2006.01)
*C08L 25/08* (2006.01)
(Continued)

(52) U.S. Cl.
CPC .............. *G03F 7/40* (2013.01); *C08F 220/26* (2013.01); *C08F 220/30* (2013.01);
(Continued)

(58) Field of Classification Search
CPC ...... G03F 7/004; G03F 7/0045; G03F 7/0046; G03F 7/0397; G03F 7/2004;
(Continued)

(56) References Cited

U.S. PATENT DOCUMENTS 6,579,657 B1    6/2003  Ishibashi et al.
8,815,491 B2 *  8/2014  Masunaga ............. G03F 7/0045
                                                      430/270.1

(Continued)

FOREIGN PATENT DOCUMENTS

EP    1 513 013 A2    3/2005
JP    10-73927 A      3/1998
(Continued)

OTHER PUBLICATIONS

Extended European Search Report dated Jul. 21, 2016, issued in counterpart Application No. 15197548.9. (5 pages).
(Continued)

*Primary Examiner* — Amanda C Walke
(74) *Attorney, Agent, or Firm* — Westerman, Hattori, Daniels & Adrian, LLP

(57) ABSTRACT

A shrink material is provided comprising a specific polymer and a solvent containing an anti-vanishing solvent. A pattern is formed by applying a resist composition comprising a base resin and an acid generator onto a substrate to form a resist film, exposing, developing in an organic solvent developer to form a negative resist pattern, applying the shrink material onto the pattern, and removing the excessive shrink material with an organic solvent for thereby shrinking the size of holes and/or slits in the pattern.

13 Claims, 1 Drawing Sheet

(51) Int. Cl.
| | |
|---|---|
| *C08L 33/14* | (2006.01) |
| *C08L 25/18* | (2006.01) |
| *C08F 220/30* | (2006.01) |
| *C08F 220/34* | (2006.01) |
| *C08F 220/26* | (2006.01) |
| *C08F 226/06* | (2006.01) |
| *C08F 226/02* | (2006.01) |
| *G03F 7/11* | (2006.01) |
| *C08F 220/36* | (2006.01) |
| *G03F 7/004* | (2006.01) |
| *G03F 7/039* | (2006.01) |
| *G03F 7/32* | (2006.01) |
| *C08F 220/28* | (2006.01) |
| *G03F 7/20* | (2006.01) |

(52) U.S. Cl.
CPC .......... *C08F 220/34* (2013.01); *C08F 220/36* (2013.01); *C08F 226/02* (2013.01); *C08F 226/06* (2013.01); *C08L 25/08* (2013.01); *C08L 25/18* (2013.01); *C08L 33/14* (2013.01); *G03F 7/0045* (2013.01); *G03F 7/0046* (2013.01); *G03F 7/0397* (2013.01); *G03F 7/11* (2013.01); *G03F 7/325* (2013.01); *C08F 2220/283* (2013.01); *C08F 2220/285* (2013.01); *G03F 7/2004* (2013.01); *G03F 7/2041* (2013.01)

(58) Field of Classification Search
CPC ...... G03F 7/2037; G03F 7/2041; G03F 7/325; G03F 7/40; G03F 7/11; C08F 226/02; C08F 226/06; C08F 220/26; C08F 220/30; C08F 220/34; C08F 220/36; C08F 2220/283; C08F 2220/285; C08L 25/08; C08L 25/18; C08L 33/14
USPC ......... 430/270.1, 271.1, 322, 325, 329, 330, 430/434, 435; 526/258, 303.1, 306, 307
See application file for complete search history.

(56) References Cited

U.S. PATENT DOCUMENTS

| | | | |
|---|---|---|---|
| 9,023,587 B2* | 5/2015 | Hatakeyama | G03F 7/322 430/270.1 |
| 2008/0073322 A1 | 3/2008 | Nozaki et al. | |
| 2008/0090172 A1 | 4/2008 | Hatakeyama et al. | |
| 2008/0153030 A1 | 6/2008 | Kobayashi et al. | |
| 2009/0226843 A1* | 9/2009 | Hatakeyama | G03F 7/40 430/286.1 |
| 2010/0119717 A1 | 5/2010 | Hong et al. | |
| 2010/0178617 A1 | 7/2010 | Hatakeyama et al. | |
| 2011/0003251 A1* | 1/2011 | Tanaka | G03F 7/0397 430/285.1 |
| 2015/0086929 A1* | 3/2015 | Hatakeyama | G03F 7/40 430/324 |
| 2015/0253669 A1* | 9/2015 | Yamamoto | C08F 12/24 430/324 |
| 2015/0338744 A1* | 11/2015 | Hatakeyama | G03F 7/40 430/331 |
| 2016/0124313 A1* | 5/2016 | Hatakeyama | G03F 7/0397 430/325 |
| 2016/0161851 A1* | 6/2016 | Kumaki | G03F 7/0045 430/296 |

FOREIGN PATENT DOCUMENTS

| | | |
|---|---|---|
| JP | 2007-293294 A | 11/2007 |
| JP | 2008-275995 A | 11/2008 |

OTHER PUBLICATIONS

Yi et al., "Contact Hole Patterning for Random Logic Circuits using Block Copolymer Directed Self-Assembly", Proc. of SPIE, 2012, pp. 83230W-1-83230W-6, vol. 8323, cited in the Specification.

* cited by examiner

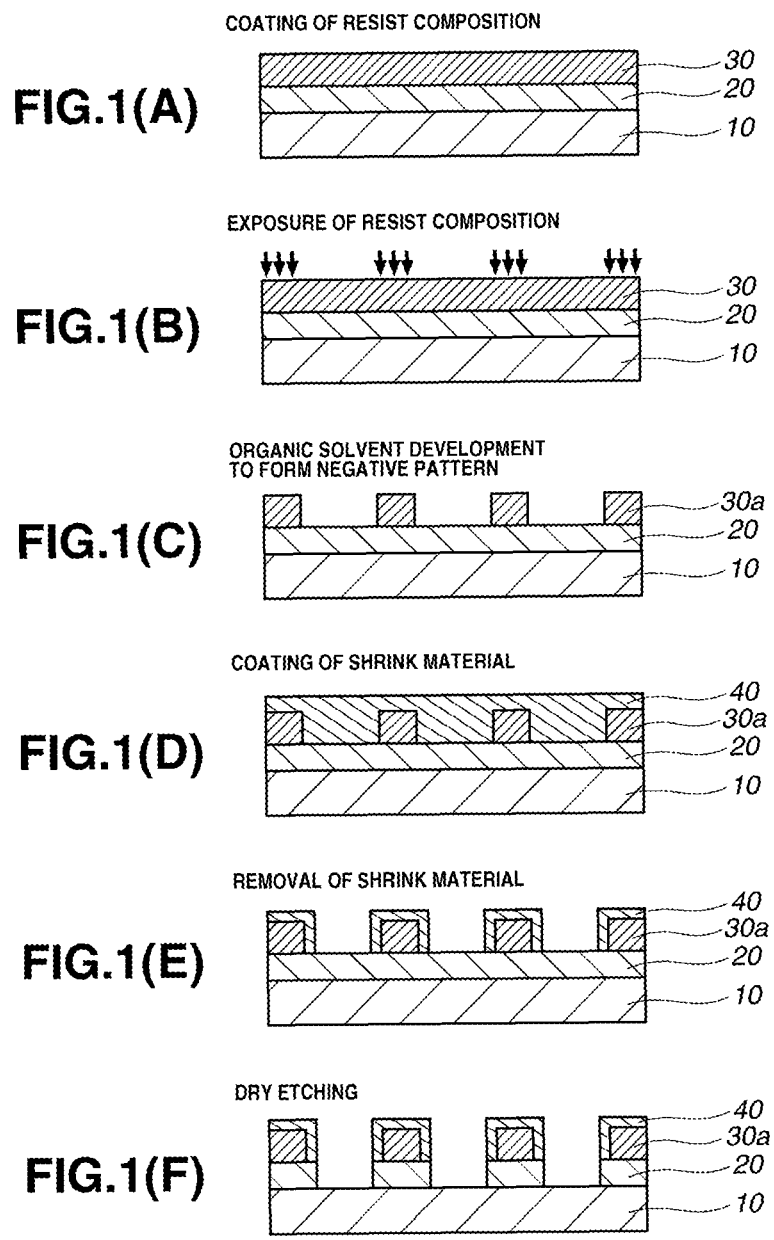

SHRINK MATERIAL AND PATTERN FORMING PROCESS

CROSS-REFERENCE TO RELATED APPLICATION

This non-provisional application claims priority under 35 U.S.C. § 119(a) on Patent Application Nos. 2014-248080 and 2015-077690 filed in Japan on Dec. 8, 2014 and Apr. 6, 2015, respectively, the entire contents of which are hereby incorporated by reference.

TECHNICAL FIELD

This invention relates to a shrink material for shrinking the size of features in a resist pattern and a pattern forming process using the shrink material.

BACKGROUND ART

While the effort to reduce the pattern rule is in rapid progress to meet the recent demand for higher integration level and operating speed of LSIs, the photolithography is on widespread use. The photolithography has the essential limit of resolution determined by the wavelength of a light source. One micropatterning approach to go beyond the limit of resolution is by combining ArF excimer laser immersion lithography with double patterning. One typical version of double patterning is litho-etch-litho-etch (LELE) process involving forming a pattern via exposure, transferring the pattern to a hard mask on a substrate by etching, effecting second exposure at a half-pitch shifted position, and etching the hard mask. This process has the problem of misalignment between two exposures or overlay error. Another version of double patterning is self-aligned double patterning (SADP) process involving the steps of transferring a resist pattern to a hard mask, growing a film on opposite sides of hard mask features, and leaving sidewalls of film for thereby doubling pattern size. The SADP process needs exposure only once and mitigates the problem of overlay error. To simplify the process, a modified version of the SADP process of forming a silicon oxide film on sidewalls of resist pattern features as developed rather than sidewalls of hard mask features for thereby doubling pattern size is also proposed. Since the SADP process is successful in reducing the pitch of line pattern to half, the pitch can be reduced to ¼ by repeating the SADP process twice.

Not only shrinking of line patterns, but also shrinking of hole patterns is necessary. Unless the hole pattern is shrunk, shrinkage over the entire chip is incomplete. One known method of shrinking a hole pattern is RELACS® method described in Patent Document 1. This method intends to reduce the size of a hole pattern by coating a resist pattern as developed with a water-soluble material containing a crosslinker, and baking the coating to form a crosslinked layer on the resist surface for causing the resist pattern to be thickened. Patent Document 2 describes a shrink material comprising an amino-containing polymer or polyamine, which bonds to the resist surface via neutralization reaction with carboxyl groups on the resist surface, for thereby thickening the resist film. It is also proposed in Non-Patent Document 1 to shrink a hole pattern by utilizing the direct self-assembly (DSA) of a block copolymer.

Shrinkage by the RELACS® method has the problem that since a crosslinker becomes active with an acid catalyst within resist, the size of holes is non-uniform after shrinkage if acid diffusion is non-uniform. In the shrink method based on neutralization and bonding of amino polymer, the pattern is thickened as direct reflection of irregularities on the resist surface so that dimensional variations of the resist pattern as developed and dimensional variations after shrinkage are identical. The shrink method utilizing the DSA function of a block copolymer has advantages including an increased amount of shrinkage and a minimal dimensional variation after shrinkage, but some problems. Namely, if the DSA is applied to holes of different size, shrinkage cannot be induced for those holes of the size that causes a contradictory assembly of block copolymer. If the DSA is applied to a trench pattern, shape deformation becomes a problem, for example, a plurality of hole patterns are formed.

There is a need for a shrink material which can shrink a hole pattern without changing the shape of the resist pattern, and improve the dimensional variation and edge roughness (LWR) of the resist pattern after development.

CITATION LIST

Patent Document 1: JP-A H10-073927 (U.S. Pat. No. 6,579,657)

Patent Document 2: JP-A 2008-275995 (US 20100119717)

Patent Document 3: JP-A 2007-293294

Non-Patent Document 1: Proc. SPIE Vol. 8323 p83230W-1 (2012)

SUMMARY OF INVENTION

As discussed above, the method of applying a RELACS® material of crosslink type or neutralizing reaction-mediated bond type onto a resist pattern causes no pattern deformation, but fails to reduce the dimensional variation of the resist pattern. Patent Document 3 proposes a shrink material of alkaline aqueous solution treatment type applied to a positive tone resist pattern resulting from alkaline development. With respect to the shrinkage of a hole pattern with a narrow pitch, this shrink material fails to gain a sufficient amount of shrinkage and to reduce dimensional variation.

An object of the invention is to provide a shrink material which when coated onto a hole resist pattern as developed, can shrink the hole size while improving dimensional variation; and a pattern forming process using the same.

Seeking a shrink material capable of effectively shrinking a resist pattern as developed, the inventors have found that by forming a resist film based on a base resin having an acid labile group-substituted carboxyl group and an acid generator, forming a negative tone resist pattern therefrom via exposure and organic solvent development, coating the resist pattern with a shrink material comprising a specific polymer and a solvent containing an anti-vanishing solvent, baking, and removing the excessive shrink material with an organic solvent, the size of holes and/or slits in the resist pattern can be shrunk in a controlled manner.

In one aspect, the invention provides a shrink material comprising a polymer and a solvent containing an anti-vanishing solvent which does not cause a resist pattern after development to vanish, the polymer comprising recurring units of at least one type selected from units having the formulae (1a) and (1b).

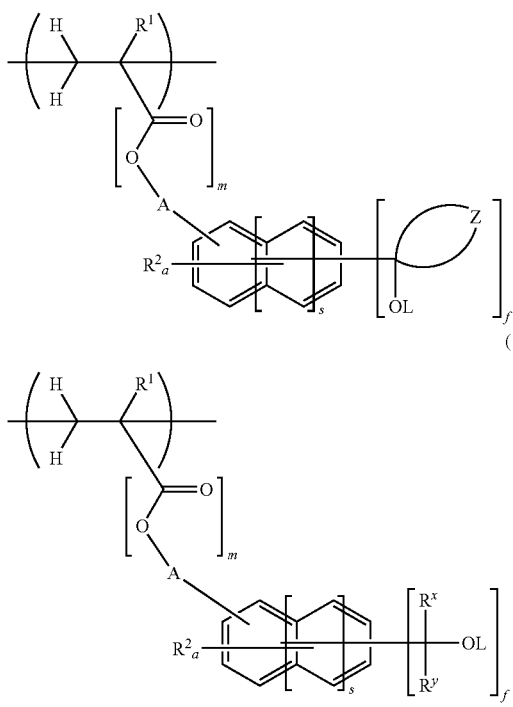

(1a)

(1b)

Herein A is a single bond or a $C_1$-$C_{10}$ alkylene group which may contain an ethereal oxygen atom at an intermediate of the chain; R' is hydrogen, fluorine, methyl or trifluoromethyl; $R^2$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group; L is hydrogen, a straight, branched or cyclic, $C_1$-$C_{10}$ monovalent aliphatic hydrocarbon group which may contain an ethereal oxygen atom, carbonyl moiety or carbonyloxy moiety at an intermediate of the chain, or an optionally substituted, monovalent aromatic ring-containing group; Z bonds with the carbon atom to form a $C_5$-$C_{15}$ alicyclic group; $R^x$ and $R^y$ are each independently hydrogen or a straight, branched or cyclic, $C_1$-$C_{15}$ alkyl group which may be substituted with a hydroxyl or alkoxy moiety, at least one of $R^x$ and $R^y$ being a cyclic $C_5$-$C_{15}$ alkyl group; f is an integer of 1 to 3, s is an integer of 0 to 2, a is equal to (5+2s–f), and m is 0 or 1.

Preferably the polymer further comprises recurring units having the formula (2).

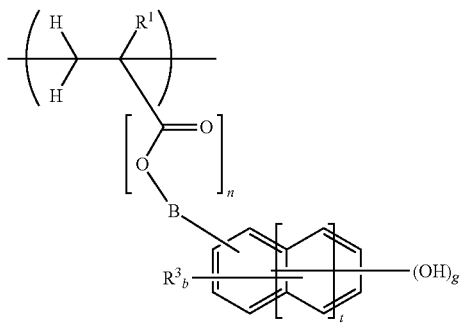

(2)

Herein B is a single bond or a $C_1$-$C_{10}$ alkylene group which may contain an ethereal oxygen atom at an intermediate of the chain; $R^1$ is as defined above; $R^3$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group; g is an integer of 0 to 3, t is an integer of 0 to 2, b is equal to (5+2t–g), and n is 0 or 1.

Preferably the polymer further comprises recurring units having the formula (3).

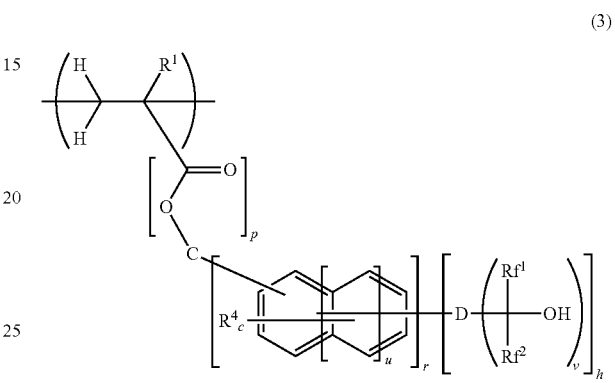

(3)

Herein C is a single bond or a $C_1$-$C_{10}$ alkylene group which may contain an ethereal oxygen atom at an intermediate of the chain; $R^1$ is as defined above; $R^4$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group; D is a single bond or a straight, branched or cyclic, $C_1$-$C_{10}$ (v+1)-valent hydrocarbon group which may contain an ethereal oxygen atom, carbonyl moiety or carbonyloxy moiety at an intermediate of the chain, in which some or all carbon-bonded hydrogen atoms may be substituted by fluorine; $Rf^1$ and $Rf^2$ are each independently a $C_1$-$C_6$ alkyl group containing at least one fluorine atom, $Rf^1$ may bond with D to form a ring with the carbon atoms to which they are attached; r is 0 or 1, h is an integer of 1 to 3, u is an integer of 0 to 2, c is equal to (5+2u–h), and v is 1 or 2.

Preferably the polymer further comprises recurring units of at least one type selected from units having the formulae (4) and (5).

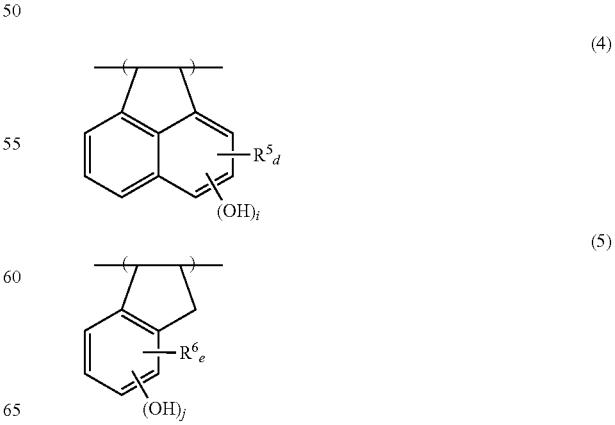

(4)

(5)

Herein $R^5$ and $R^6$ are each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group; i and j are each independently an integer of 0 to 2, d is equal to (6−i), and e is equal to (4−j).

Preferably the polymer further comprises recurring units of at least one type selected from units having the formulae (A) to (E).

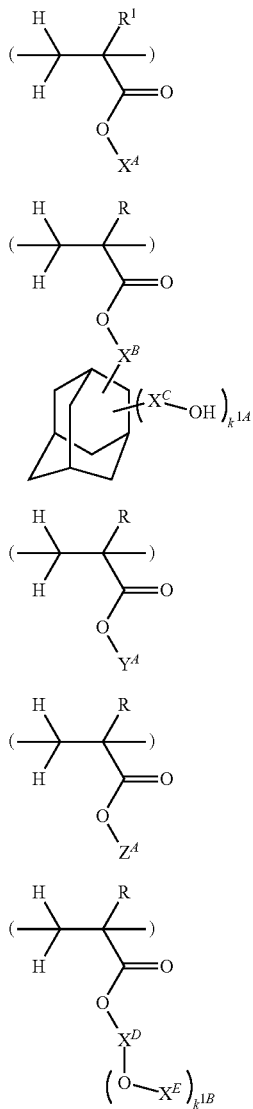

Herein $R^1$ is as defined above; $X^A$ is an acid labile group; $X^B$ and $X^C$ are each independently a single bond or a straight or branched $C_1$-$C_4$ divalent hydrocarbon group; $X^D$ is a straight, branched or cyclic, $C_1$-$C_{16}$ di- to pentavalent aliphatic hydrocarbon group in which any constituent —$CH_2$— may be substituted by —O— or —C(=O)—; $X^E$ is an acid labile group; $Y^A$ is a substituent group having a lactone, sultone or carbonate structure; $Z^A$ is hydrogen, a $C_1$-$C_{30}$ fluoroalkyl group or a $C_1$-$C_{15}$ fluoroalcohol-containing substituent group; $k^{1A}$ is an integer of 1 to 3, and $k^{1B}$ is an integer of 1 to 4.

Preferably the polymer further comprises recurring units having the formula (F).

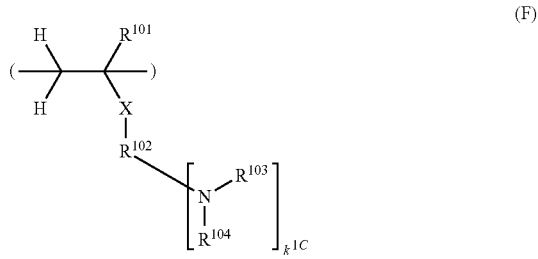

Herein $R^{101}$ is hydrogen or methyl; X is a single bond, —C(=O)—, —C(=O)—O— or —C(=O)—NH—; $R^{102}$ is a single bond or a straight, branched or cyclic $C_1$-$C_{10}$ alkylene group which may contain an ether, ester, carbonyl moiety, —N= or —S—, or a phenylene or naphthylene group; $R^{103}$ and $R^{104}$ are each independently hydrogen, a straight or branched $C_1$-$C_4$ alkyl group, or an acid labile group, or $R^{103}$ and $R^{104}$ may bond together to form a ring with the nitrogen atom to which they are attached, the ring optionally containing an ether bond, or either one of $R^{103}$ and $R^{104}$ may bond with $R^{102}$ to form a ring with the nitrogen atom to which they are attached; and $k^{1C}$ is 1 or 2.

The shrink material may further comprise a salt having the formula (9):

$$R^{11}\text{—CO}_2^- \qquad (9)$$

wherein $R^{11}$ is a straight, branched or cyclic $C_1$-$C_{20}$ alkyl group, straight, branched or cyclic $C_2$-$C_{20}$ alkenyl group or $C_6$-$C_{20}$ monovalent aromatic ring-containing group, in which some or all carbon-bonded hydrogen atoms may be substituted by fluorine, lactone ring-containing moiety, lactam ring-containing moiety or hydroxyl moiety, and in which an ether, ester or carbonyl moiety may intervene in a carbon-carbon bond, and $M^+$ is a sulfonium, iodonium or ammonium cation.

The shrink material may further comprise a salt having the formula (10):

$$R^{12}\text{—SO}_3^-M^+ \qquad (10)$$

wherein $R^{12}$ is a straight, branched or cyclic $C_1$-$C_{35}$ monovalent hydrocarbon group which may contain an oxygen atom, in which some or all carbon-bonded hydrogen atoms may be substituted by fluorine, with the proviso that the hydrogen atom bonded to the carbon atom at α-position relative to sulfonic acid is not substituted by fluorine, and $M^+$ is a sulfonium, iodonium or ammonium cation.

In a preferred embodiment, the shrink material may further comprise at least one basic compound selected from the group consisting of primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamates.

Preferably, the anti-vanishing solvent is an ester solvent of 7 to 16 carbon atoms, ketone solvent of 8 to 16 carbon atoms, or alcohol solvent of 4 to 10 carbon atoms.

Specifically, the anti-vanishing solvent is at least one solvent selected from the group consisting of:

ester solvents of 7 to 16 carbon atoms including pentyl acetate, isopentyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate, ketone solvents of 8 to 16 carbon atoms including 2-octanone, 3-octanone, 4-octanone, 2-nonanone, 3-nonanone, 4-nonanone, 5-nonanone, diisobutyl ketone, ethylcyclohexanone, ethylacetophenone, ethyl n-butyl ketone, di-n-butyl ketone, and diisobutyl ketone, and alcohol solvents of 4 to 10 carbon atoms including 1-butanol, 2-butanol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Preferably the solvent contains the anti-vanishing solvent and an additional solvent, and the additional solvent is selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In another aspect, the invention provides a pattern forming process comprising the steps of applying a resist composition onto a substrate, the resist composition comprising a base resin comprising recurring units having an acid labile group-substituted carboxyl group, an acid generator and an organic solvent, prebaking to form a resist film; exposing the resist film to high-energy radiation, baking the film; developing the exposed resist film in an organic solvent-based developer to form a negative resist pattern; applying the shrink material defined herein onto the negative resist pattern, baking; and removing the excessive shrink material with an organic solvent.

Typically, the base resin in the resist composition comprises recurring units (a) having an acid labile group-substituted carboxyl group, represented by the formula (11)

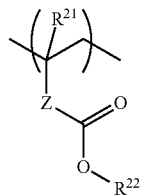

(11)

Herein $R^{21}$ is hydrogen or methyl, $R^{22}$ is an acid labile group, Z is a single bond or —C(=O)—O—$R^{23}$—, and $R^{23}$ is a straight, branched or cyclic $C_1$-$C_{10}$ alkylene group in which an ether or ester bond may intervene in a carbon-carbon bond, or naphthylene group.

In the pattern forming process, the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Preferably, the step of removing the excessive shrink material uses at least one organic solvent selected from the group consisting of propyl acetate, butyl acetate, isobutyl acetate, butenyl acetate, pentyl acetate, isopentyl acetate, 2-methylbutyl acetate, hexyl acetate, 2-ethylhexyl acetate, cyclohexyl acetate, methylcyclohexyl acetate, propyl formate, butyl formate, isobutyl formate, pentyl formate, isopentyl formate, hexyl formate, methyl valerate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, methyl crotonate, ethyl crotonate, propyl crotonate, isopropyl crotonate, butyl crotonate, tert-butyl crotonate, methyl propionate, ethyl propionate, ethyl pentenoate, propyl pentenoate, isopropyl pentenoate, butyl pentenoate, tert-butyl pentenoate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, ethyl pivalate, propyl pivalate, isopropyl pivalate, butyl pivalate, tert-butyl pivalate, butyl propionate, isobutyl propionate, tert-butyl propionate, benzyl propionate, ethyl 3-ethoxypropionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, 2-phenylethyl acetate, 2-heptanone, 3-heptanone, 4-heptanone, 2-hexanone, 3-hexanone, 2-octanone, 3-octanone, 4-octanone, 2-nonanone, 3-nonanone, 4-nonanone, 5-nonanone, methylcyclohexanone, ethylcyclohexanone, acetophenone, methylacetophenone, ethylacetophenone, ethyl n-butyl ketone, di-n-butyl ketone, diisobutyl ketone, 1-butanol, 2-butanol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Typically, the high-energy radiation is i-line of wavelength 364 nm, KrF excimer laser of wavelength 248 nm, ArF excimer laser of wavelength 193 nm, EUV of wavelength 13.5 nm, or EB.

Advantageous Effects of Invention

The process involving forming a resist film based on a base resin having an acid labile group-substituted carboxyl group and an acid generator, subjecting it to exposure and organic solvent development to form a negative tone resist pattern, and applying the shrink material of the invention to the resist pattern, is successful in shrinking the size of holes and/or slits in the resist pattern in a controlled manner.

BRIEF DESCRIPTION OF DRAWINGS

FIG. 1(A) to FIG. 1(F) illustrates, in cross-sectional view, steps of a pattern forming or shrinking process according to the invention; FIG. 1(A) showing a resist film formed on a substrate; FIG. 1(B) showing the resist film during exposure; FIG. 1(C) showing pattern formation after PEB and development of the resist film; FIG. 1(D) showing a shrink material coated on the resist pattern; FIG. 1(E) showing the resist pattern whose spaces have been shrunk by baking and removal of the excessive shrink material; and FIG. 1(F) showing dry etching of the substrate through the shrunk pattern as a mask.

DESCRIPTION OF PREFERRED EMBODIMENTS

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. As used herein, the term "film" is used interchangeably with "coating" or "layer."

The abbreviations and acronyms have the following meaning.
EB: electron beam
Mw: weight average molecular weight
Mn: number average molecular weight
Mw/Mn: molecular weight distribution or dispersity
GPC: gel permeation chromatography
PEB: post-exposure bake
PAG: photoacid generator In chemical formulae, Me stands for methyl, Ac stands for acetyl; and the broken line denotes a valence bond.

Shrink Material

The invention provides a shrink material comprising a polymer and a solvent containing an anti-vanishing solvent which does not cause a resist pattern after development to vanish. The polymer is defined as comprising recurring units of at least one type selected from units having the formulae (1a) and (1b). Note that this polymer is sometimes referred to as "shrink material polymer".

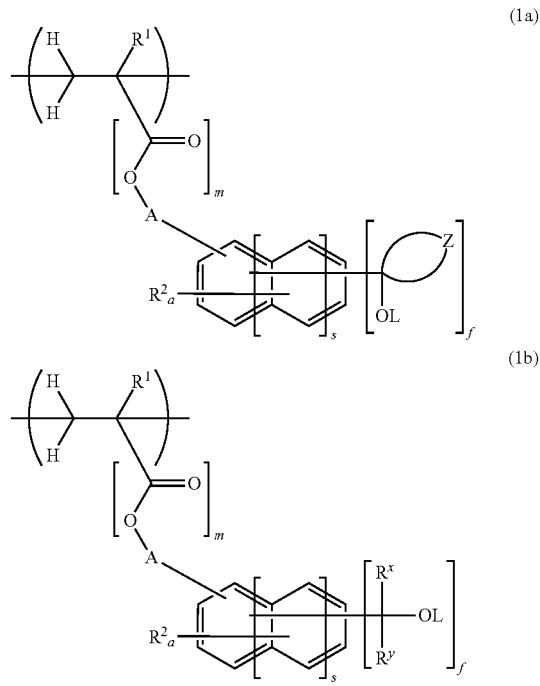

In formulae (1a) and (1b), "A" is a single bond or a $C_1$-$C_{10}$ alkylene group which may contain an ethereal oxygen atom at an intermediate position of the chain. Suitable alkylene groups include methylene, ethylene, propylene, trimethylene, tetramethylene, pentamethylene, hexamethylene, cyclopentylene, cyclohexylene, and structural isomers thereof having branched or cyclic structure. Inter alia, A is preferably a single bond, methylene, ethylene, propylene or trimethylene. When A is a group containing an ethereal oxygen atom, in the case of m=1 in formula (1), the ethereal oxygen atom may be included at any position excluding between the carbons at α and β-positions relative to the ester oxygen. In the case of m=0, the ethereal oxygen atom becomes the atom bonding to the backbone while a second ethereal oxygen atom may be included at any position excluding between the carbons at α and β-positions relative to the ethereal oxygen atom.

In formulae (1a) and (1b), $R^1$ is hydrogen, fluorine, methyl or trifluoromethyl. $R^2$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group.

Exemplary of the halogen are fluorine, chlorine, bromine and iodine. Suitable acyloxy groups include acetoxy, propionyloxy, butyryloxy, pivaloyloxy, and cyclohexylcarbonyloxy. Suitable alkyl groups include methyl, ethyl, n-propyl, isopropyl, n-butyl, s-butyl, t-butyl, pentyl, cyclopentyl, hexyl, cyclohexyl, heptyl, octyl, nonyl, decanyl, undecyl, dodecyl, norbornyl and adamantyl. Suitable alkoxy groups include methoxy, ethoxy, propoxy, isopropoxy, n-butoxy, s-butoxy, t-butoxy, pentyloxy, hexyloxy, cyclopentyloxy, cyclohexyloxy, 1-methyl-1-cyclopentyloxy, 1-ethyl-1-cyclopentyloxy, 1-methyl-1-cyclohexyloxy, and 1-ethyl-1-cyclohexyloxy.

In formulae (1a) and (1b), L is hydrogen, a straight, branched or cyclic, $C_1$-$C_{10}$ monovalent aliphatic hydrocarbon group which may contain an ethereal oxygen atom, carbonyl moiety or carbonyloxy moiety at an intermediate position of the chain, or an optionally substituted, monovalent aromatic ring-containing group. Suitable monovalent aliphatic hydrocarbon groups are straight, branched or cyclic alkyl, alkenyl and alkynyl groups. Suitable alkyl groups include the above-exemplified groups, but having 1 to 10 carbon atoms. Suitable alkenyl groups include vinyl, allyl, propenyl, cyclopropenyl, butenyl, cyclobutenyl, pentenyl, cyclopentenyl, hexenyl, cyclohexenyl, heptenyl, cycloheptenyl, methylcyclohexenyl, octenyl, dimethylcyclohexenyl, and cyclooctenyl. Suitable alkynyl groups include ethynyl, propynyl, butynyl, pentynyl, hexynyl, heptynyl, and octynyl. Suitable monovalent aromatic ring-containing groups include phenyl, naphthyl, phenanthryl, anthryl, pyrenyl, biphenylyl, acenaphthenyl, and fluorenyl. Preferably, L is hydrogen, methyl, ethyl, propyl, isopropyl, cyclopentyl, cyclohexyl, adamantyl, methylcarbonyl, or phenyl.

In formula (1a), Z bonds with the carbon atom to form a $C_5$-$C_{15}$ alicyclic group. Suitable alicyclic groups include the following, but are not limited thereto.

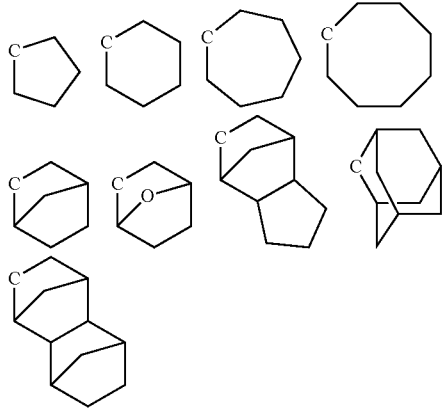

In formula (1b), $R^x$ and $R^y$ are each independently hydrogen or a straight, branched or cyclic, $C_1$-$C_{15}$ alkyl group which may be substituted with a hydroxyl or alkoxy moiety, at least one of $R^x$ and $R^y$ being a cyclic $C_5$-$C_{15}$ alkyl group. Preferably, $R^x$ and $R^y$ are selected from methyl, ethyl, propyl, butyl, cyclopentyl, cyclohexyl, cycloheptyl, cyclooctyl, adamantyl, norbornyl, and the foregoing groups which are substituted with a hydroxyl or alkoxy moiety.

In formulae (1a) and (1b), f is an integer of 1 to 3, s is an integer of 0 to 2, a is equal to (5+2s−f), and m is 0 or 1.

Among the recurring units of formulae (1a) and (1b), recurring units of the following formulae (1a') and (1b') are preferred.

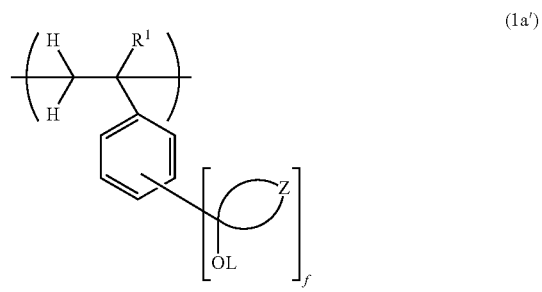

(1a')

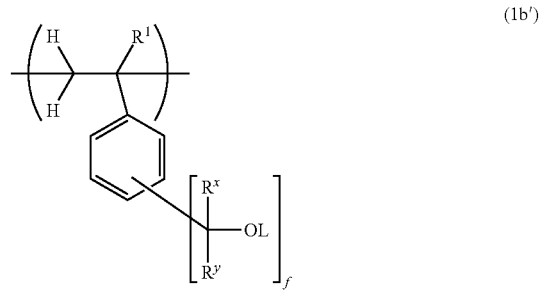

(1b')

Herein $R^1$, $R^x$, $R^y$, L and f are as defined above.

Preferred examples of the recurring units of formulae (1a) and (1b) are shown below, but not limited thereto.

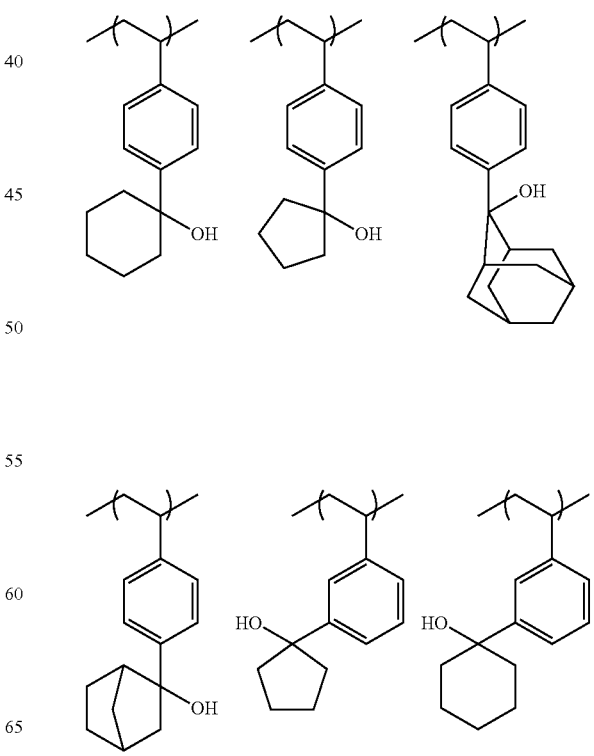

13
-continued
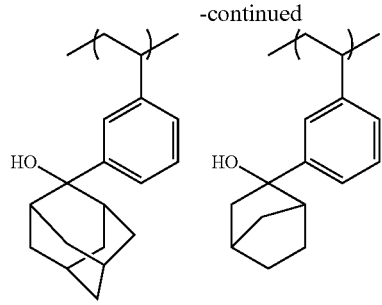
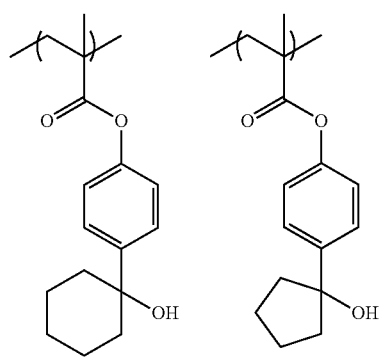
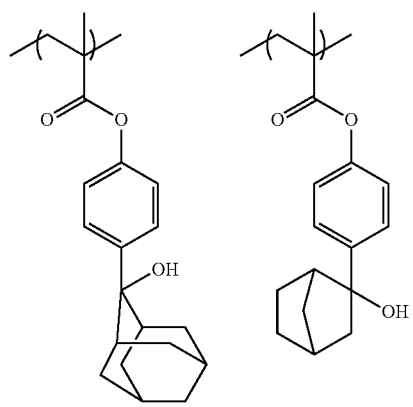
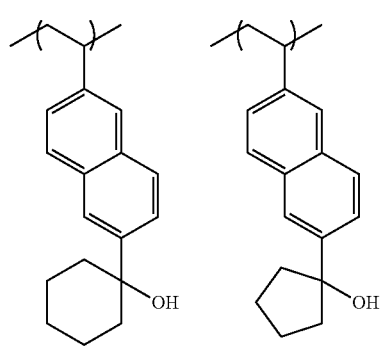
14
-continued
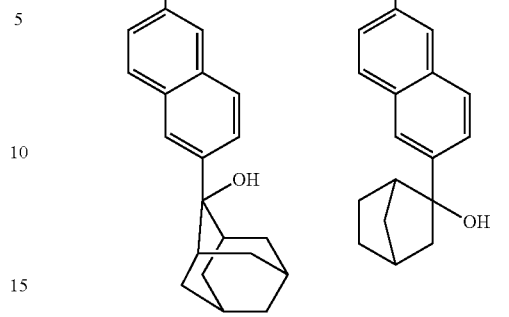
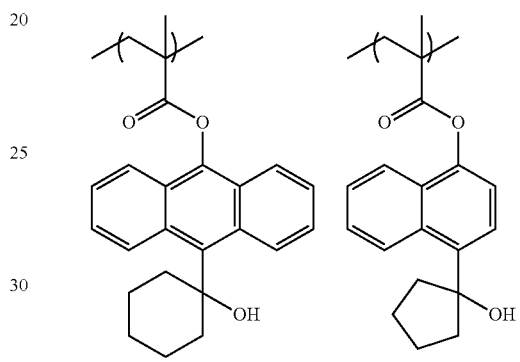
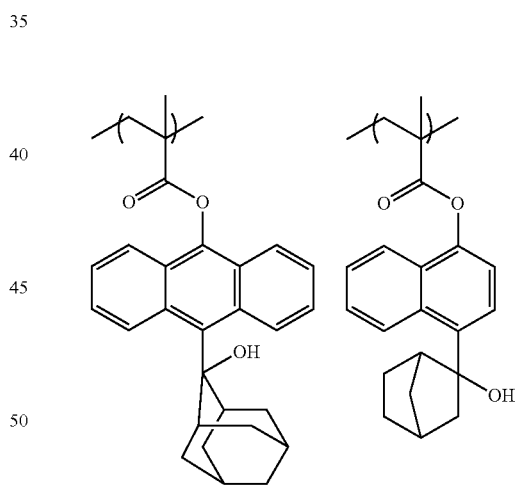
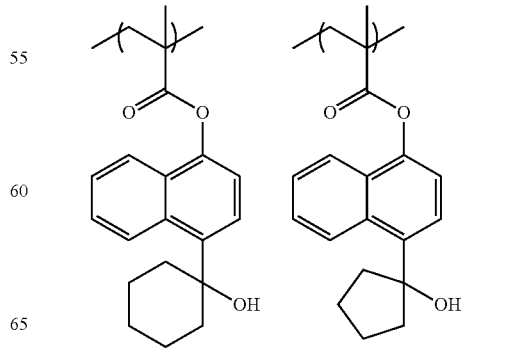

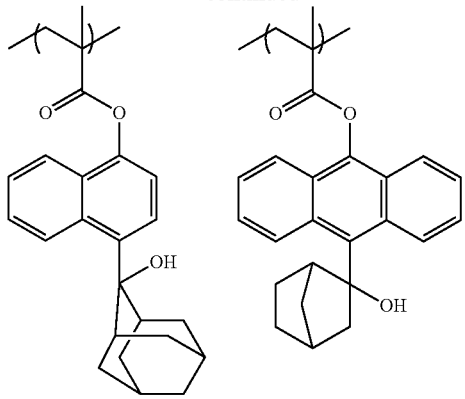
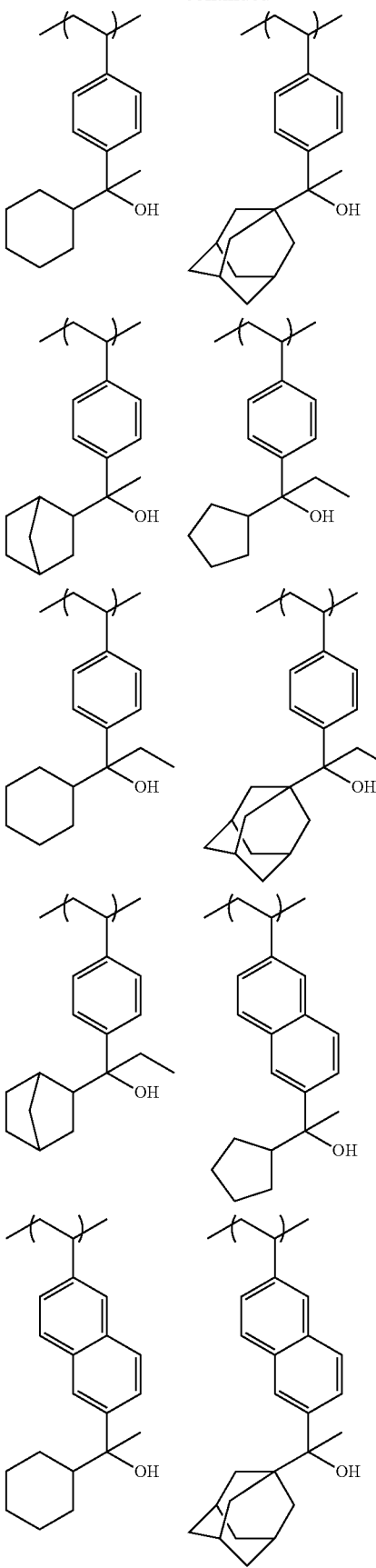

-continued

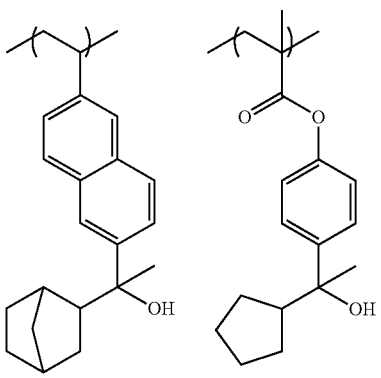

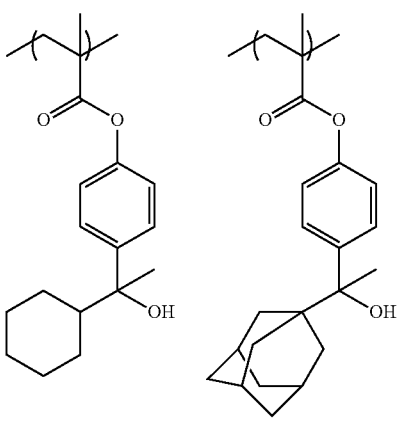

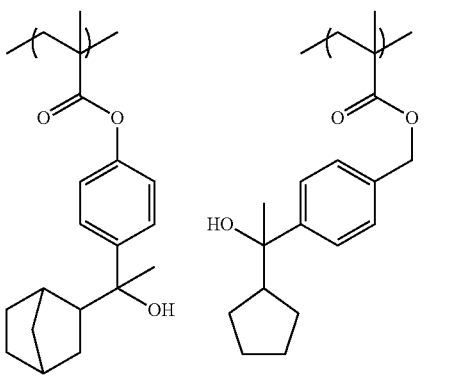

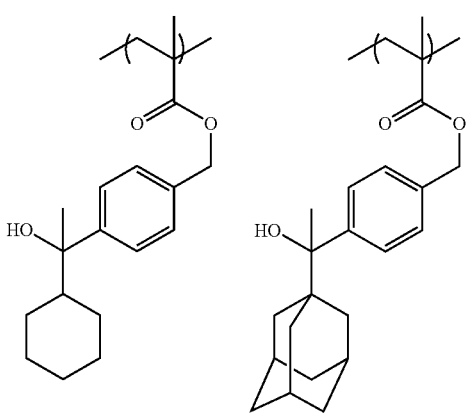

-continued

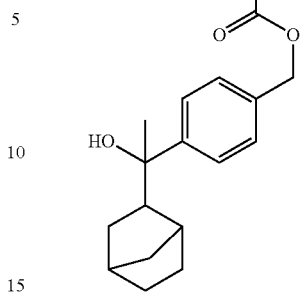

Preferably, the shrink material polymer further comprises recurring units of formula (2) and/or (3) in order to provide a sufficient attachment to the resist pattern and adhesion to the substrate. The recurring unit of formula (2) or (3) permits an appropriate thermal vibration of the polymer that advantageously promotes insolubilizing reaction for the polymer to become insolubilized in the shrink material stripper as a result of elimination of the acid labile group in the recurring unit of formula (1a) or (1b). In particular, recurring units of formula (2) are more preferred.

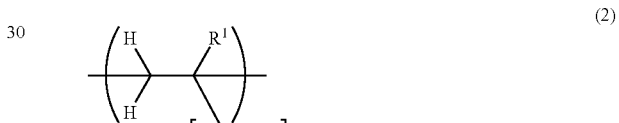

(2)

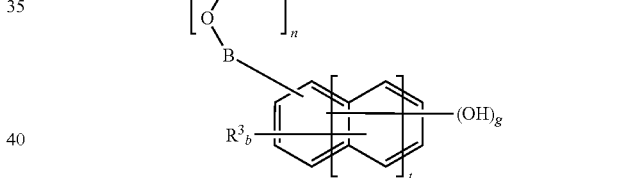

(3)

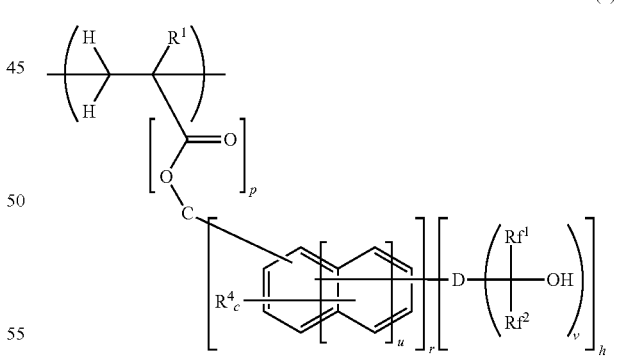

In formula (2), B is a single bond or a $C_1$-$C_{10}$ alkylene group which may contain an ethereal oxygen atom at an intermediate position of the chain. Suitable alkylene groups are as exemplified above for "A".

In formula (2), $R^1$ is as defined above. $R^3$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group. Examples of the acyloxy, alkyl and alkoxy groups are as exemplified above for R². In formula (2), g is an integer of 0 to 3, t is an integer of 0 to 2, b is equal to (5+2t−g), and n is 0 or 1. Herein, g is indicative of the number of hydroxyl groups bonded to aromatic ring. Preferably g is at least 1 for the purpose of acquiring a sufficient amount of shrinkage by providing a high activity to insolubilizing reaction for the polymer to become insolubilized in the stripper as a result of elimination of the acid labile group in the recurring unit of formula (1a) or (1b). More preferably, those units of formula (2) wherein g is at least 1 account for at least 50 mol % of the units of formula (2). The unit of formula (2) wherein g=0 may not be included depending on a particular design, although it is effective for adjustment of dissolution rate and adjustment of permission of thermal vibration of the polymer.

Of the recurring units of formula (2), linker-free recurring units, that is, those recurring units of formula (2) wherein g is at least 1, n=0, and B is a single bond, that is, the aromatic ring is directly bonded to the polymer backbone are units derived from monomers having a 1-substituted or unsubstituted vinyl group attached to a hydroxy-substituted aromatic ring, typically hydroxystyrene units. Suitable units include those derived from 3-hydroxystyrene, 4-hydroxystyrene, 5-hydroxy-2-vinyl-naphthalene, and 6-hydroxy-2-vinyl-naphthalene. Preferred are those units derived from 3-hydroxystyrene or 4-hydroxystyrene, as represented by the following formula (2').

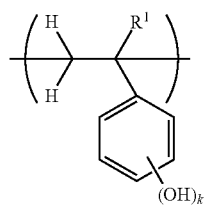

(2')

Herein R' is as defined above and k is an integer of 1 to 3.

Of the recurring units of formula (2), linker-bearing recurring units, that is, those recurring units of formula (2) wherein n=1, that is, having an ester structure linker are units derived from carbonyl-substituted vinyl monomers, typically (meth)acrylates.

Of the recurring units of formula (2) having a linker (—CO—O—B—) derived from (meth)acrylate, preferred examples of those units wherein g is at least 1 are shown below, but not limited thereto.

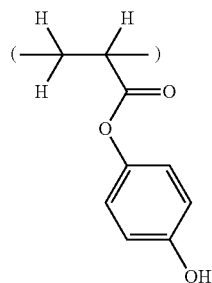

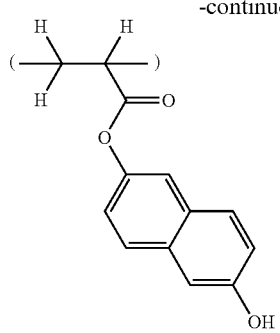

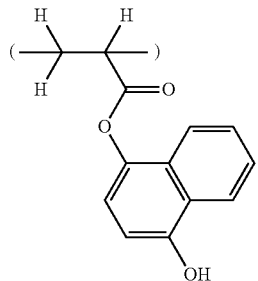

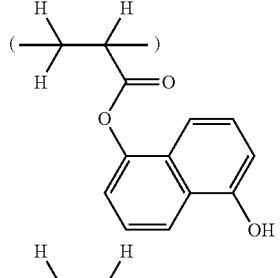

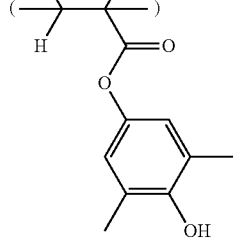

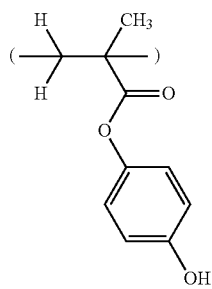

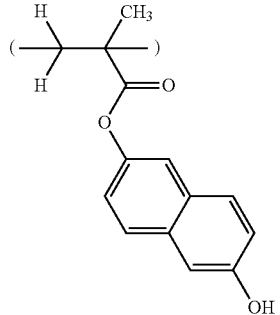

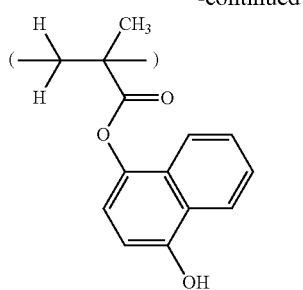
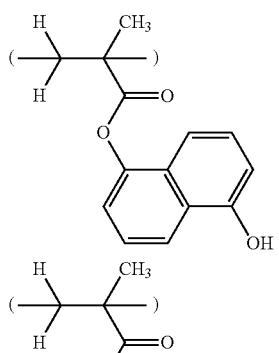
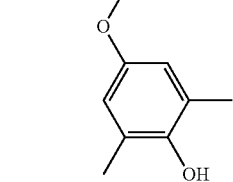
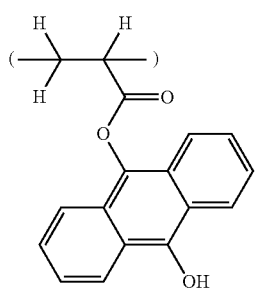
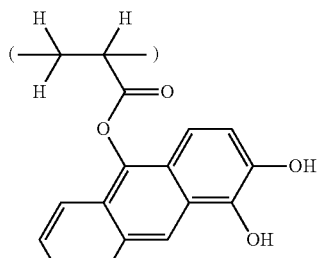
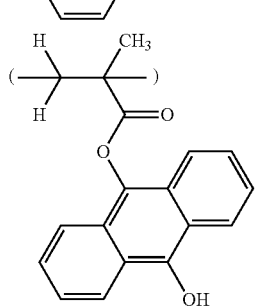
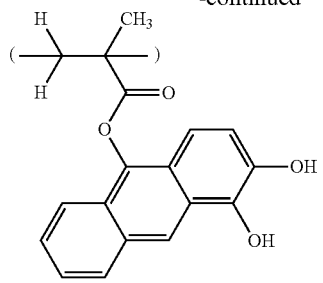
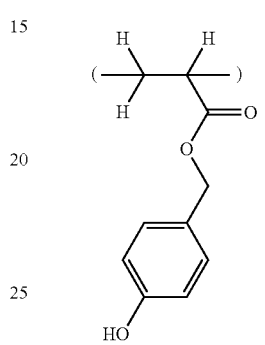
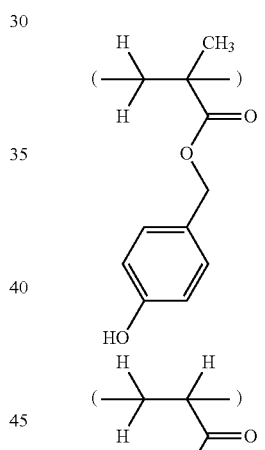
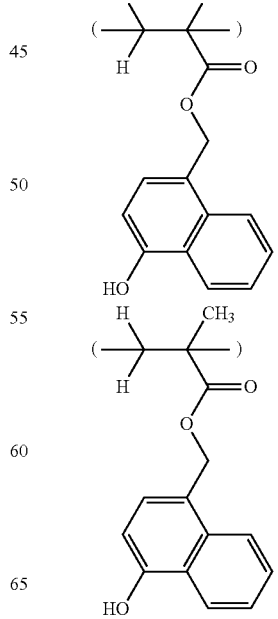

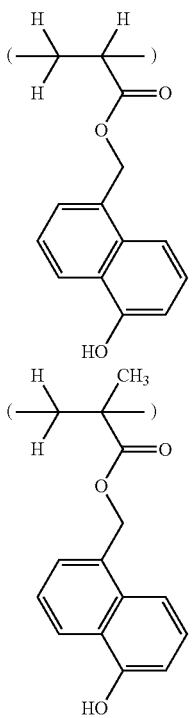

Of the recurring units of formula (2), those units wherein g=0 are units derived from styrene, vinylnaphthalene, vinylanthracene and the foregoing compounds whose aromatic ring is substituted with halogen, acyloxy, alkyl, alkoxy or similar moiety. Those units wherein g=0 and having a linker (—CO—O—B—) derived from (meth)acrylate include the preferred examples of the unit wherein g is at least 1, from which the hydroxyl group is eliminated, and in which the hydrogen of the hydroxyl group is substituted by an acyl or alkyl group.

In formula (3), C is a single bond or a $C_1$-$C_{10}$ alkylene group which may contain an ethereal oxygen atom at an intermediate position of the chain. Suitable alkylene groups are as exemplified above for "A".

In formula (3), $R^1$ is as defined above. $R^4$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group. Examples of the acyloxy, alkyl and alkoxy groups are as exemplified above for $R^2$.

In formula (3), D is a single bond or a straight, branched or cyclic, $C_1$-$C_{10}$ (v+1)-valent hydrocarbon group which may contain an ethereal oxygen atom, carbonyl moiety or carbonyloxy moiety at an intermediate position of the chain, in which some or all carbon-bonded hydrogen atoms may be substituted by fluorine. The preferred hydrocarbon groups are aliphatic hydrocarbon groups, examples of which are the same groups as exemplified above for the monovalent aliphatic hydrocarbon group of L, with a number "v" of hydrogen atoms being eliminated.

In formula (3), $Rf^1$ and $Rf^2$ are each independently a $C_1$-$C_6$ alkyl group containing at least one fluorine atom. $Rf^1$ may bond with D to form a ring with the carbon atoms to which they are attached. Suitable alkyl groups containing at least one fluorine atom include monofluoromethyl, difluoromethyl, trifluoromethyl, 2,2,2-trifluoroethyl, 1,1,2,2,2-pentafluoroethyl, 2,2,2-trifluoro-1-(trifluoromethyl)ethyl, perfluoroisopropyl, heptafluoropropyl, 2,2,3,3-tetrafluoropropyl, 2,2,3,3,3-pentafluoropropyl, 3,3,3-trifluoro-2-(trifluoromethyl)propyl, nonafluorobutyl, 1H,1H,5H-octafluoropentyl, 1H,1H-nonafluoropentyl, perfluoropentyl, 1H,1H-4-trifluoromethylperfluoropentyl, perfluorohexyl, 4-pentafluoroethylperfluorocyclohexyl, 1H,1H,2H,2H-perfluorohexyl, and perfluorocyclohexyl.

In formula (3), h is an integer of 1 to 3, u is an integer of 0 to 2, and c is equal to (5+2u−h).

In formula (3), r is 0 or 1. In the case of r=1, an aromatic ring intervenes between the polymer backbone and the hydroxyl group bonded to the carbon vicinal to the carbon substituted with a fluorine-containing group. In this case, v indicative of the number of substituents on D is 1 or 2. If D is not a single bond, D has one or two hydroxyl groups each bonded to the carbon vicinal to the carbon substituted with a fluorine-containing group, that is, v is 1 or 2.

In the case of r=0, h is 1, and C is a single bond, but D is not a single bond. In this case, D bonds with the polymer backbone via the carbonyloxy group. In this case too, D has one or two hydroxyl groups each bonded to the carbon vicinal to the carbon substituted with a fluorine-containing group.

Preferred examples of the recurring unit having formula (3) are shown below, but not limited thereto.

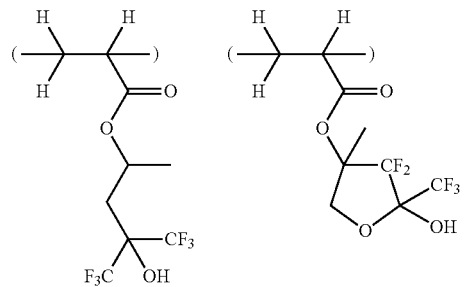

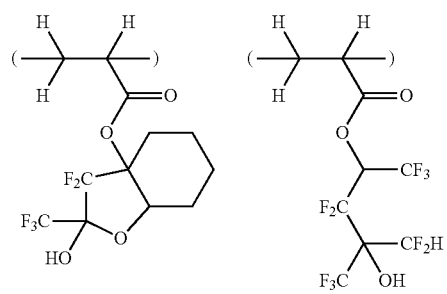

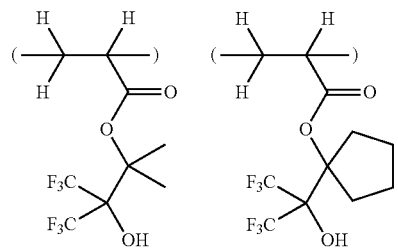

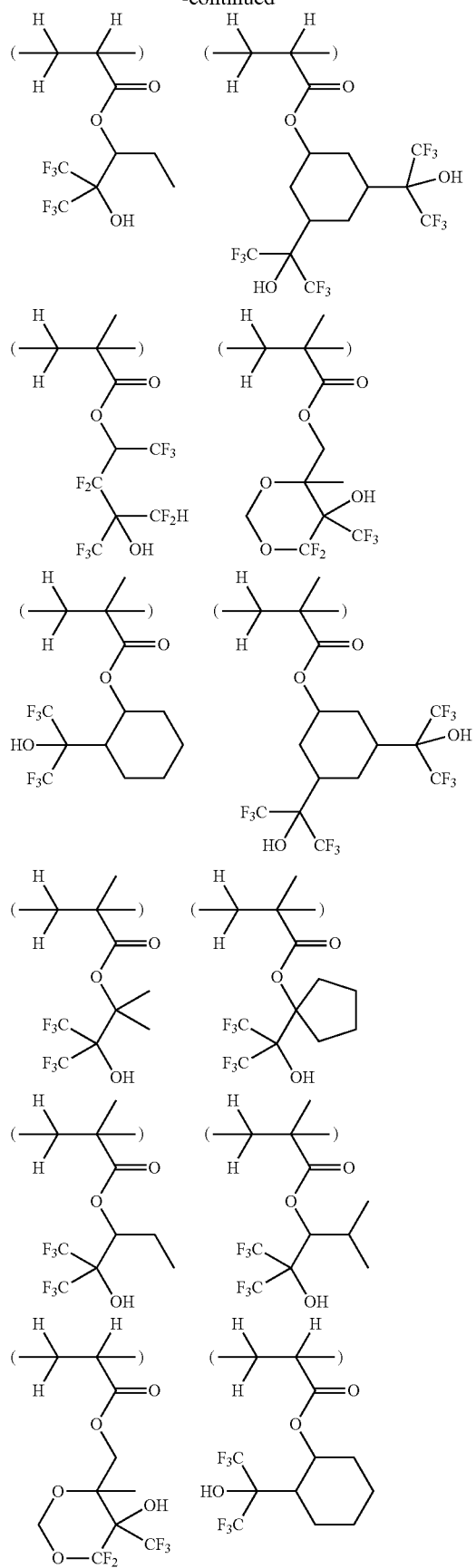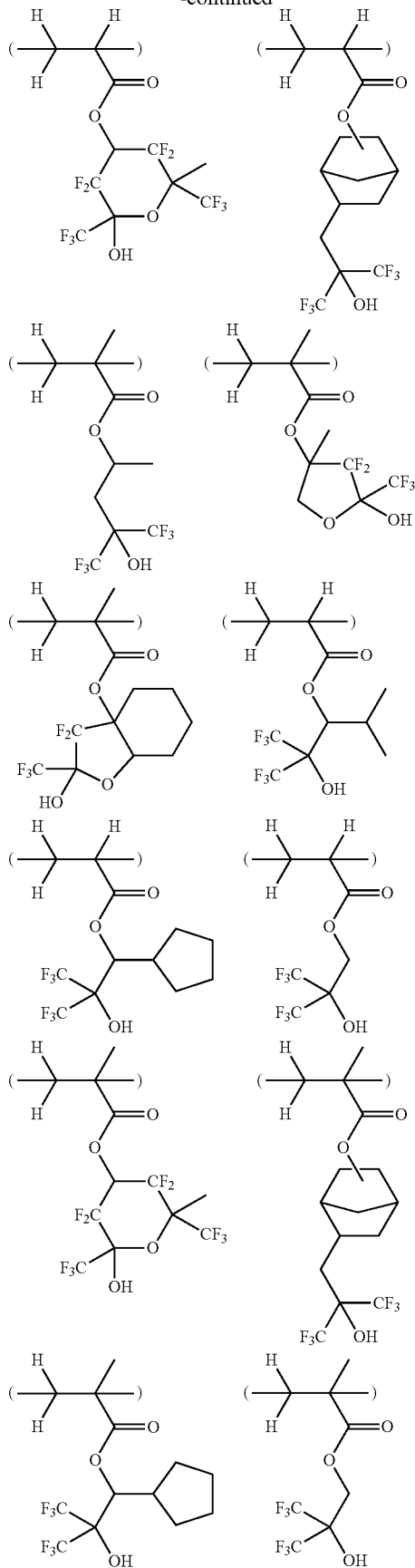

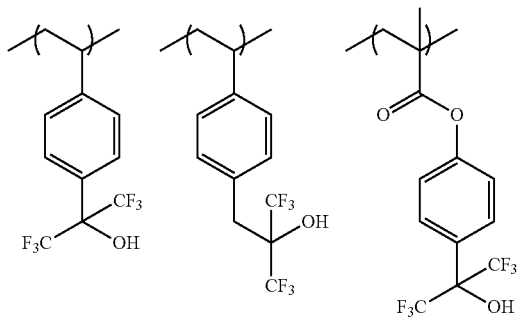
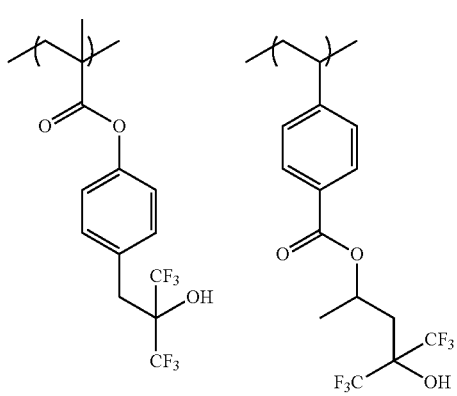
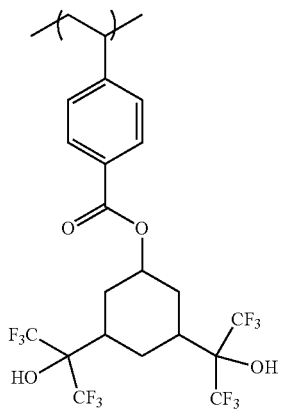

The units of formula (2) or (3) may be used alone or in admixture (i.e., of one type or two or more types).

The shrink material polymer may further comprise recurring units of at least one type selected from units having the following formulae (4) and (5) as main constituent units. In this embodiment, the polymer may have another advantage that the binding of cyclic structure to the backbone imparts dry etching resistance to the shrunk resist pattern, in addition to the advantage of etch resistance inherent to aromatic ring.

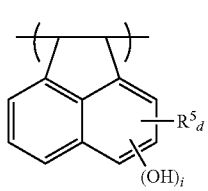

(4)

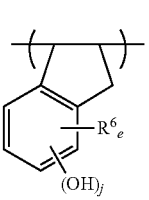

(5)

Herein $R^5$ and $R^6$ are each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group. Examples of the acyloxy, alkyl and alkoxy groups are as exemplified above for $R^2$.

In formulae (4) and (5), i and j are each independently an integer of 0 to 2, d is equal to (6−i), and e is equal to (4−j).

The units of formula (4) or (5) may be used alone or in admixture (i.e., of one type or two or more types).

Where the unit of formula (4) or (5) wherein i or j is at least 1 is selected, in relation to other recurring units of the polymer, for the purpose of enhancing the etch resistance of the polymer, the compounds from which the following units (4') or (5') are derived are readily available and effective for achieving the desired effects.

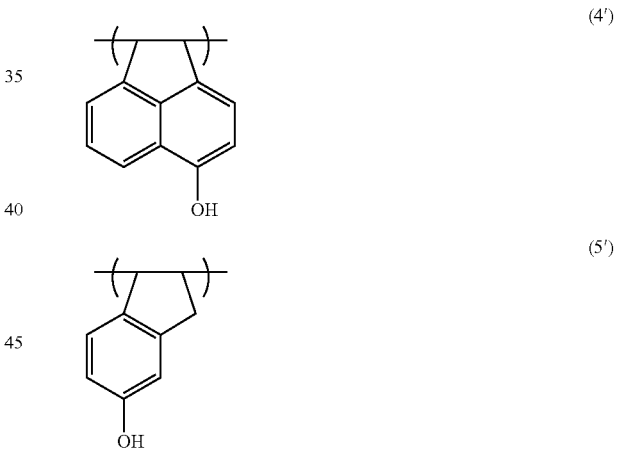

The shrink material polymer may further comprise recurring units of at least one type selected from units having the following formulae (A) to (E). These units may be used as auxiliary units capable of making the polymer more adhesive to the resist pattern or for adjusting the solubility of the polymer in solvents.

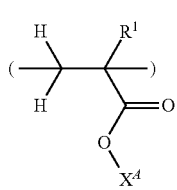

(A)

-continued (B)
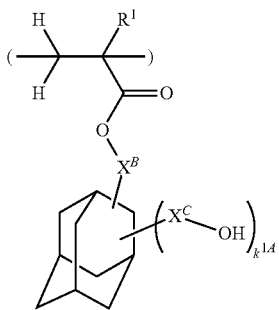

(C)
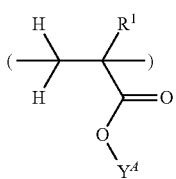

(D)
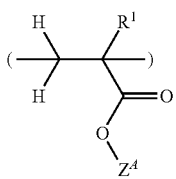

(E)
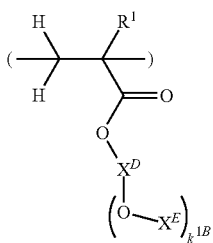

Herein $R^1$ is as defined above. $X^A$ is an acid labile group. $X^B$ and $X^C$ are each independently a single bond or a straight or branched $C_1$-$C_4$ divalent hydrocarbon group. $X^D$ is a straight, branched or cyclic, $C_1$-$C_{16}$ di- to pentavalent aliphatic hydrocarbon group in which any constituent —CH$_2$— may be substituted by —O— or —C(=O)—. $X^E$ is an acid labile group. $Y^A$ is a substituent group having a lactone, sultone or carbonate structure. $Z^A$ is hydrogen, a $C_1$-$C_{30}$ fluoroalkyl group or a $C_1$-$C_{15}$ fluoroalcohol-containing substituent group, $k^{1A}$ is an integer of 1 to 3, and $k^{1B}$ is an integer of 1 to 4.

The recurring unit of formula (A) is decomposed under the action of acid to generate carboxylic acid. By incorporating this unit, the solubility of the shrink material polymer in organic solvent may be adjusted. The acid labile group represented by $X^A$ may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

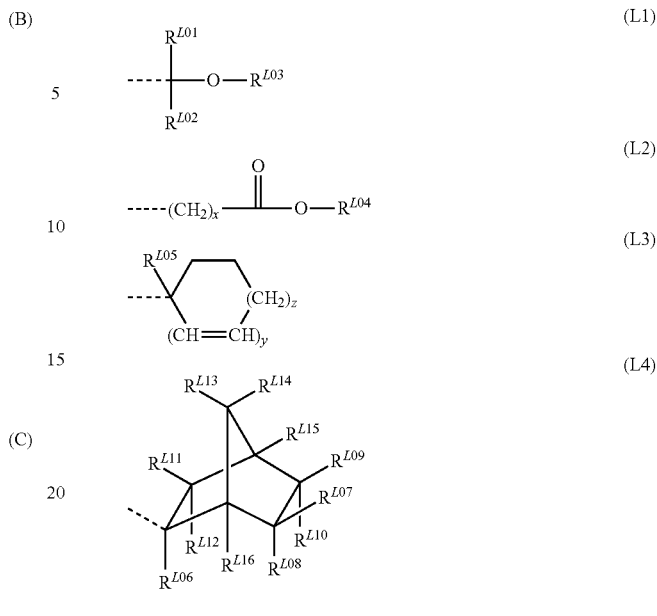

Herein $R^{L01}$ and $R^{L02}$ are each independently hydrogen or a straight, branched or cyclic alkyl group of 1 to 18 carbon atoms, preferably 1 to 10 carbon atoms. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups, substituted forms of such alkyl groups in which some hydrogen atoms are replaced by hydroxyl, alkoxy, oxo, amino, alkylamino or the like, and similar groups which are separated by an ethereal oxygen atom. $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). $R^{L05}$ is an optionally substituted, straight, branched or cyclic $C_1$-$C_{10}$ alkyl group or an optionally substituted $C_6$-$C_{20}$ aryl group. $R^{L06}$ is an optionally substituted, straight, branched or cyclic $C_1$-$C_{10}$ alkyl group or an optionally substituted $C_6$-$C_{20}$ aryl group. $R^{L07}$ to $R^{L16}$ independently represent hydrogen or optionally substituted monovalent hydrocarbon groups of 1 to 15 carbon atoms. Letter x is an integer of 0 to 6, y is equal to 0 or 1, z is equal to 0, 1, 2 or 3, and 2y+z is equal to 2 or 3.

In formula (L1), exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, and adamantyl.

Examples of the monovalent hydrocarbon group represented by $R^{L03}$ are as exemplified above for the alkyl group represented by $R^{L01}$ and $R^{L02}$, but not limited thereto. Examples of the substituted alkyl group represented by $R^{L03}$ are as shown below.

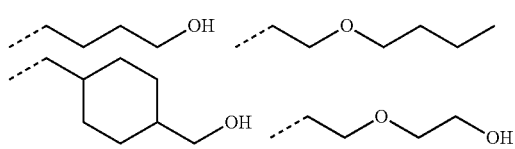

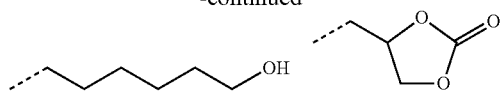

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), exemplary tertiary alkyl groups of $R^{L04}$ are tert-butyl, tert-pentyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

In formula (L3), examples of the alkyl groups of $R^{L05}$ include straight, branched or cyclic alkyl groups such as methyl, ethyl, propyl, isopropyl, n-butyl, sec-butyl, tert-butyl, n-pentyl, tert-pentyl, n-hexyl, cyclopentyl, cyclohexyl, and bicyclo[2.2.1]heptyl, and substituted forms of such groups in which some hydrogen atoms are replaced by hydroxyl, alkoxy, carboxyl, alkoxycarbonyl, oxo, amino, alkylamino, cyano, mercapto, alkylthio, sulfo or the like or in which a methylene moiety is replaced by an oxygen or sulfur atom. Examples of the aryl groups of $R^{L05}$ include phenyl, methylphenyl, naphthyl, anthryl, phenanthryl, and pyrenyl.

In formula (L4), examples of the alkyl and aryl groups of $R^{L06}$ are the same as exemplified for $R^{L05}$. Exemplary $C_1$-$C_{15}$ monovalent hydrocarbon groups of $R^{L07}$ to $R^{L16}$ include straight, branched or cyclic alkyl groups such as methyl, ethyl, propyl, isopropyl, n-butyl, sec-butyl, tert-butyl, n-pentyl, tert-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or the like. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a $C_1$-$C_{15}$ divalent hydrocarbon group, typically alkylene, when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, or $R^{L13}$ and $R^{L15}$).

Of the acid labile groups of formula (L1), the straight and branched ones are exemplified by the following groups, but not limited thereto.

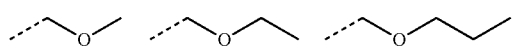

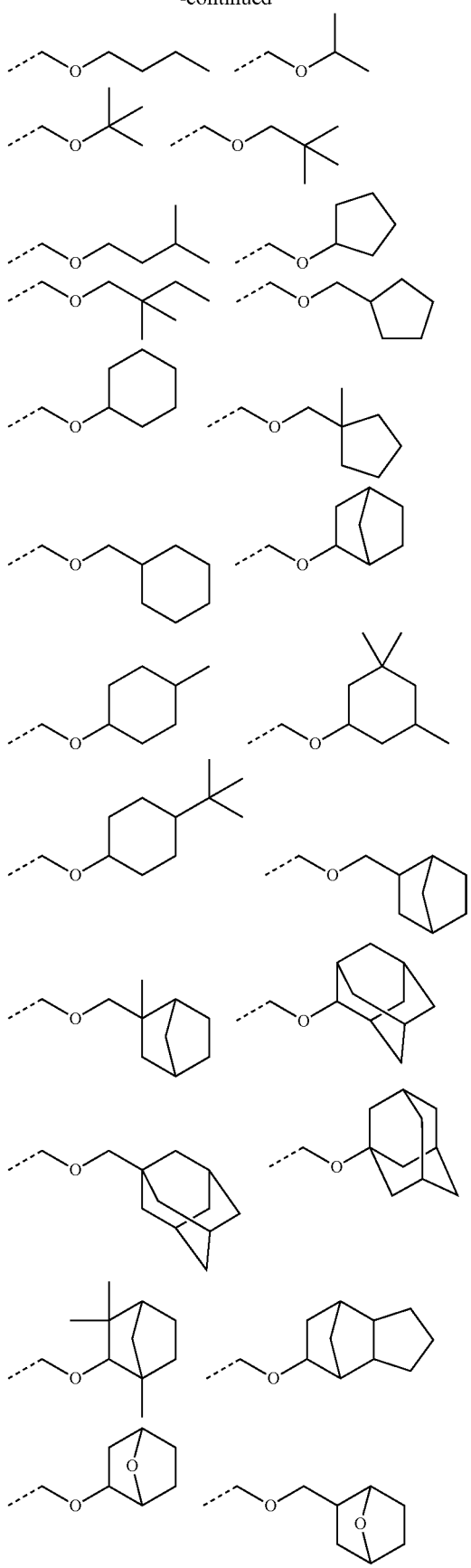

-continued
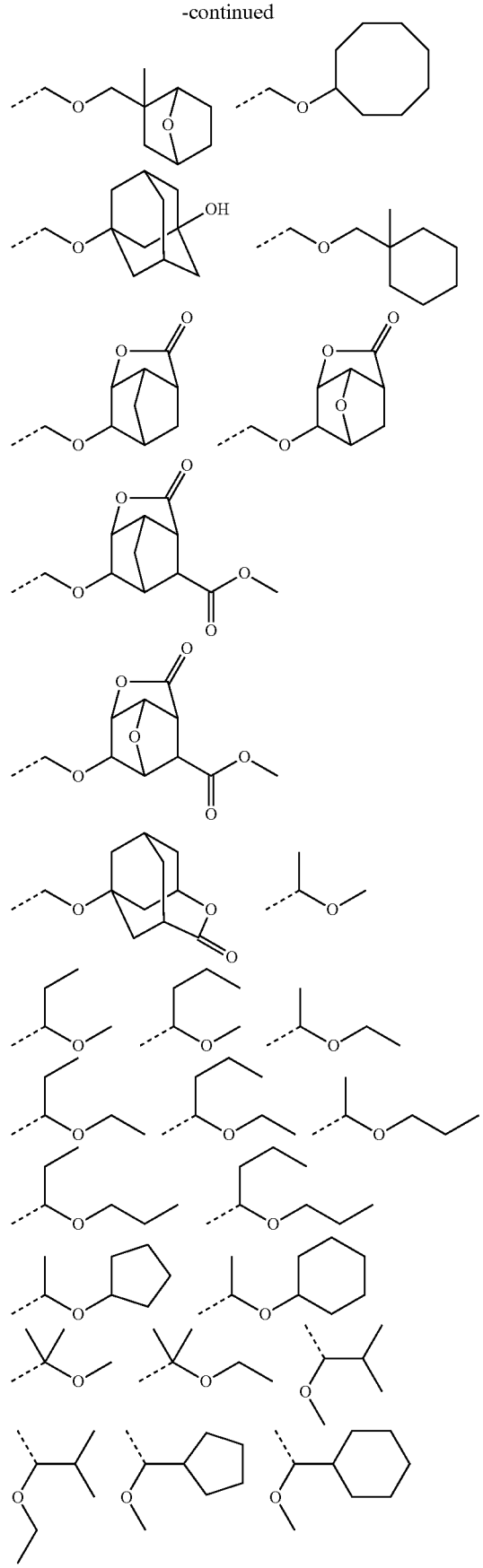
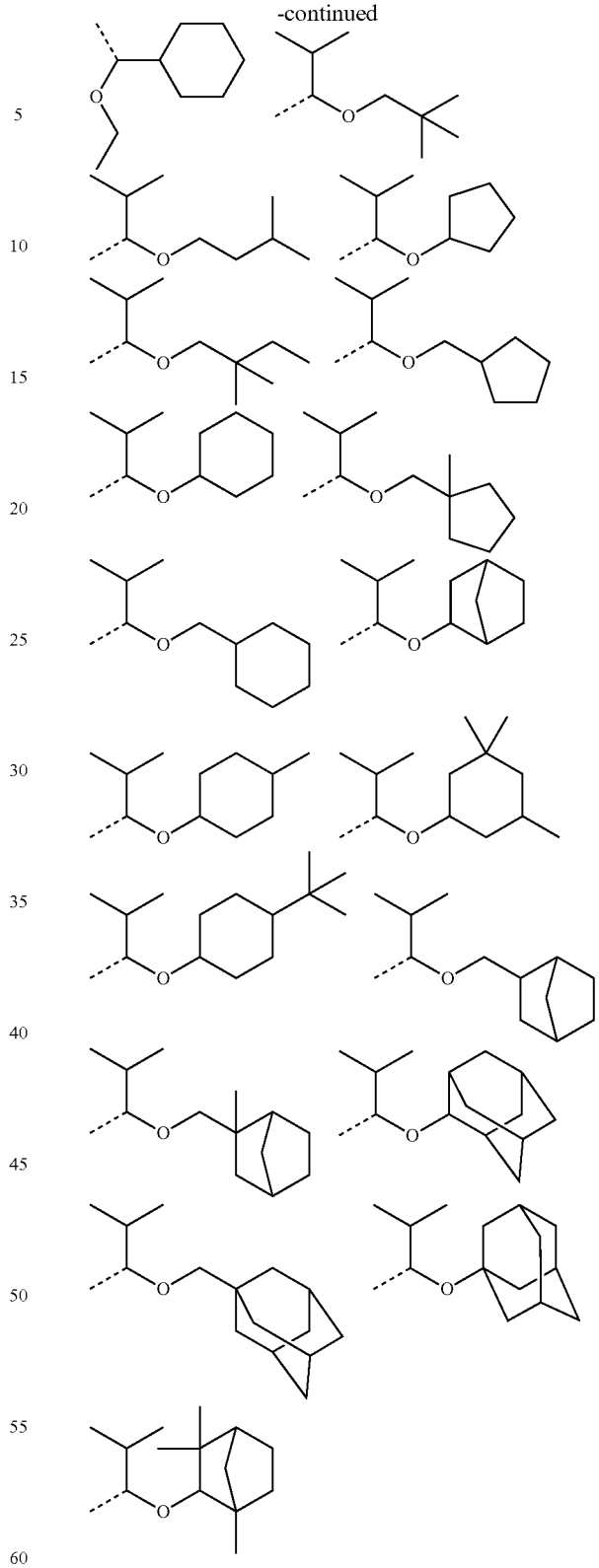
Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.
Examples of the acid labile groups of formula (L2) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethyl cyclopentyloxycarbonyl, 1-ethyl cyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

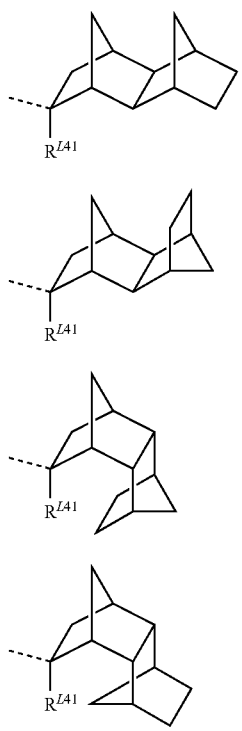

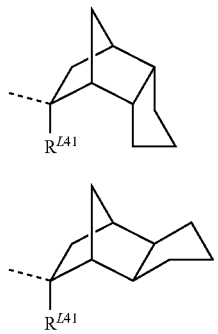

Note that $R^{L41}$ is as defined above.

Similarly, the formula (L4-4) represents one or a mixture of two or more selected from groups having the following formulae (L4-4-1) to (L4-4-4).

Note that $R^{L41}$ is as defined above.

Each of formulae (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, n-pentyl, tert-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Where $X^A$ is an acid labile group of formula (L4), a plurality of stereoisomers may be included.

For example, the formula (L4-3) represents one or a mixture of two selected from groups having the following formulae (L4-3-1) and (L4-3-2).

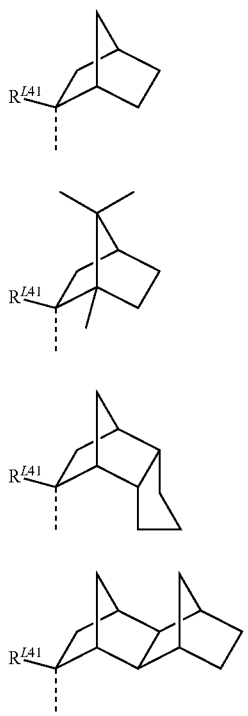

(L4-1-endo)
(L4-2-endo)
(L4-3-endo)
(L4-4-endo)

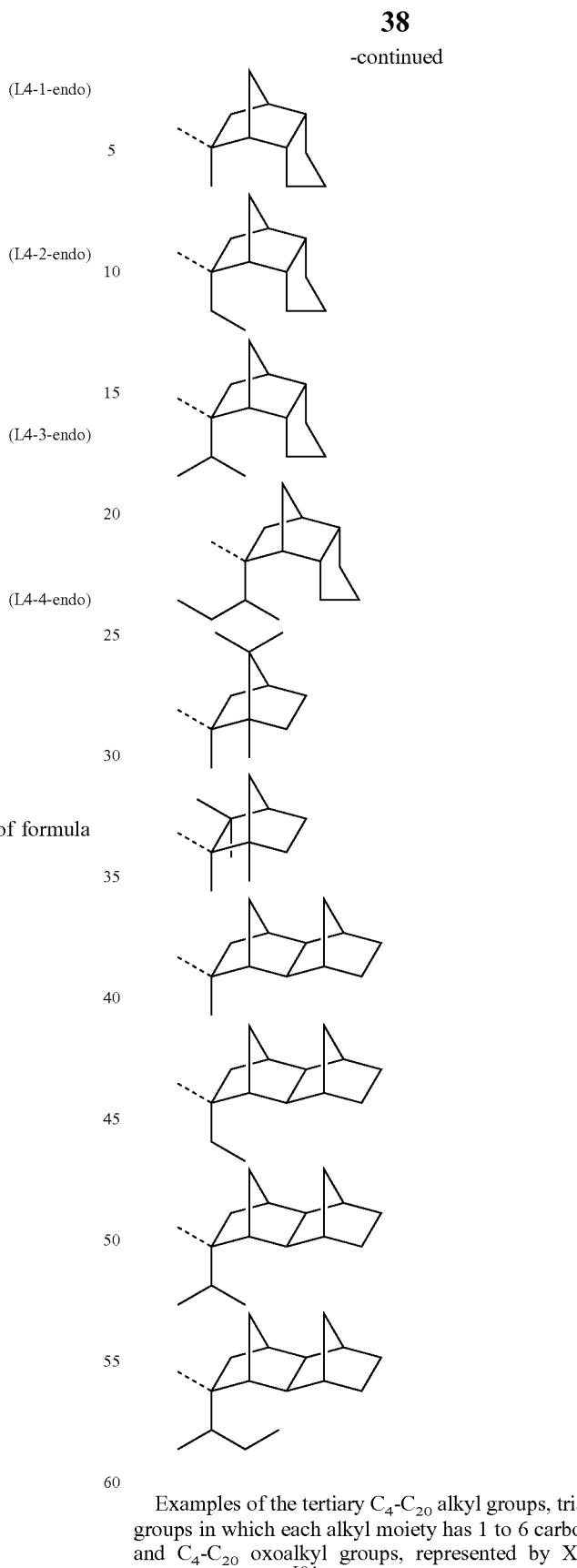

Note that $R^{L41}$ is as defined above.

Illustrative examples of the acid labile group of formula (L4) are given below.

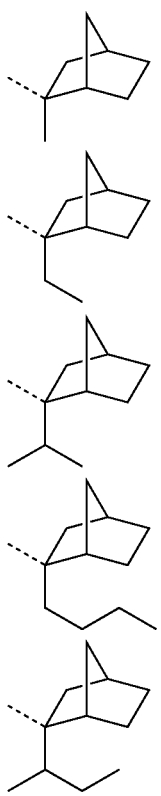

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $X^A$ are as exemplified for $R^{L04}$.

Illustrative examples of the recurring units having formula (A) are given below, but not limited thereto. Herein $R^1$ is as defined above.

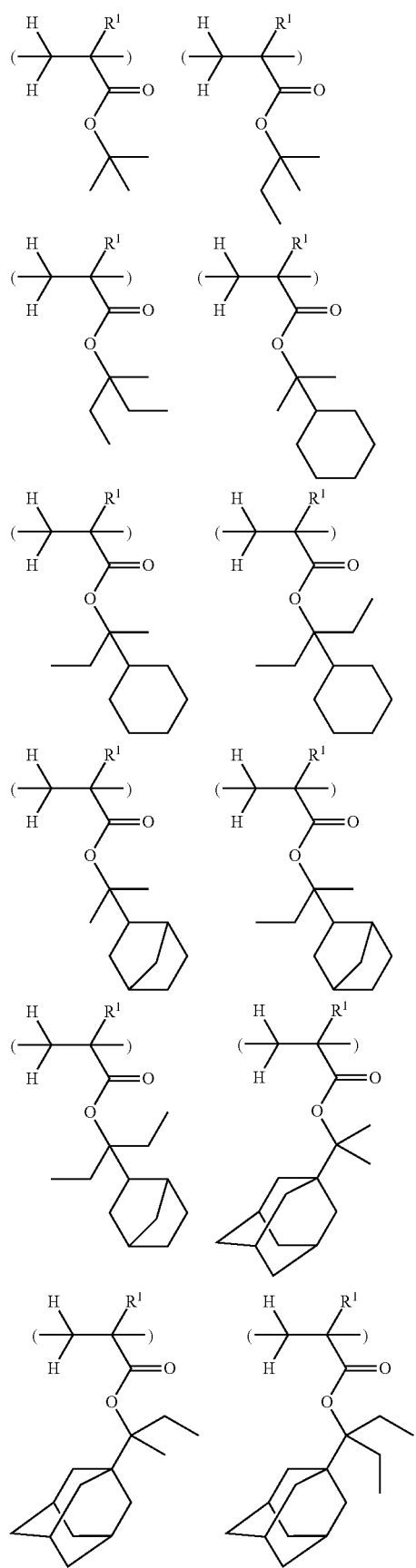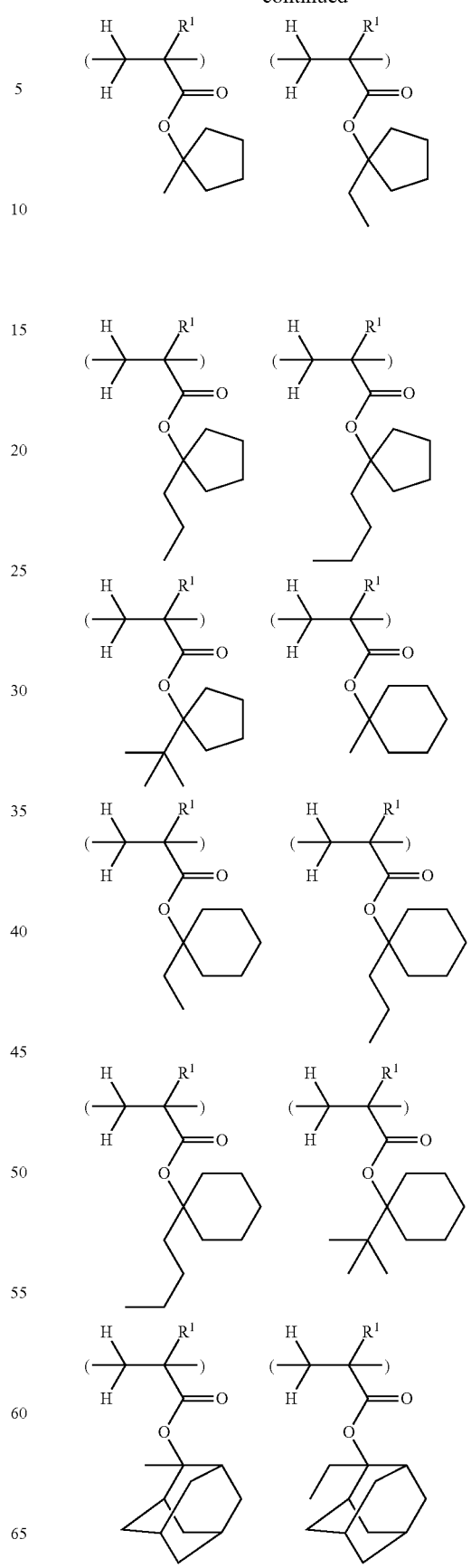

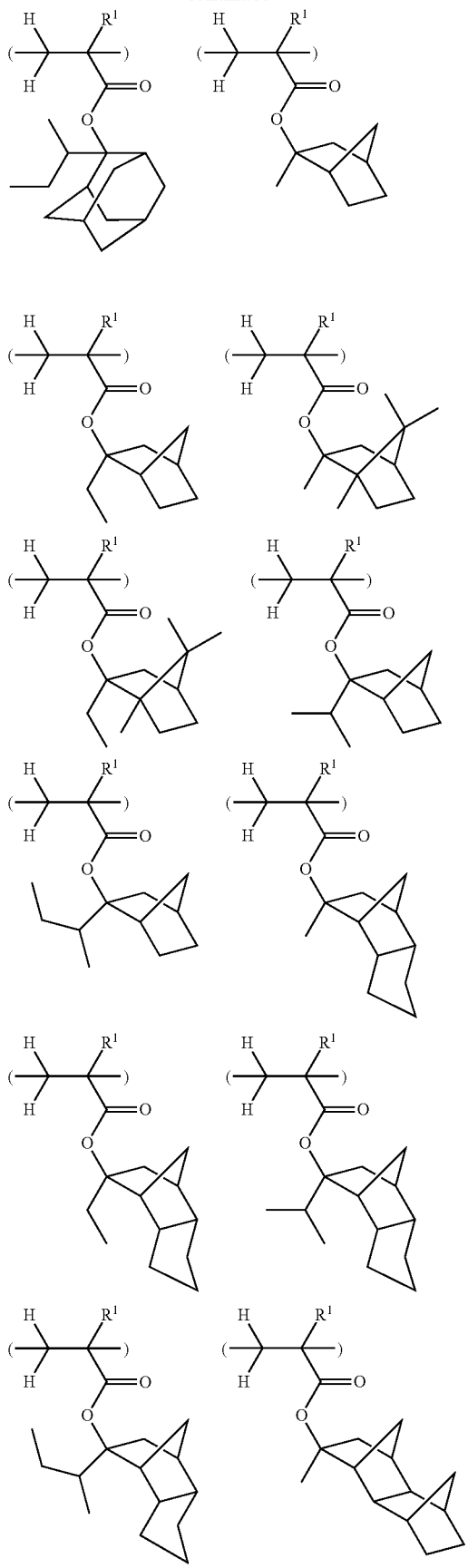
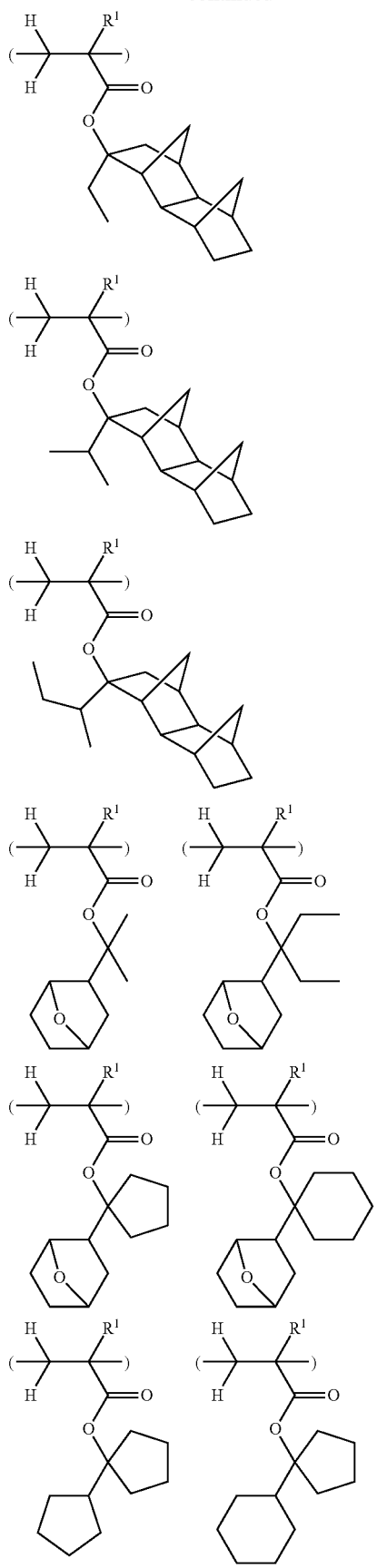

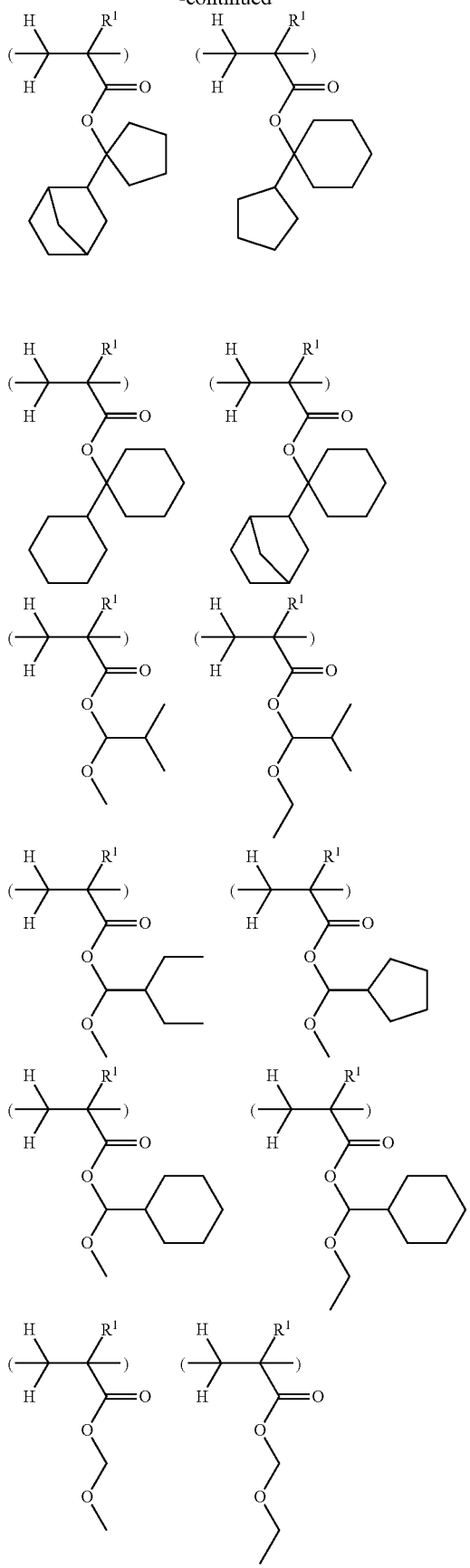
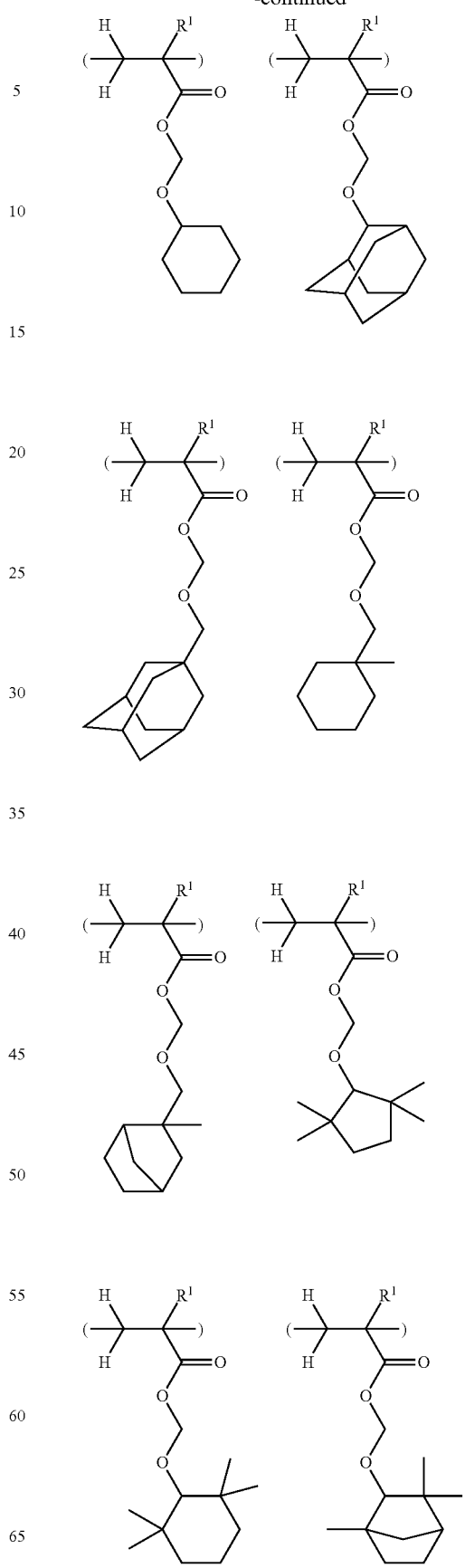

-continued
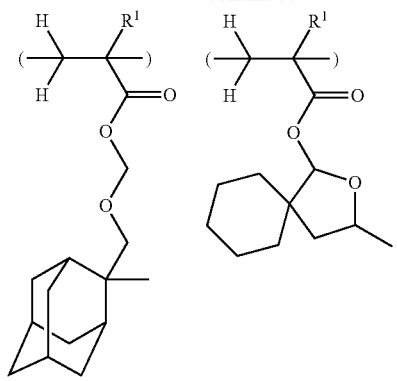
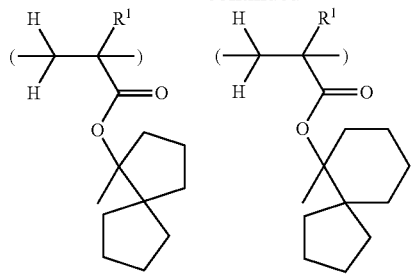
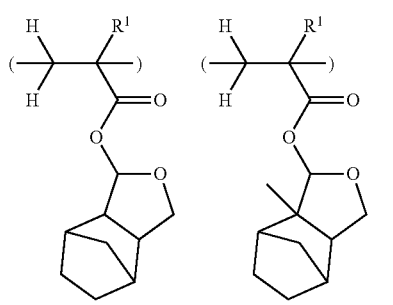
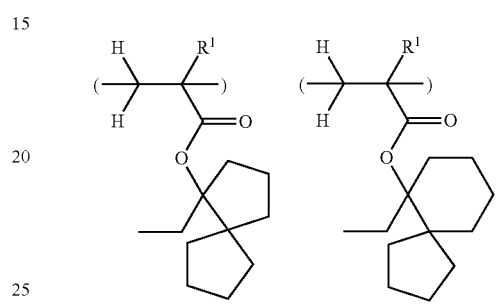
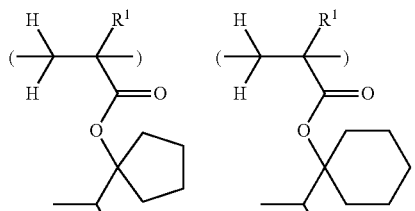
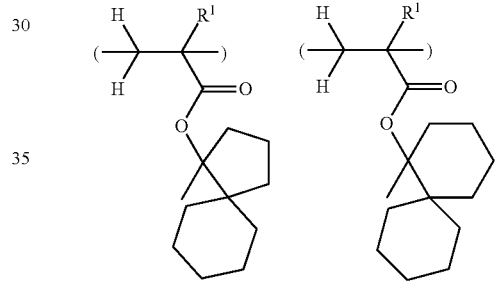
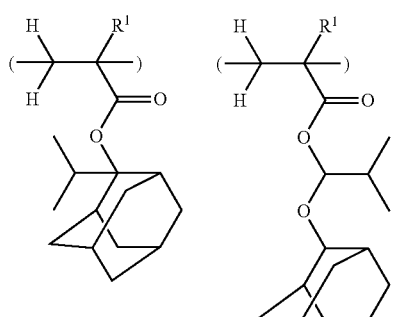
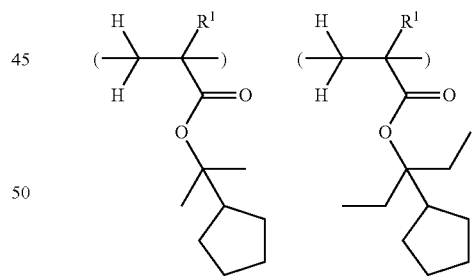
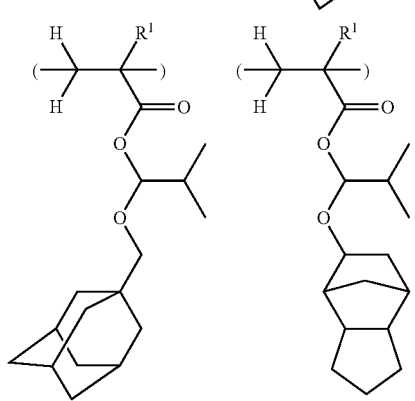
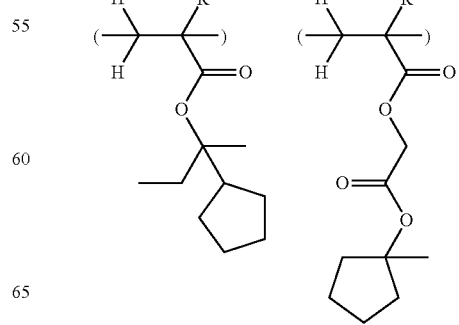

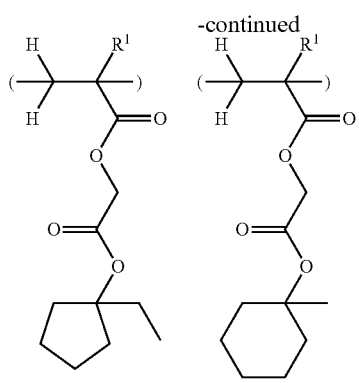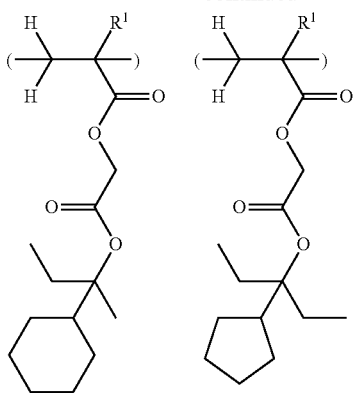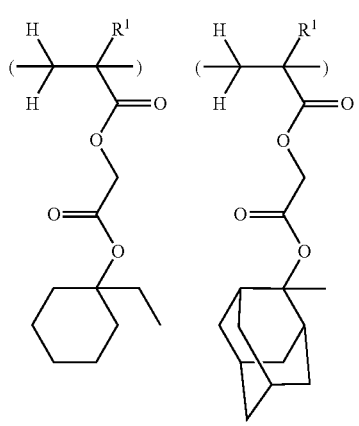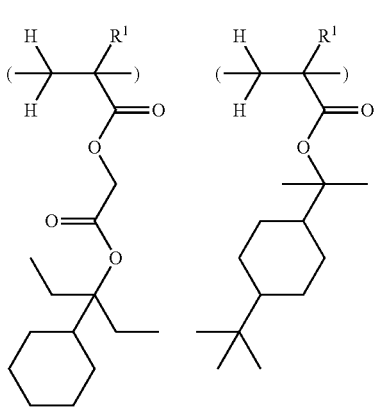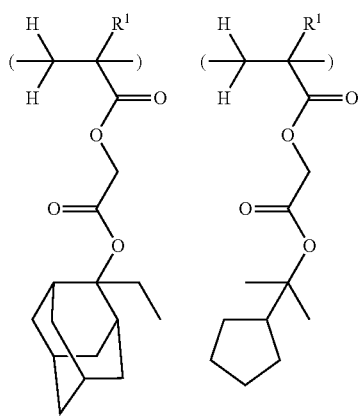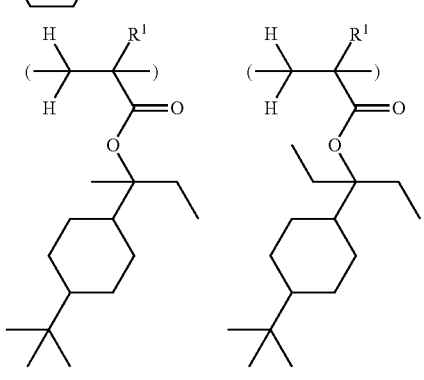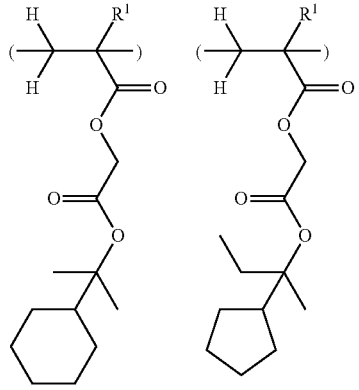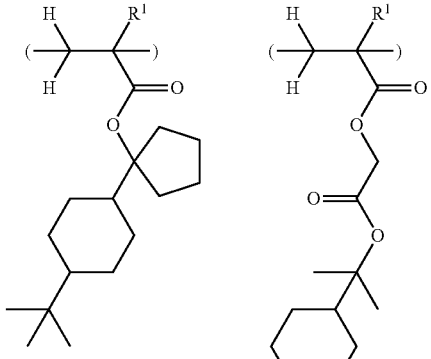

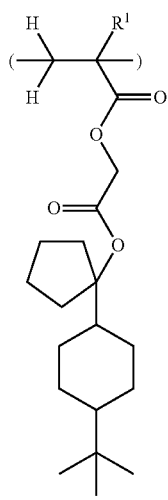
Illustrative examples of the recurring units having formula (B) are given below, but not limited thereto. Herein $R^1$ is as defined above.
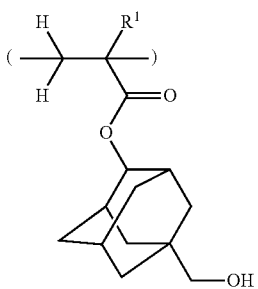
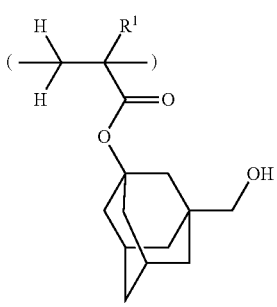
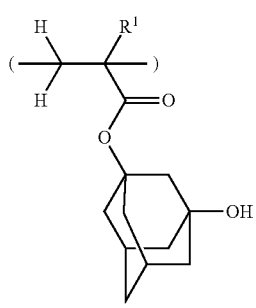
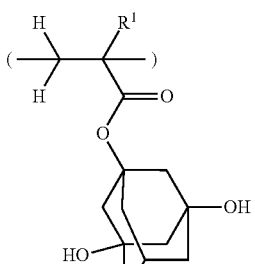
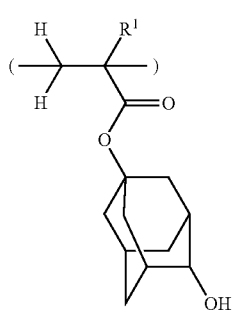
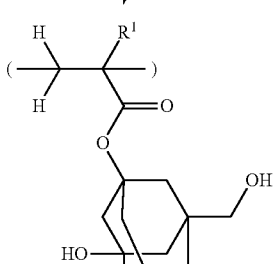
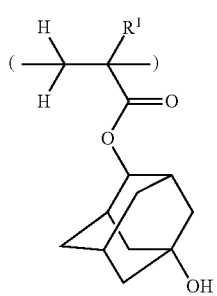
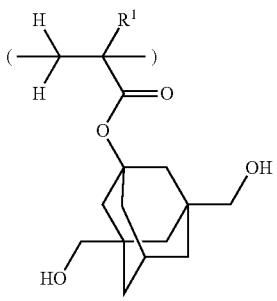

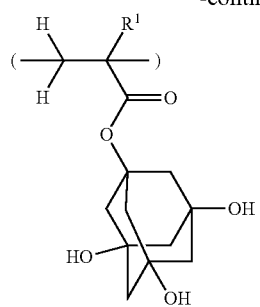
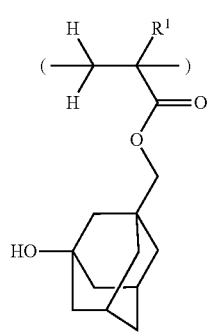
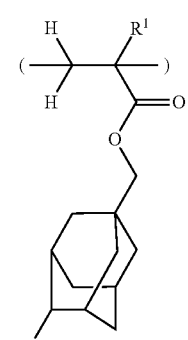
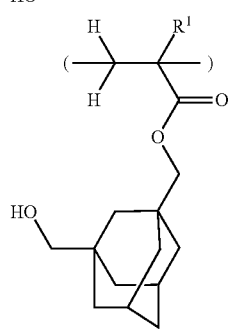
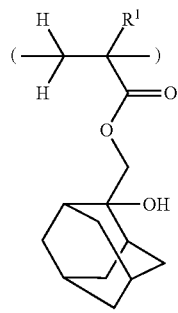
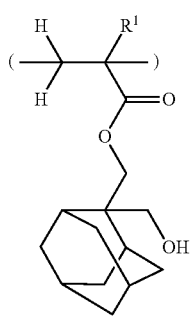
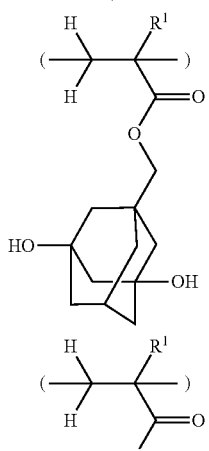
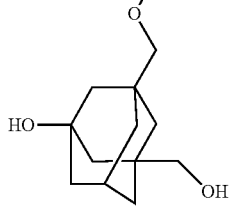
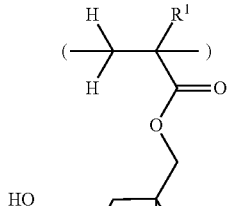
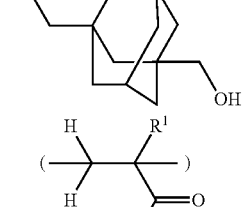
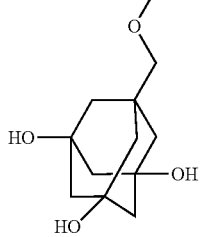
Illustrative examples of the recurring units having formula (C) are given below, but not limited thereto. Herein $R^1$ is as defined above.

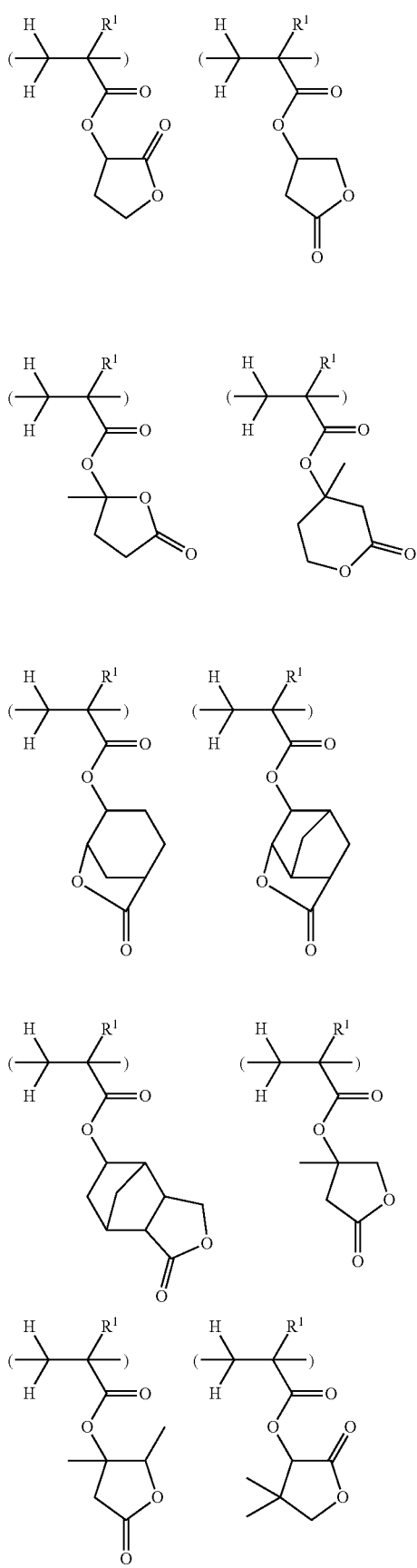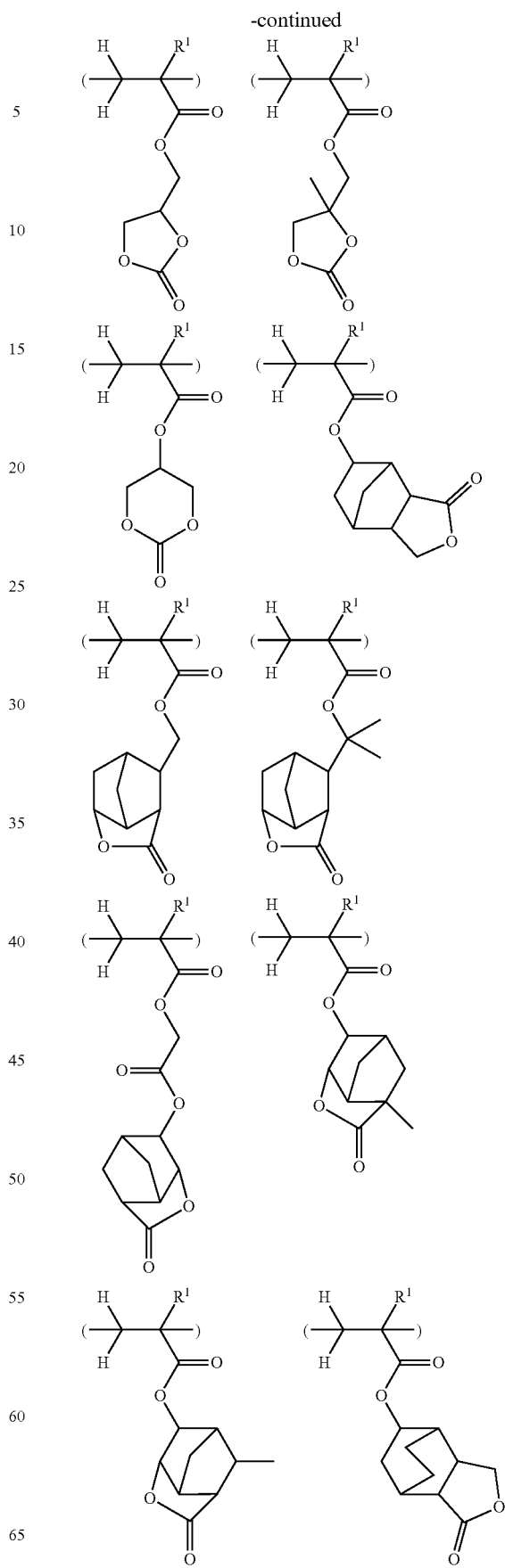

-continued
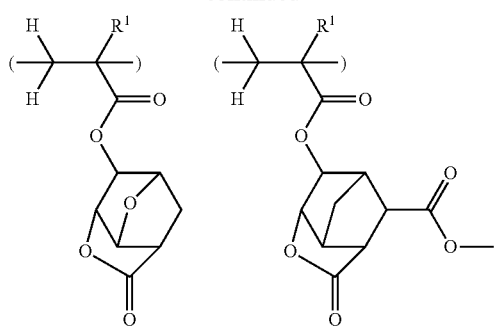
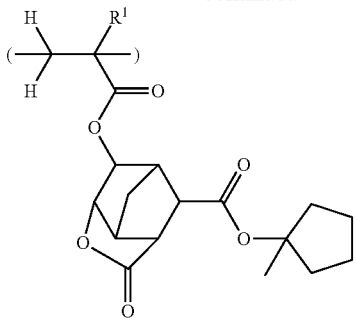
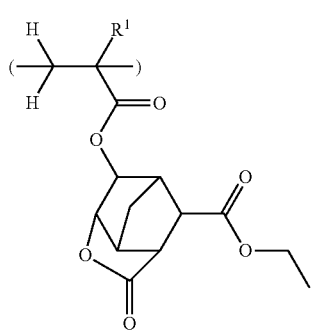
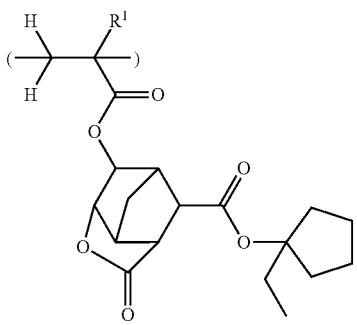
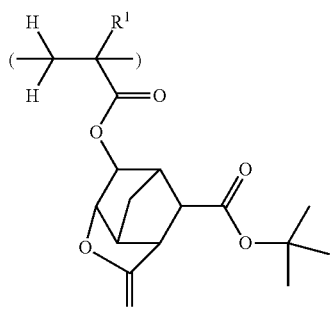
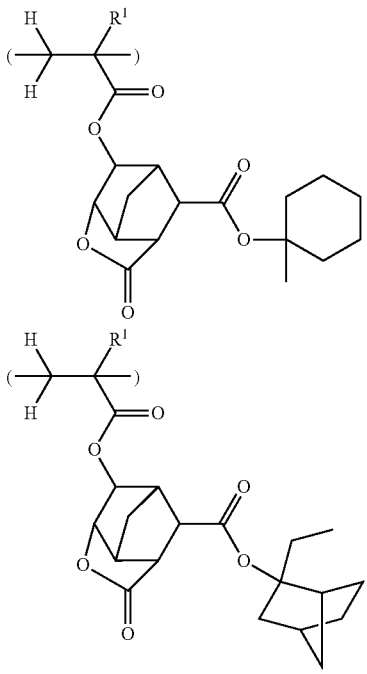
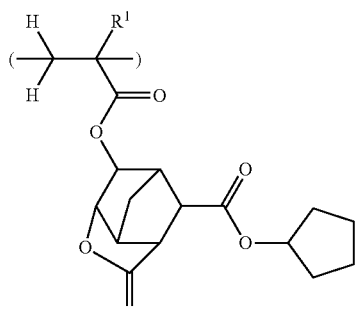
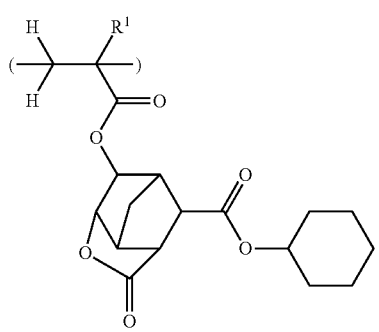

-continued
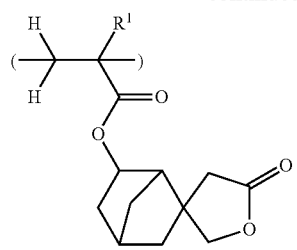
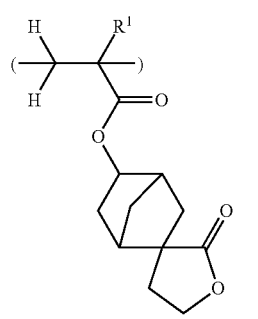 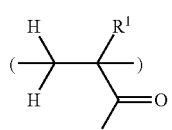
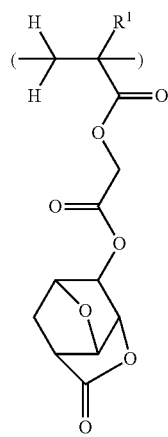 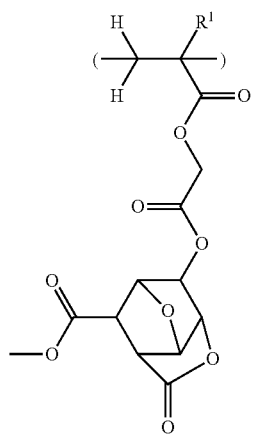
-continued
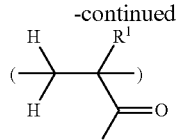
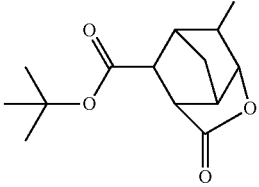
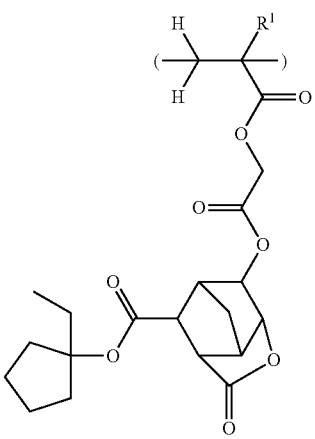
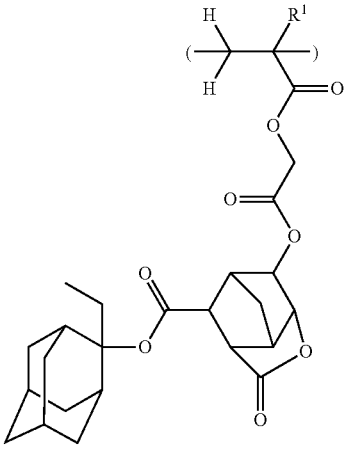

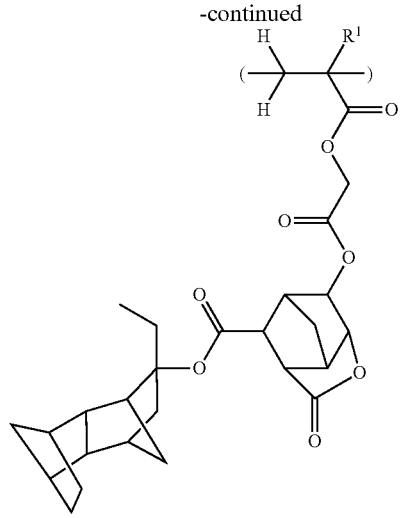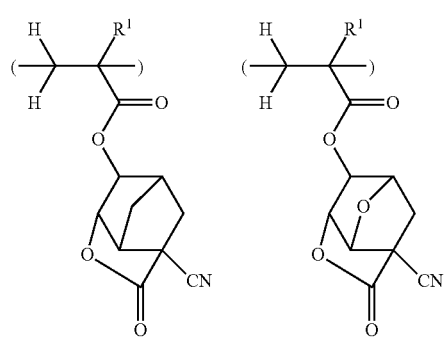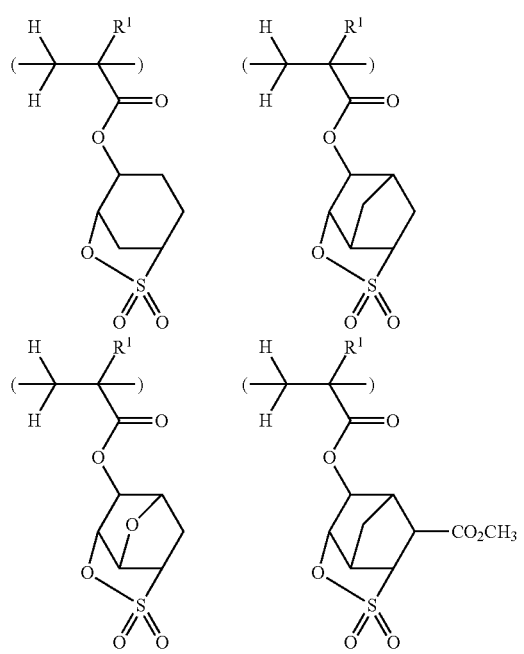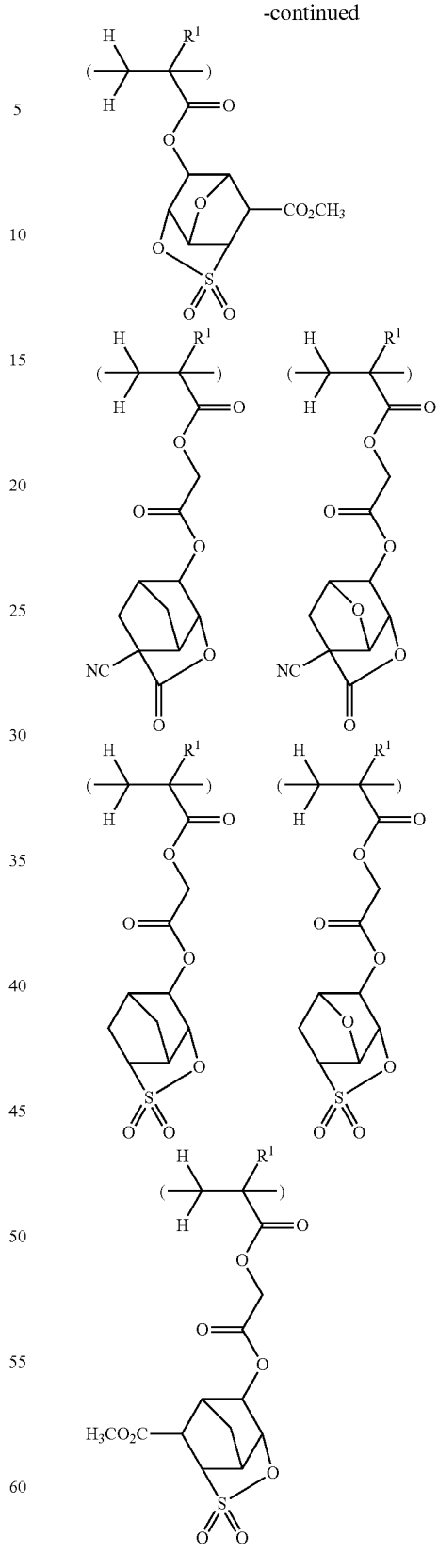
Illustrative examples of the recurring units having formula (D) are given below, but not limited thereto. Herein $R^1$ is as defined above.

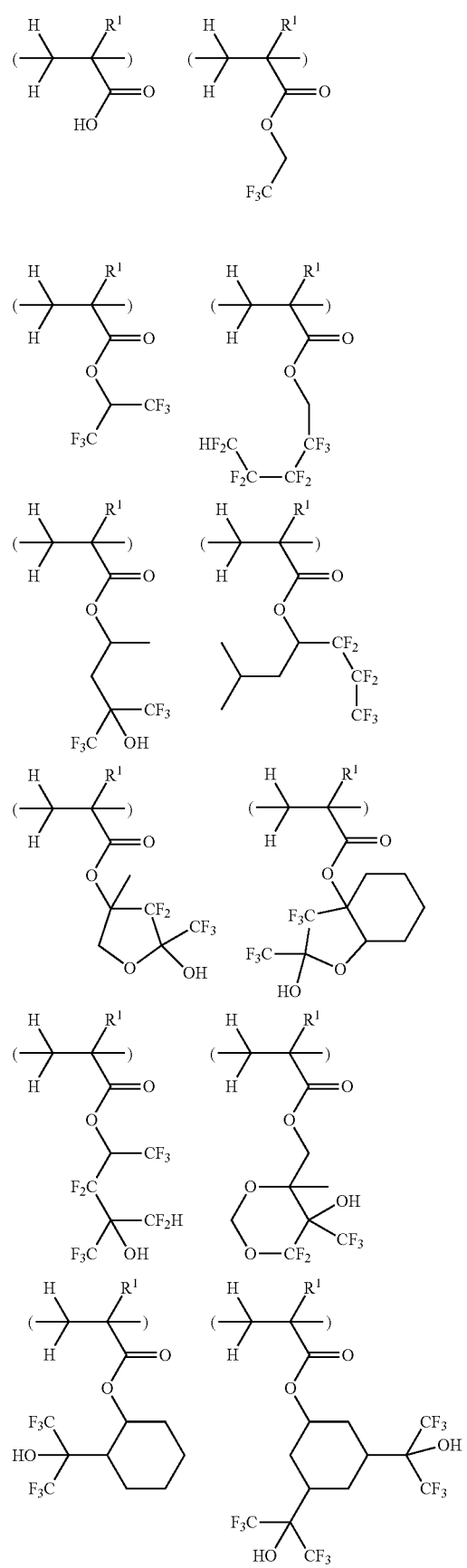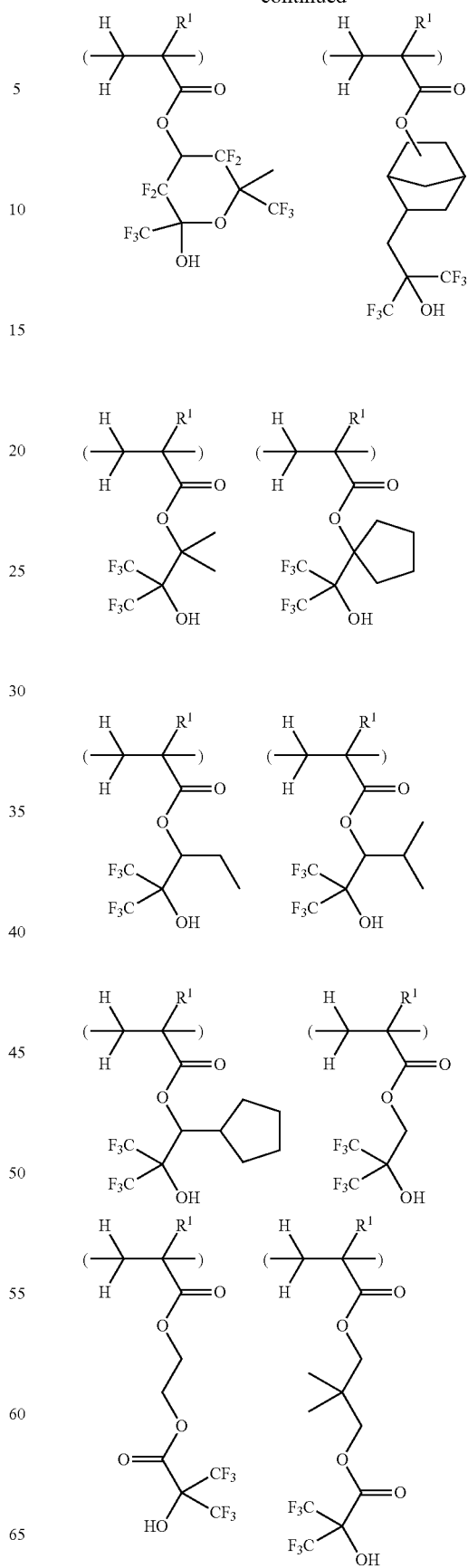

-continued
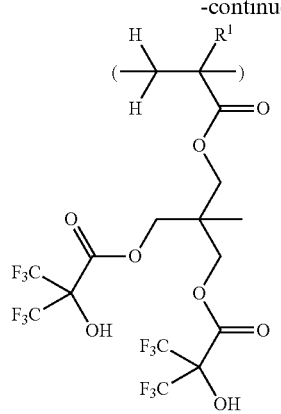
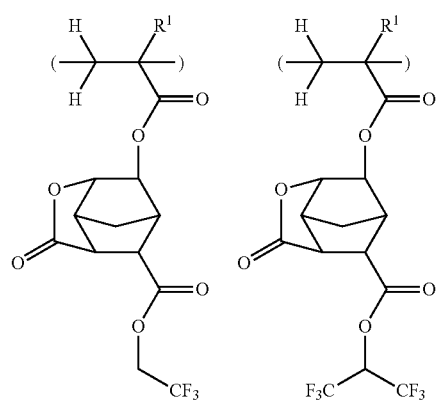
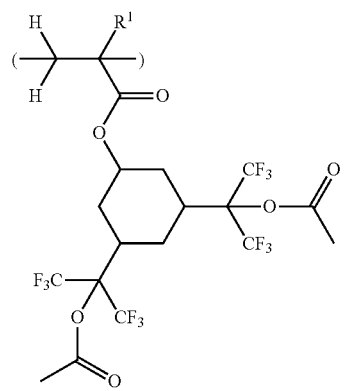
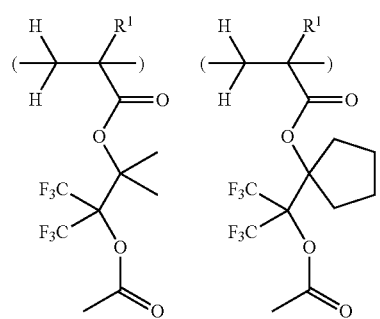
-continued
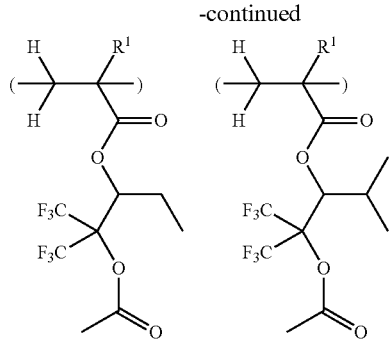
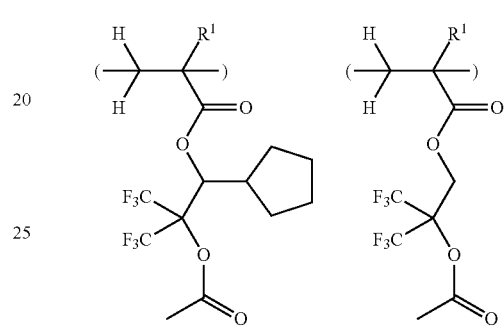
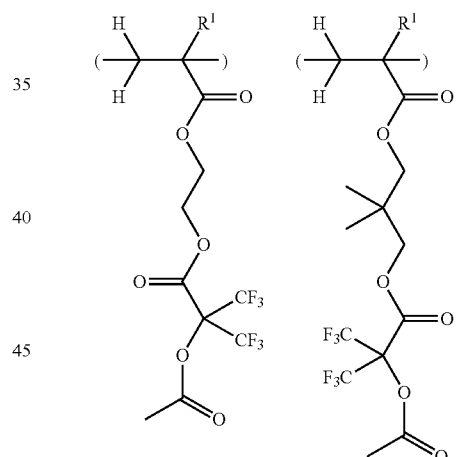
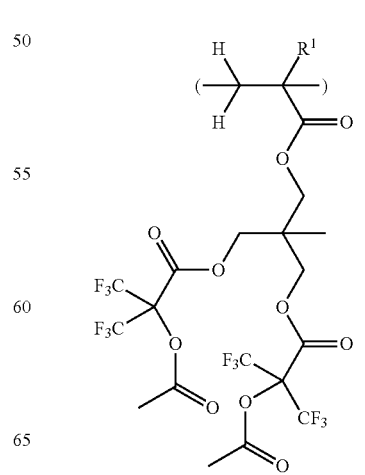

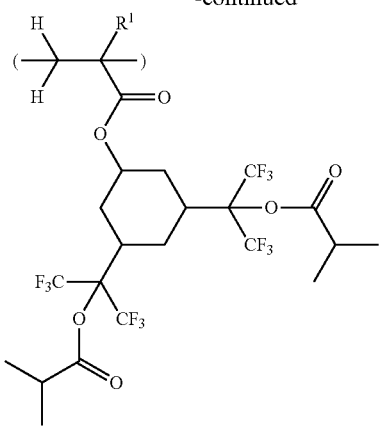

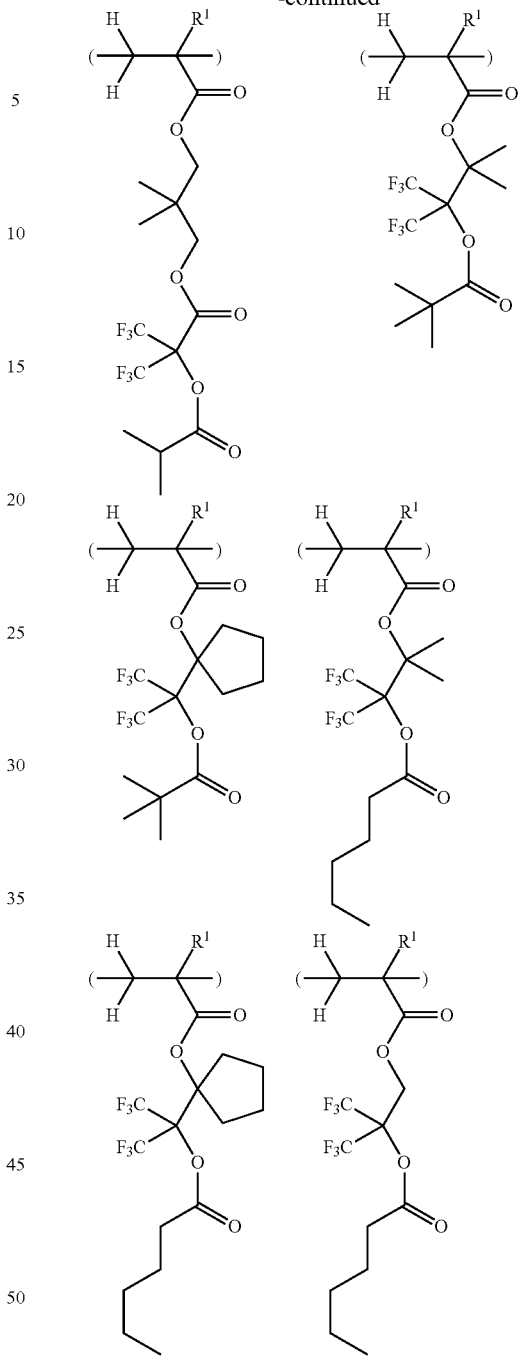

A polymer comprising recurring units of formula (E) is decomposed under the action of acid to generate a hydroxyl group so that its solubility in various solvents may change. In formula (E), the acid labile group $X^E$ may be selected from a variety of such groups. Examples of the acid labile group $X^E$ are groups of formulae (L1) to (L4), tertiary alkyl groups of 4 to 20 carbon atoms, trialkylsilyl groups in which each alkyl moiety has 1 to 6 carbon atoms, and oxoalkyl groups of 4 to 20 carbon atoms, like the acid labile group $X^A$ mentioned above.

Illustrative examples of the recurring units having formula (E) are given below, but not limited thereto. Herein $R^1$ is as defined above.

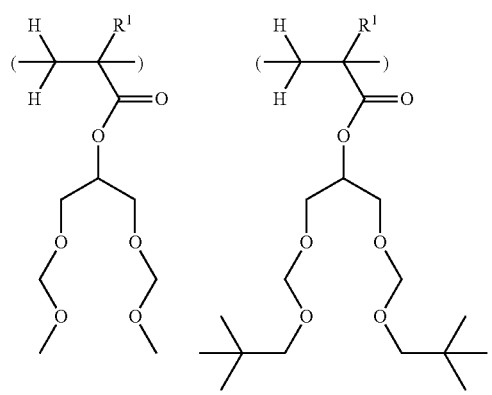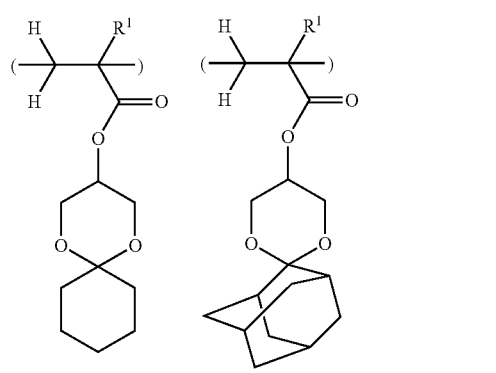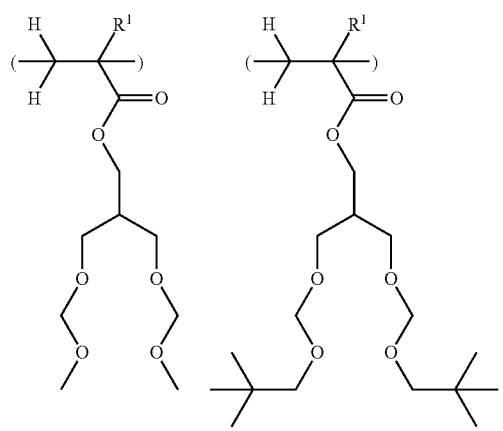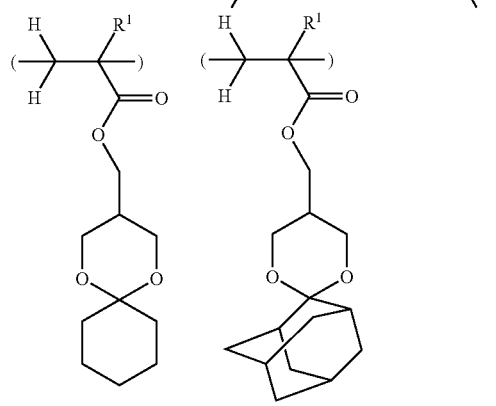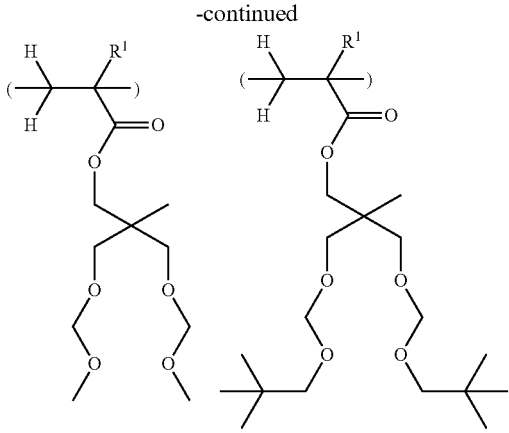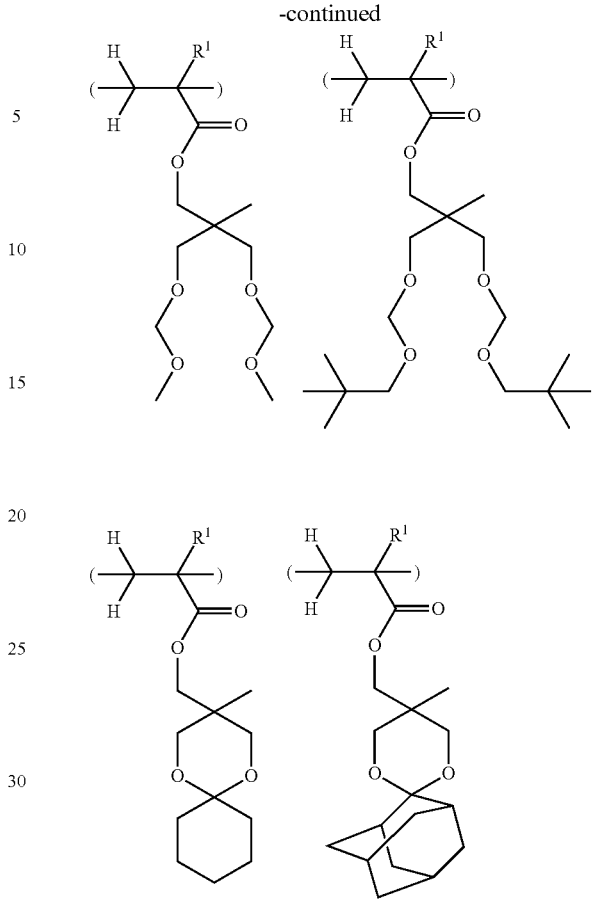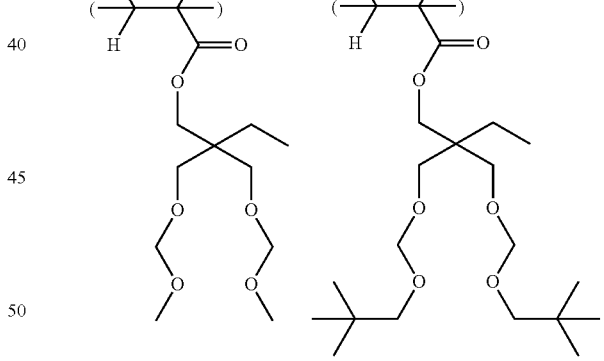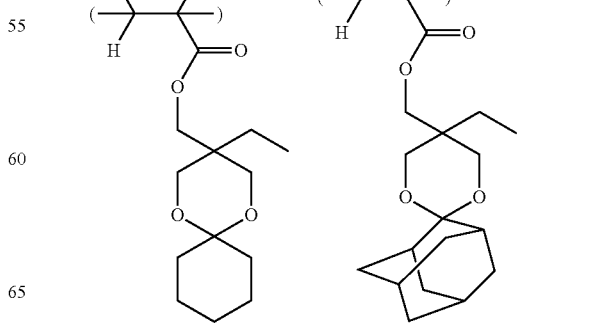

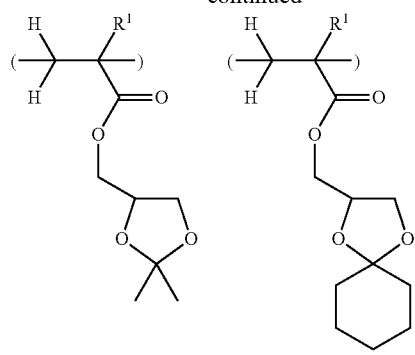
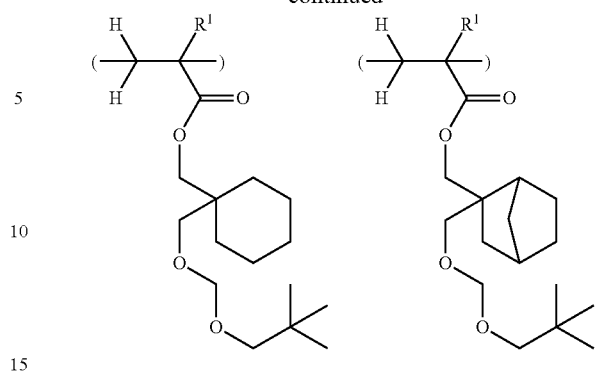
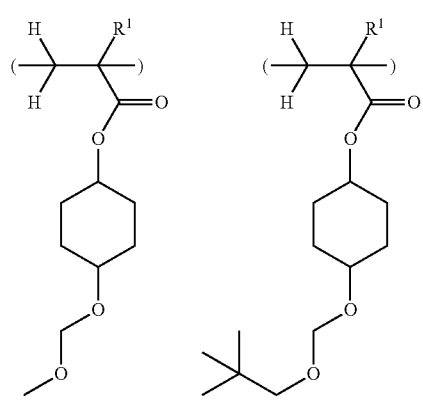
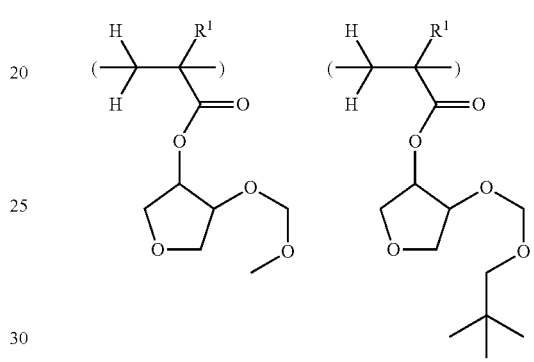
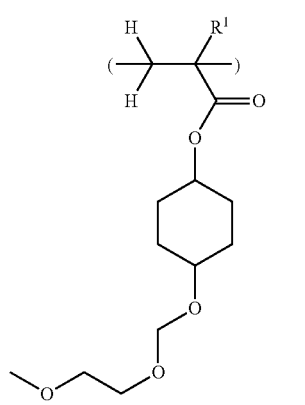
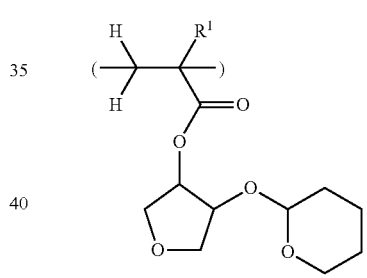
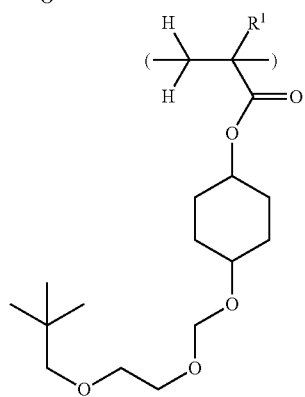
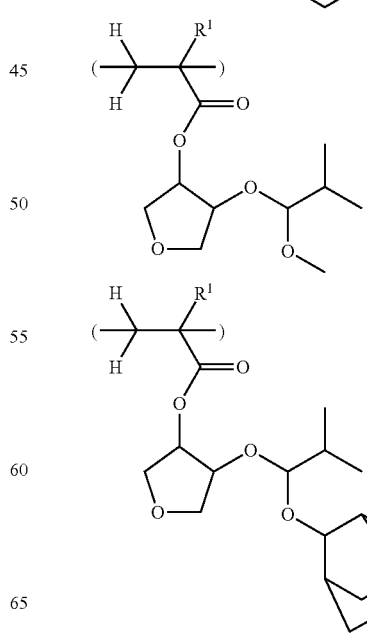

-continued
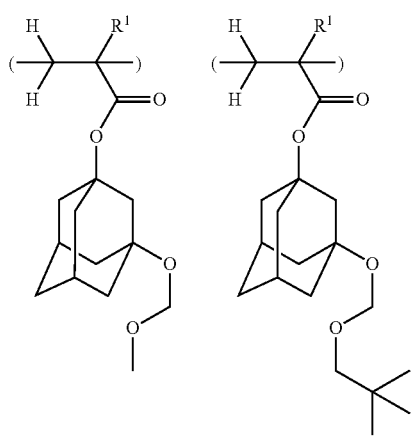
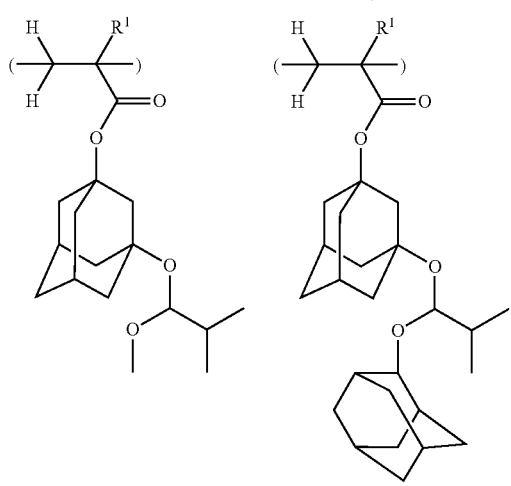
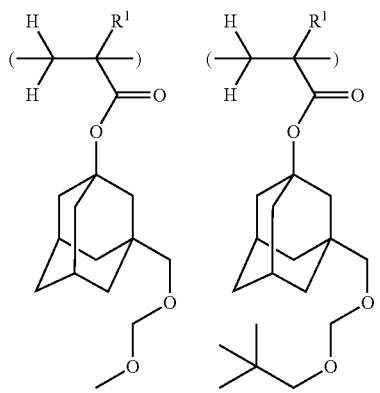
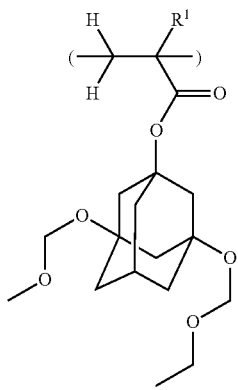
-continued
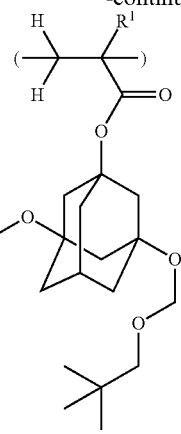
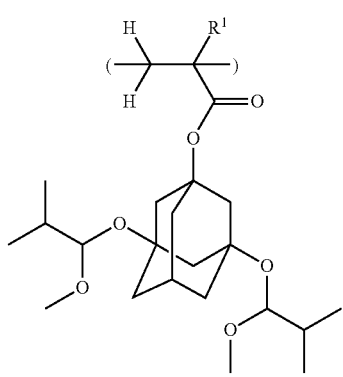
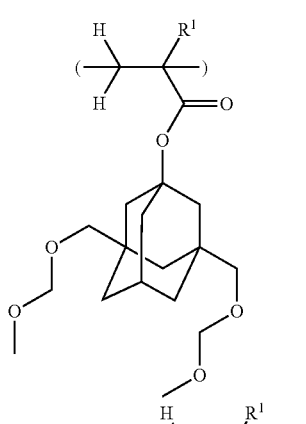
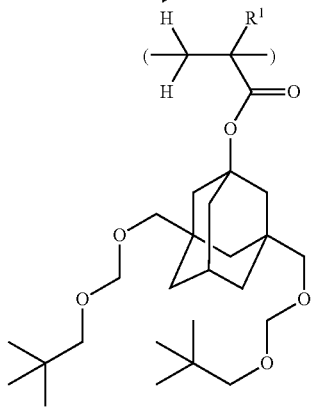

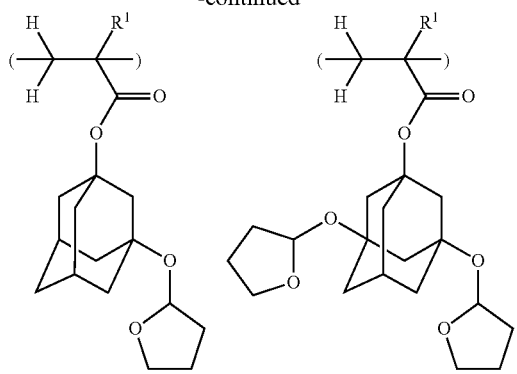
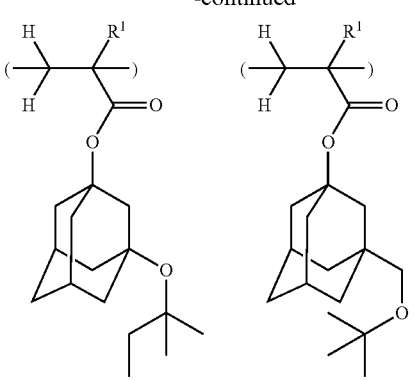
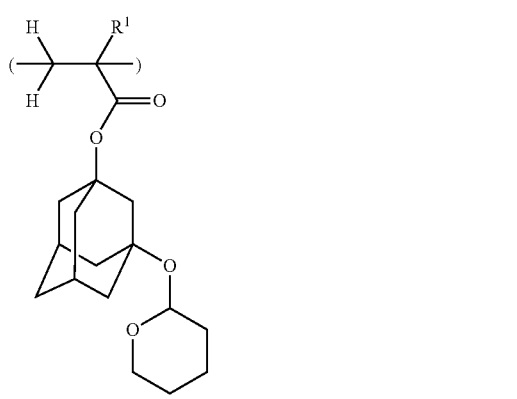
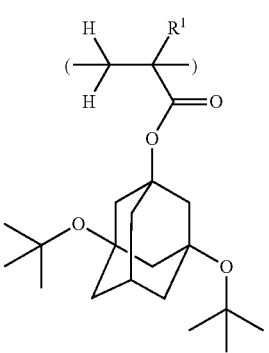
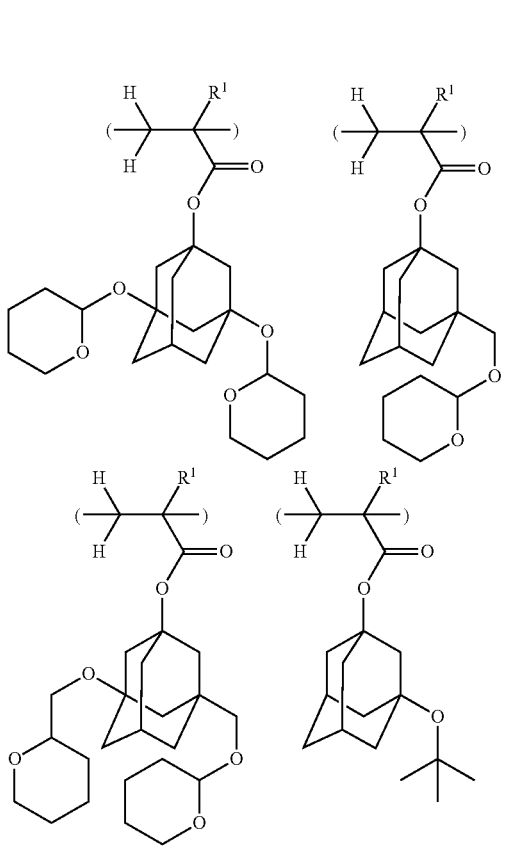
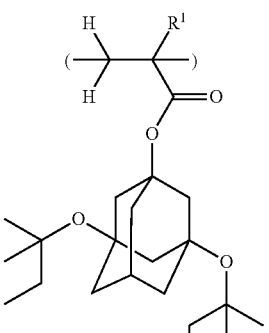
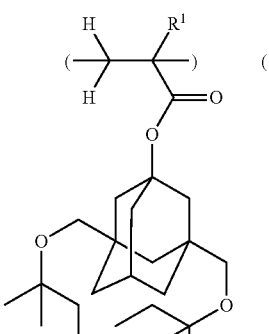
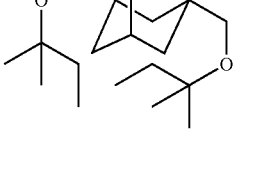

-continued
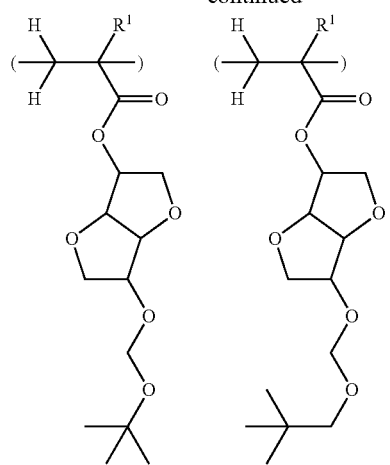
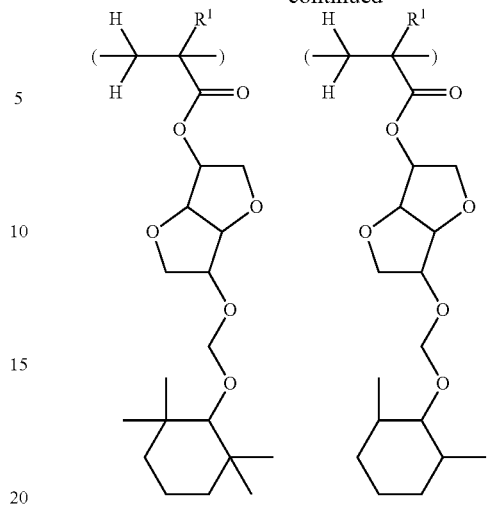
-continued
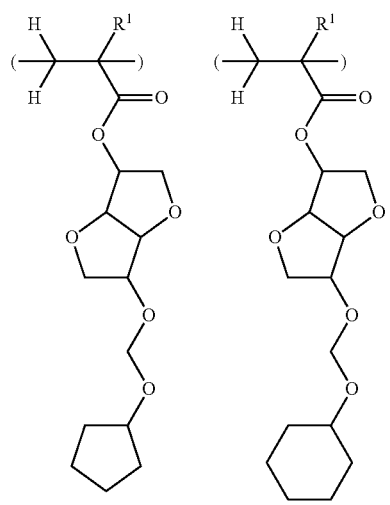
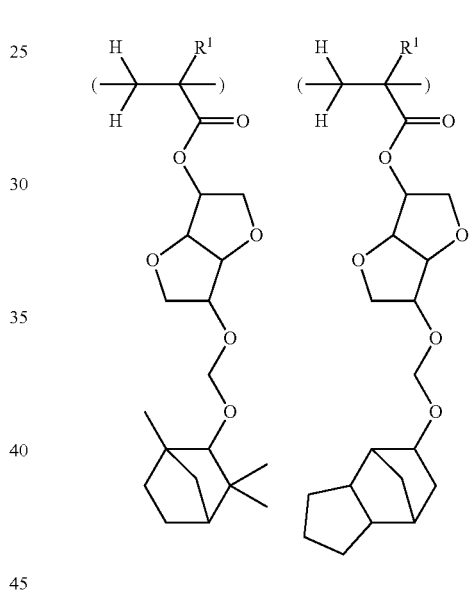
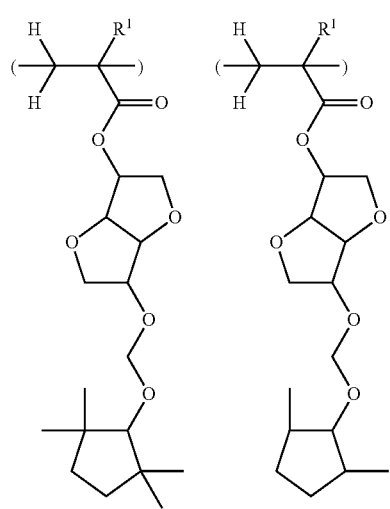
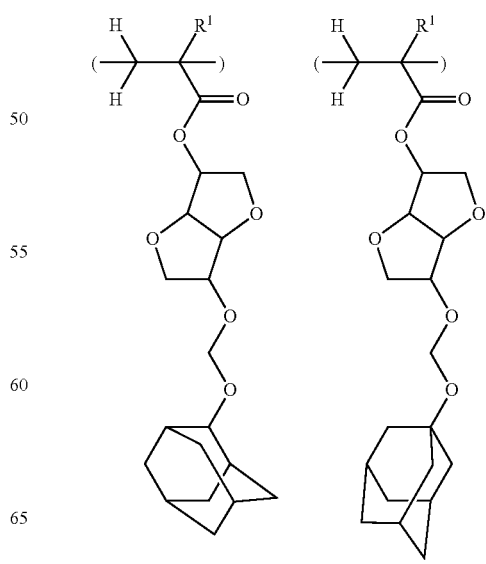

-continued
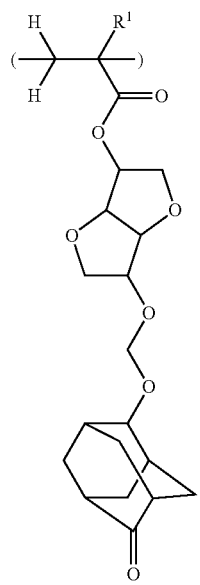
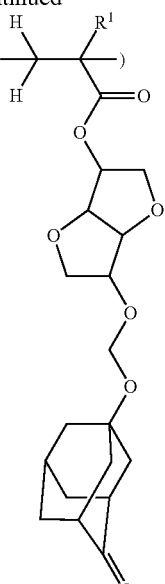
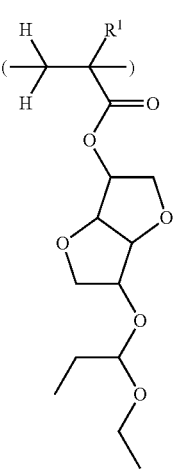
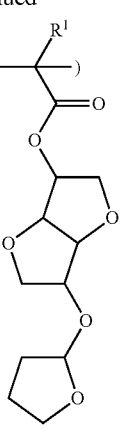
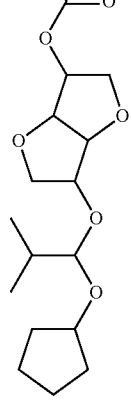
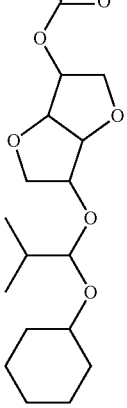

79
-continued
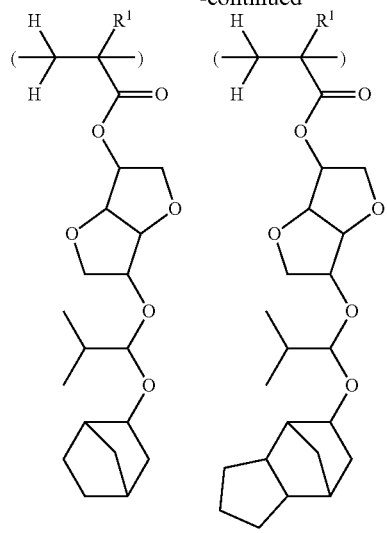
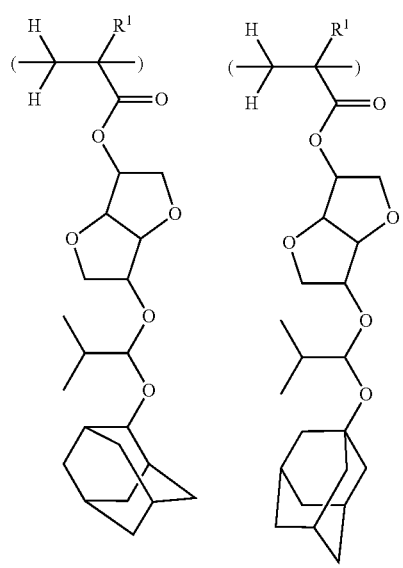
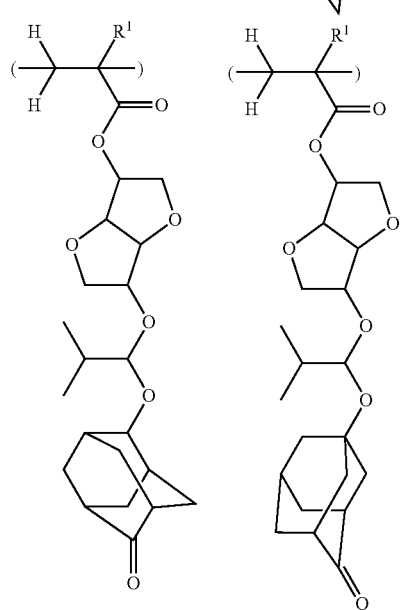
80
-continued
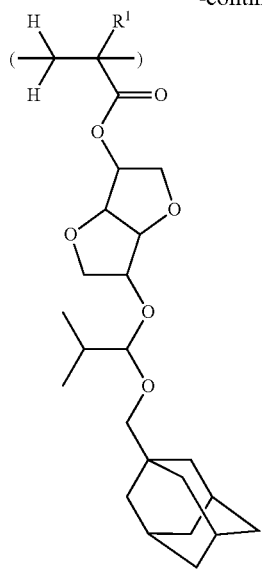
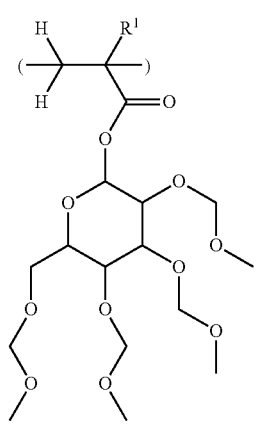
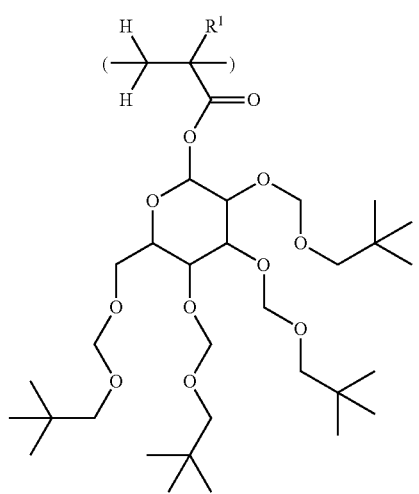

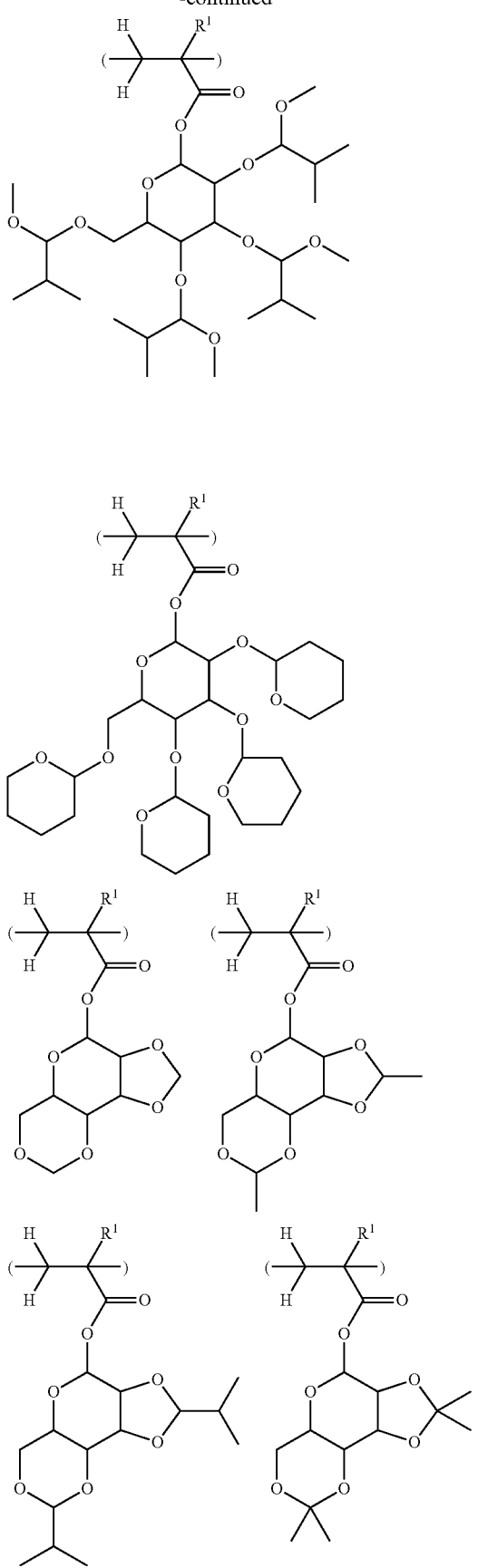
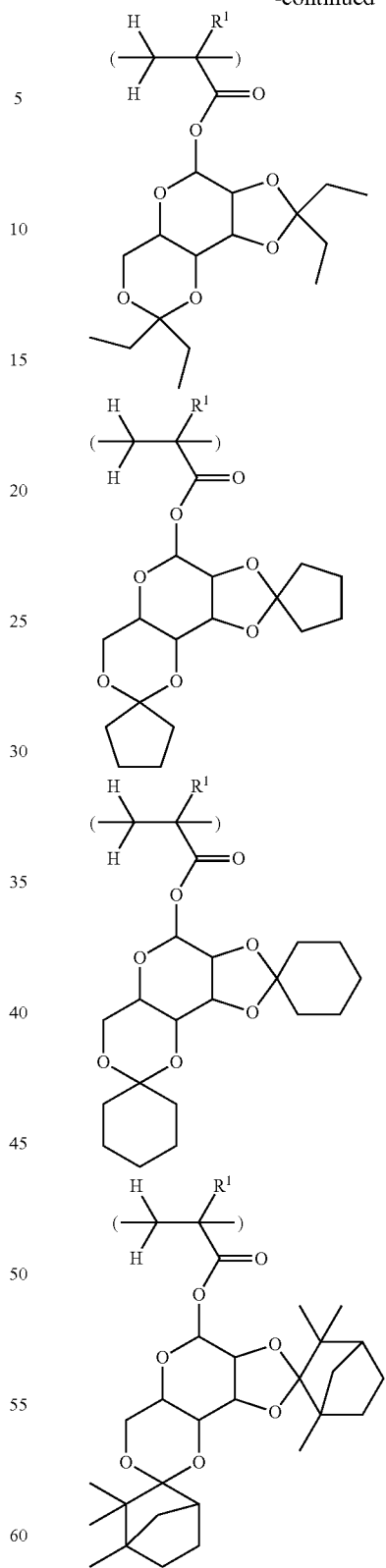
Of the recurring units of formulae (A) to (E), those units of formulae (A) to (C) are preferred in that the polymer may be readily adjusted thereby in solvent solubility and adhesion.

The shrink material polymer may further comprise recurring units of the following formula (F). The unit of formula (F) may induce neutralizing reaction with the carboxyl group available on the surface of the resist pattern film to which the shrink material is applied. As a result, the shrink material polymer adheres to the resist film surface, indicating an increased attachment.

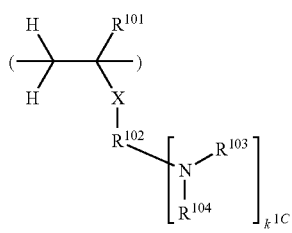
(F)

Herein $R^{101}$ is hydrogen or methyl. X is a single bond, —C(=O)—, —C(=O)—O— or —C(=O)—NH—. $R^{102}$ is a single bond or a straight, branched or cyclic $C_1$-$C_{10}$ alkylene group which may contain an ether, ester, carbonyl moiety, —N= or —S—, or a phenylene or naphthylene group. $R^{103}$ and $R^{104}$ are each independently hydrogen, a straight or branched $C_1$-$C_4$ alkyl group, or an acid labile group, or $R^{103}$ and $R^{104}$ may bond together to form a ring with the nitrogen atom to which they are attached, the ring optionally containing an ether bond, or either one of $R^{103}$ and $R^{104}$ may bond with $R^{102}$ to form a ring with the nitrogen atom to which they are attached, and $k^{1C}$ is 1 or 2.

The recurring unit of formula (F) may be derived from a monomer having the following formula (Fa).

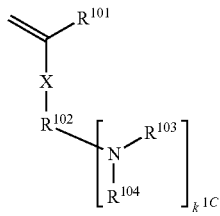
(Fa)

Herein $R^{101}$ to $R^{104}$, X and $k^{1C}$ are as defined above.

Examples of the monomer having formula (Fa) are shown below, but not limited thereto.

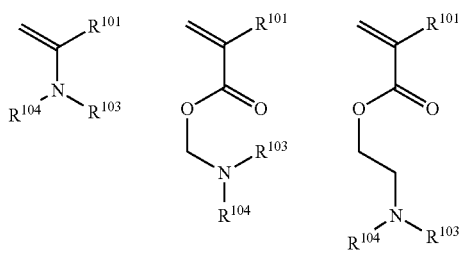

-continued

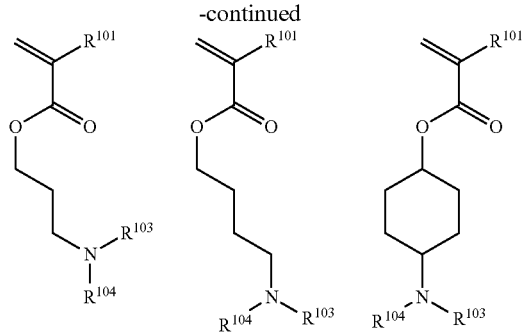

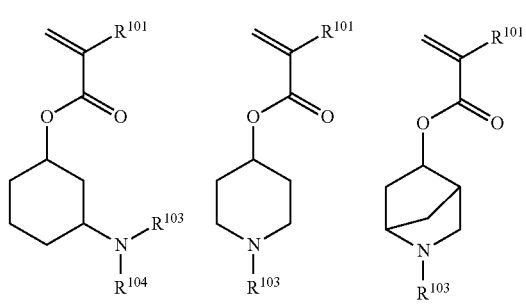

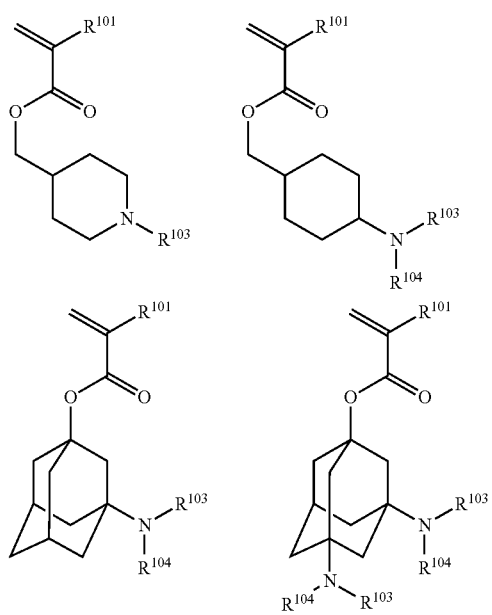

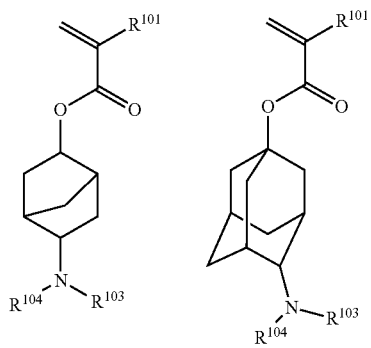

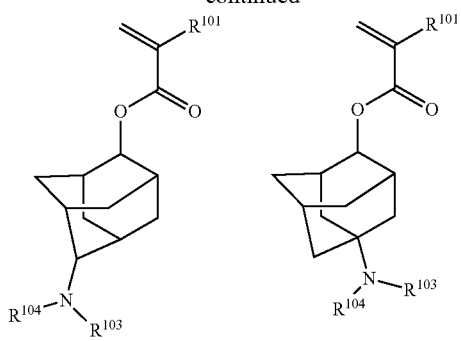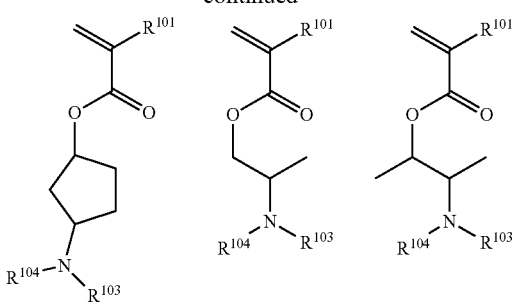

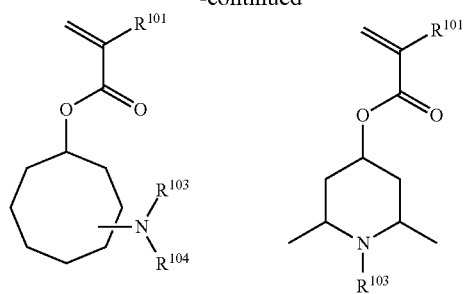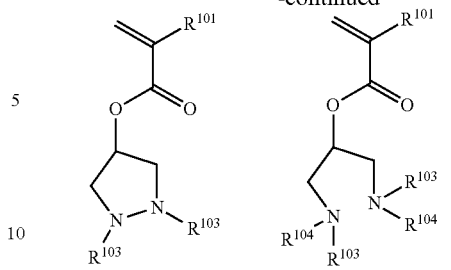

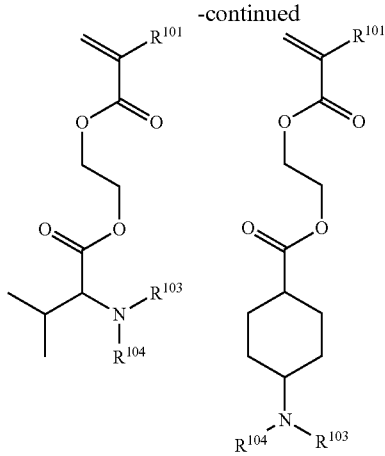
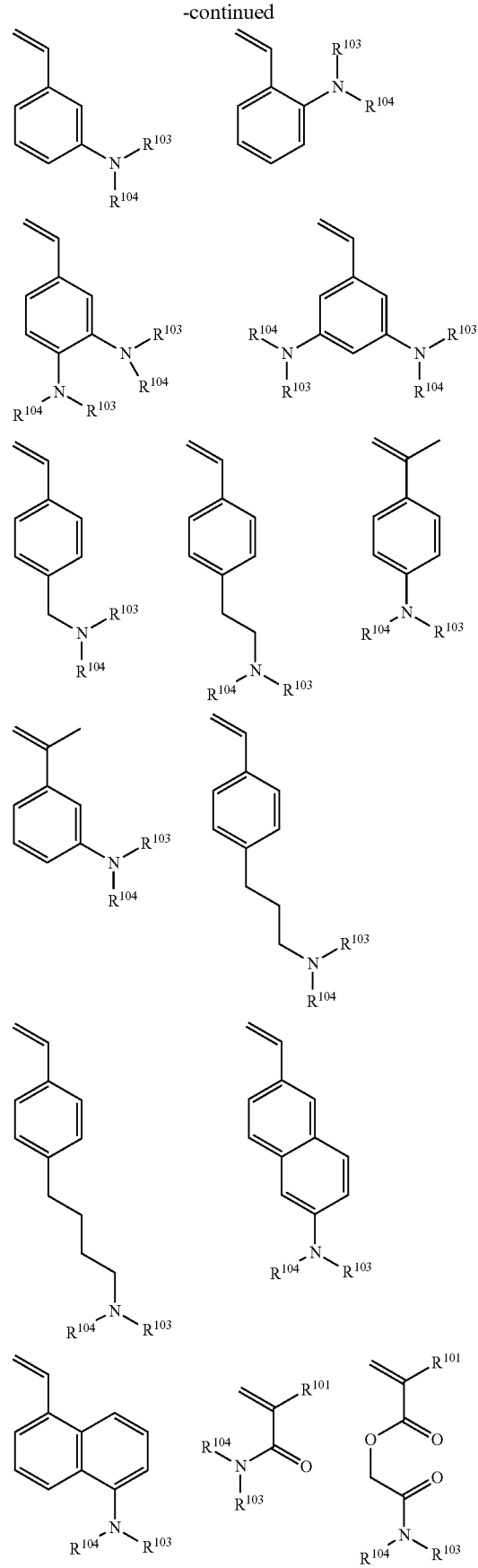

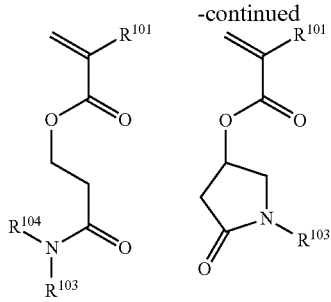
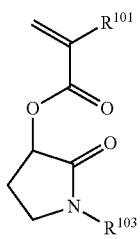
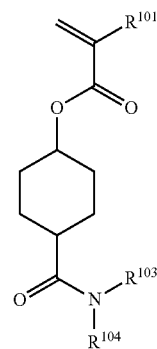
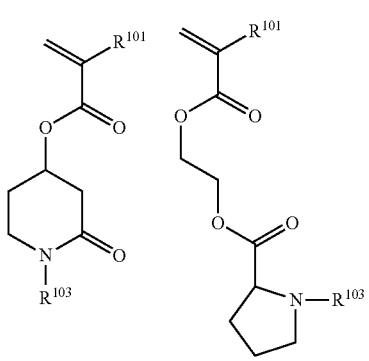
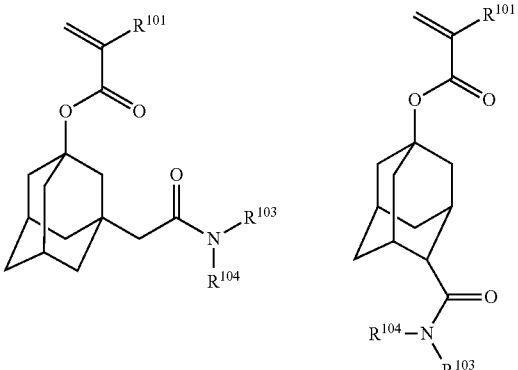
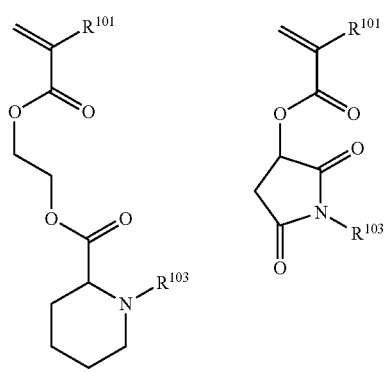
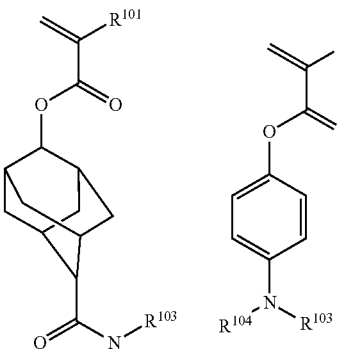
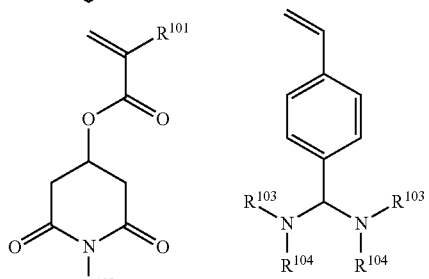
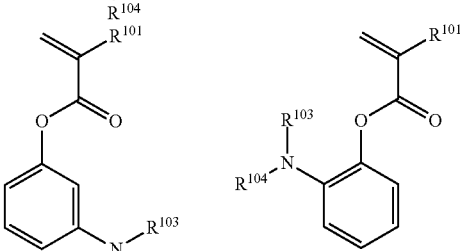
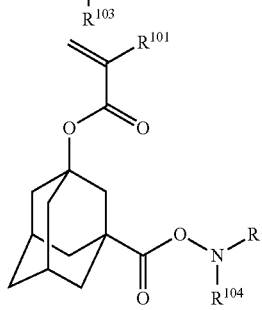
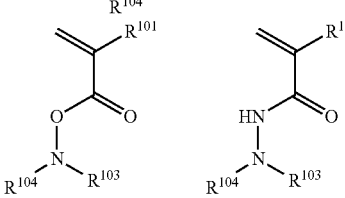
Herein $R^{101}$ to $R^{104}$ are as defined above.
The shrink material polymers may be used alone or in admixture. When the polymer is used alone, it is designed by selecting recurring units having desired functions, and determining a constitutional ratio of the recurring units so as to provide an appropriate shrinkage and dimensional uniformity to the shrink material formulated therefrom.

The shrink material polymer may be prepared by combining suitable monomers and copolymerizing them in the standard way while protection and deprotection reactions are combined if necessary. The copolymerization reaction is preferably radical polymerization though not limited thereto.

In the shrink material polymer, the recurring units of formula (1a) and/or (1b) are preferably incorporated in an amount of at least 5 mol %, more preferably at least 10 mol % based on the entire recurring units.

The recurring units of formula (2) are preferably incorporated in an amount of 0 to 90 mol % based on the entire recurring units. For more attachment to the resist pattern and substrate adhesion, the amount of units of formula (2) is more preferably 5 to 85 mol %, even more preferably 10 to 80 mol %.

The recurring units of formula (3) are preferably incorporated in an amount of 0 to 90 mol % based on the entire recurring units. For more attachment to the resist pattern and substrate adhesion, the amount of units of formula (3) is more preferably 5 to 85 mol %, even more preferably 10 to 80 mol %.

The recurring units of formula (4) or (5) are preferably incorporated in an amount of 0 to 30 mol % based on the entire recurring units. For more etch resistance, the amount of units of formula (4) or (5) is more preferably 5 to 30 mol %, even more preferably 5 to 20 mol %.

The recurring units of formulae (A) to (E) are preferably incorporated in an amount of 0 to 30 mol % based on the entire recurring units. For more substrate adhesion and solubility adjustment, the amount of units of formulae (A) to (E) is more preferably 1 to 30 mol %, even more preferably 5 to 20 mol %.

The recurring units of formula (F) are preferably incorporated in an amount of 0 to 30 mol % based on the entire recurring units. For more attachment, the amount of units of formula (F) is more preferably 1 to 30 mol %, even more preferably 1 to 20 mol %.

In the shrink material polymer, the recurring units of formula (1a) and/or (1b) and the recurring units selected from the units of formulae (2), (4) and (5) preferably account for at least 60 mol % based on the entire recurring units because this ensures to formulate a shrink material having the desired properties. More preferably the recurring units of formula (1a) and/or (1b) and the recurring units of formulae (2), (4) and (5) account for at least 70 mol %, even more preferably at least 85 mol % based on the entire recurring units.

When the entire constituent units of the shrink material polymer are the recurring units of formula (1a) and/or (1b) and the recurring units selected from the units of formulae (2), (4) and (5), high etch resistance and high resolution are available in a compatible manner. In the shrink material polymer, recurring units other than the recurring units of formulae (1a), (1b), (2), (4) and (5) may be incorporated. For example, (meth)acrylate units protected with a conventional acid labile group and/or (meth)acrylate units having an adhesive group such as lactone structure may be used. Characteristics of a shrink material film may be finely adjusted by incorporating such additional recurring units although the additional recurring units are optional.

The shrink material polymer preferably has a weight average molecular weight (Mw) of 1,000 to 500,000, more preferably 2,000 to 100,000, and even more preferably 2,000 to 20,000, as measured versus polystyrene standards by GPC using tetrahydrofuran solvent. If Mw is too low, the acid diffusion distance may be extended and the shrinkage may be increased and become uncontrollable. If Mw is too high, the solubility in stripper solvent may be reduced to such an extent as to leave scum in spaces at the end of stripping step, resulting in a footing phenomenon.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer, i.e., shrink material polymer should preferably have a narrow dispersity (Mw/Mn) of 1.0 to 2.0, especially 1.0 to 1.5, in order to provide a shrink material suitable for micropatterning to a small feature size.

It is acceptable to use a blend of two or more polymers which are different in compositional ratio, molecular weight or dispersity.

In addition to the polymer defined above, the shrink material comprises a solvent containing an anti-vanishing solvent which does not cause the resist pattern after development to vanish. Included in the anti-vanishing solvent are ether solvents of 6 to 12 carbon atoms, hydrocarbon solvents of 6 to 12 carbon atoms, ester solvents of 7 to 16 carbon atoms, ketone solvents of 8 to 16 carbon atoms, alcohol solvents of 4 to 10 carbon atoms, and water. As long as the anti-vanishing solvent accounts for at least 50% by weight of the overall solvent, another solvent that allows the resist pattern after development to vanish may be contained.

Although a number of water-based shrink materials are already proposed, they are difficult to quickly apply to large-diameter wafers because of the high surface tension of water. A problem arises particularly in the case of a fine hole pattern formed via negative development. When holes are filled with the shrink material by spin coating, the water solvent having a high surface tension prevents the shrink material from burying in the holes to the bottom. In contrast, when a shrink material dissolved in an organic solvent having a lower surface tension than water is applied, the ability to fill or bury to the hole bottom is improved. Also the organic solvent used in the shrink material must dissolve the shrink material polymer.

As the solvent used in the shrink material, ester solvents of 7 to 16 carbon atoms, ketone solvents of 8 to 16 carbon atoms, and alcohol solvents of 4 to 10 carbon atoms are preferred because of their high dissolving power to the shrink material polymer.

Examples of the ester solvents of 7 to 16 carbon atoms include pentyl acetate, isopentyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate, Examples of the ketone solvents of 8 to 16 carbon atoms include 2-octanone, 3-octanone, 4-octanone, 2-nonanone, 3-nonanone, 4-nonanone, 5-nonanone, diisobutyl ketone, ethylcyclohexanone, ethylacetophenone, ethyl n-butyl ketone, di-n-butyl ketone, and diisobutyl ketone.

Examples of the alcohol solvents of 4 to 10 carbon atoms include 1-butanol, 2-butanol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. These solvents may be used alone or in admixture.

For the purpose of preventing intermixing of the shrink material and the resist pattern, any of $C_8$-$C_{12}$ ether, $C_6$-$C_{12}$ alkane, alkene, alkyne and aromatic solvents may be blended with the anti-vanishing solvent.

Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, tert-butylbenzene, mesitylene, and anisole. The solvents may be used alone or in admixture.

In addition to the anti-vanishing solvent, the shrink material may contain an additional solvent. The additional solvent is selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. The additional solvent, if used, is preferably blended in an amount of less than 50% by weight of the overall solvent.

In the shrink material, the solvent is preferably used in an amount of 100 to 100,000 parts, more preferably 200 to 50,000 parts by weight per 100 parts by weight of the polymer.

To the shrink material, a salt, basic compound and surfactant may be added if desired. The salt that can be added is typically selected from sulfonium salts and iodonium salts which are typically added to resist compositions, and ammonium salts. The basic compound that can be added may be selected from those basic compounds which are typically added to resist compositions, for example, primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamates. The addition of the salt or basic compound is effective for suppressing excessive diffusion of acid from within the resist film and for controlling the amount of shrinkage. The surfactant that can be added may be selected from those surfactants which are typically added to resist compositions.

As the salt, a carboxylic acid salt having the formula (9) is preferred.

$$R^{11}\text{---}CO_2^-M^+ \qquad (9)$$

Herein $R^{11}$ is a straight, branched or cyclic $C_1$-$C_{20}$ alkyl group, straight, branched or cyclic $C_2$-$C_{20}$ alkenyl group or $C_6$-$C_{20}$ monovalent aromatic ring-containing group, in which some or all carbon-bonded hydrogen atoms may be substituted by fluorine, lactone ring-containing moiety, lactam ring-containing moiety or hydroxyl moiety, and in which an ether, ester or carbonyl moiety may intervene in a carbon-carbon bond. $M^+$ is a sulfonium, iodonium or ammonium cation.

Examples of the alkyl group, alkenyl group and monovalent aromatic ring-containing group are as previously described.

The preferred sulfonium, iodonium and ammonium cations have the following formulae (P1) to (P3). By adding a carboxylic acid salt having such a cation, the acid diffusion can be effectively controlled.

Herein $R^{101}$ to $R^{109}$ are each independently a straight, branched or cyclic $C_1$-$C_{12}$ alkyl or oxoalkyl group, a straight, branched or cyclic $C_2$-$C_{12}$ alkenyl or oxoalkenyl group, a $C_6$-$C_{20}$ monovalent aromatic ring-containing group, or a $C_7$-$C_{12}$ aralkyl or aryloxoalkyl group, in which some or all hydrogen atoms may be substituted by halogen, alkyl, alkoxy or the like. A pair of $R^{101}$ and $R^{102}$, or $R^{106}$ and $R^{107}$ may bond together to form a ring with the sulfur or nitrogen atom to which they are attached. When they form a ring, they together form a $C_1$-$C_{10}$ alkylene or arylene group and the ring may contain an ether, ester, sultone or amino moiety therein.

Examples of the alkyl group, alkenyl group and monovalent aromatic ring-containing group are as previously described. Suitable oxoalkyl and oxoalkenyl groups include the aforementioned alkyl and alkenyl groups in which an oxo moiety is bonded to a carbon atom. Suitable aralkyl groups include benzyl, 1-phenylethyl, and 2-phenylethyl. Suitable aryloxoalkyl groups are 2-aryl-2-oxoethyl groups including 2-phenyl-2-oxoethyl, 2-(1-naphthyl)-2-oxoethyl, and 2-(2-naphthyl)-2-oxoethyl.

Preferred examples of the anion of the foregoing carboxylic acid salt include the carboxylic acid anions described in JP 3991462, and those shown below, but are not limited thereto.

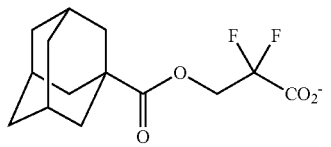
(A-1)

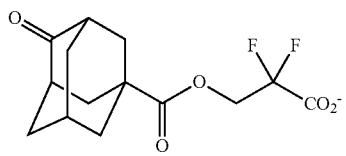
(A-2)

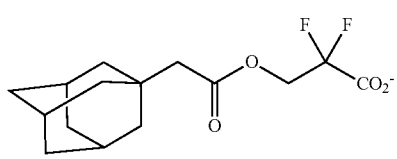
(A-3)

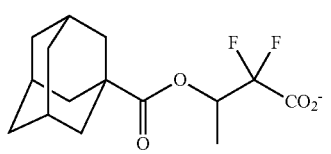
(A-4)

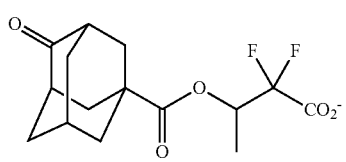
(A-5)

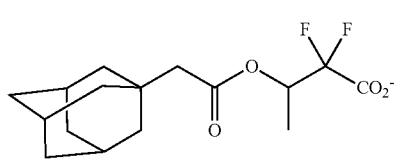
(A-6)

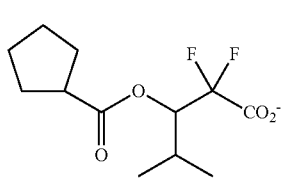
(A-7)

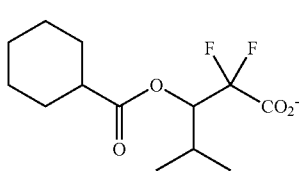
(A-8)

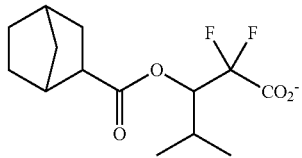
(A-9)

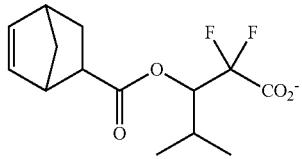
(A-10)

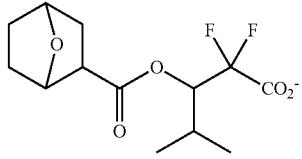
(A-11)

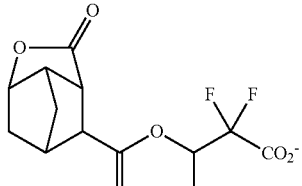
(A-12)

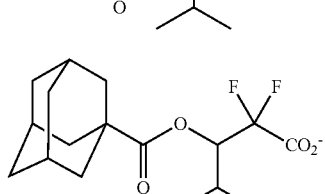
(A-13)

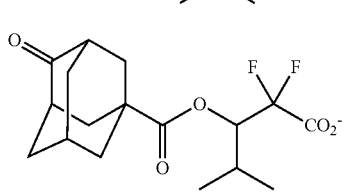
(A-14)

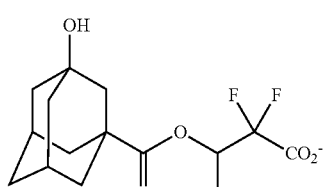
(A-15)

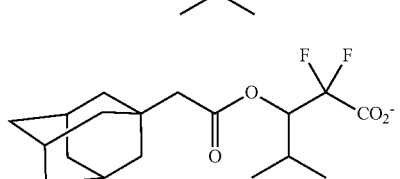
(A-16)

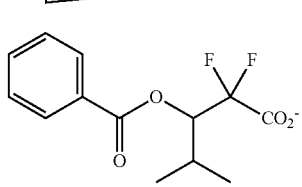
(A-17)

(A-18)
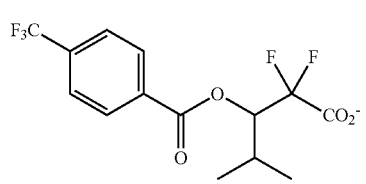
(A-19)
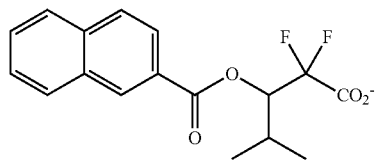
(A-20)
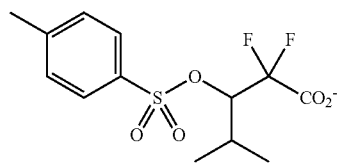
(A-21)
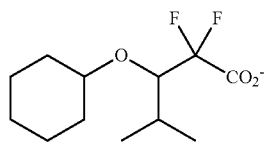
(A-22)
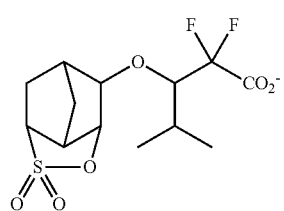
(A-23)
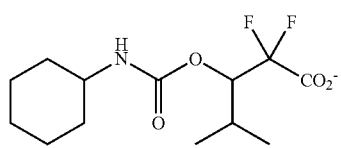
(A-24)
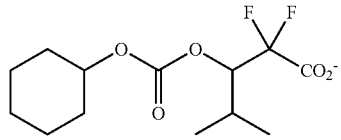
(A-25)
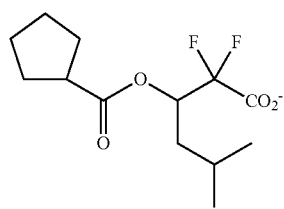
(A-26)
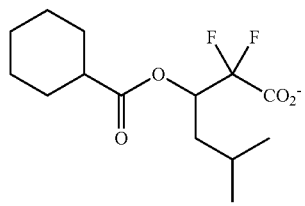
(A-27)
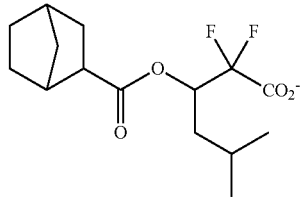
(A-28)
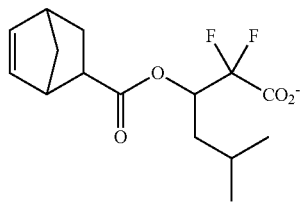
(A-29)
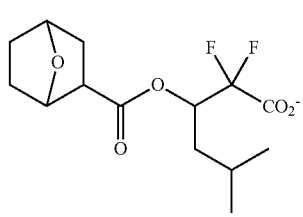
(A-30)
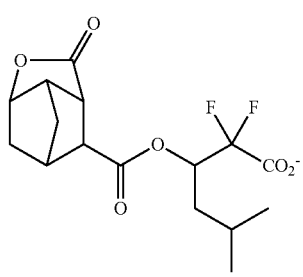
(A-31)
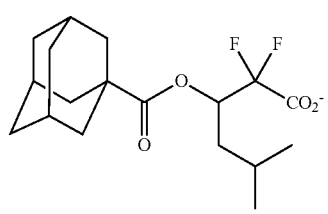
(A-32)
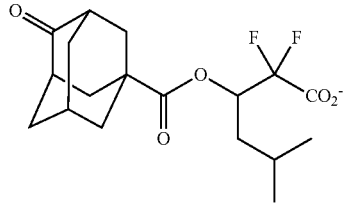
(A-33)
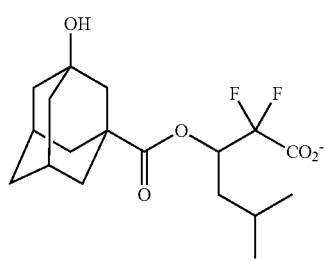

-continued
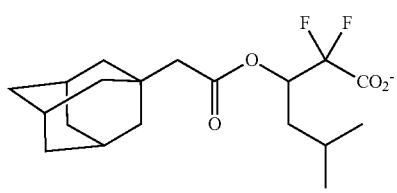
(A-34)
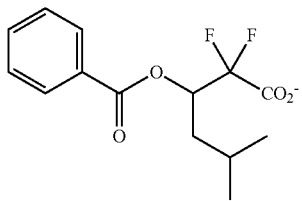
(A-35)
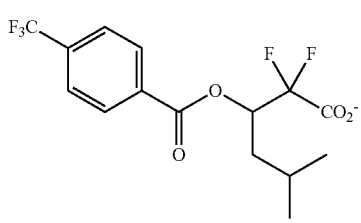
(A-36)
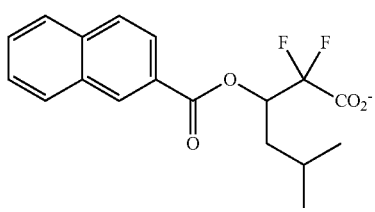
(A-37)
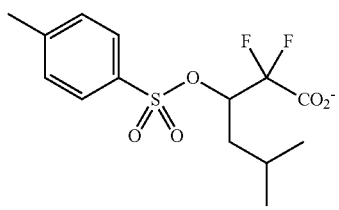
(A-38)
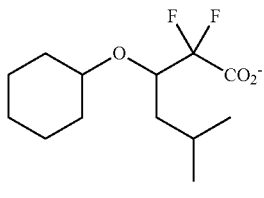
(A-39)
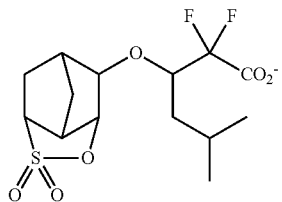
(A-40)
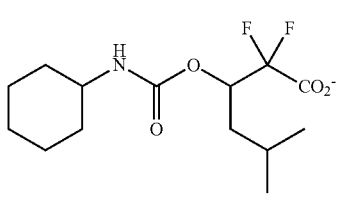
(A-41)
-continued
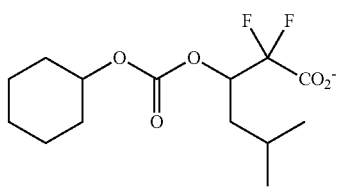
(A-42)
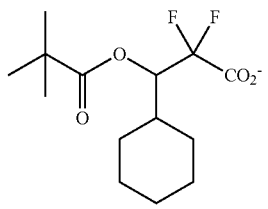
(A-43)
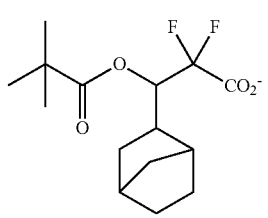
(A-44)
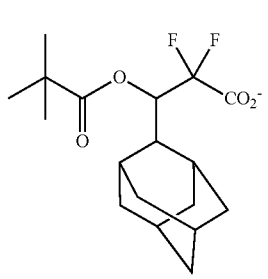
(A-45)
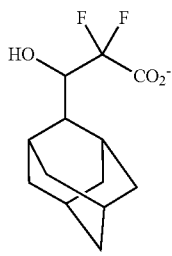
(A-46)
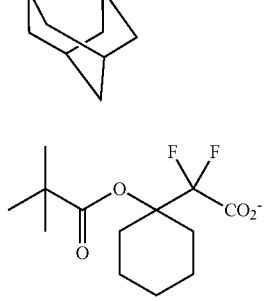
(A-47)
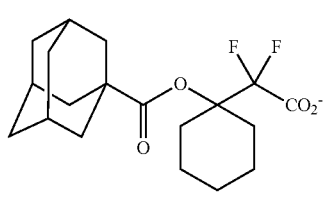
(A-48)

(A-49) 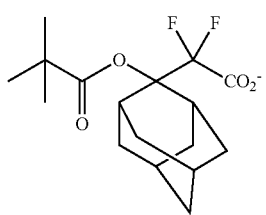
(A-50) 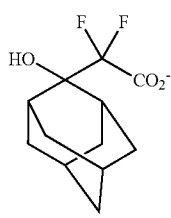
(A-51) 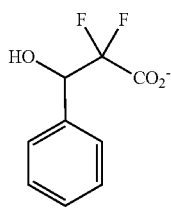
(A-52) 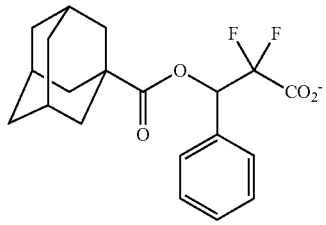
(A-53) 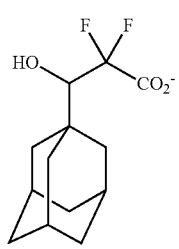
(A-54) 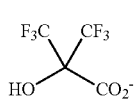
(A-55) 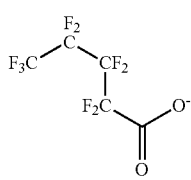
(A-56) 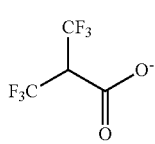
(A-57) 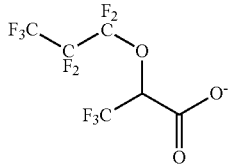
(A-58) 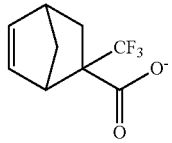
(A-59) 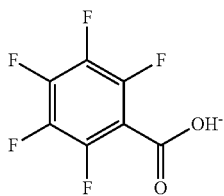
(A-60) 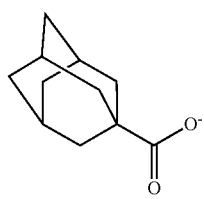
(A-61) 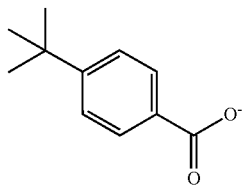
Preferred examples of the cation of the foregoing carboxylic acid salt include those shown below, but are not limited thereto.
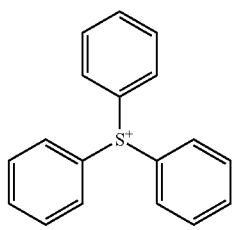
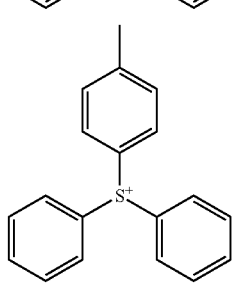

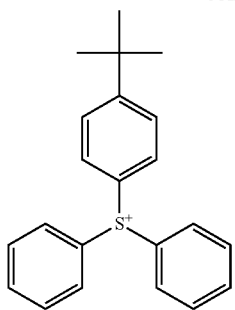
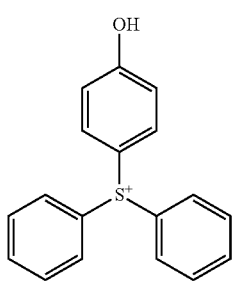
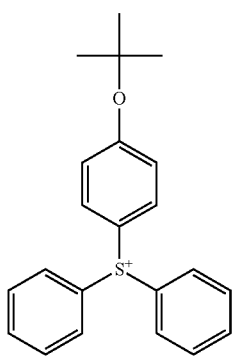
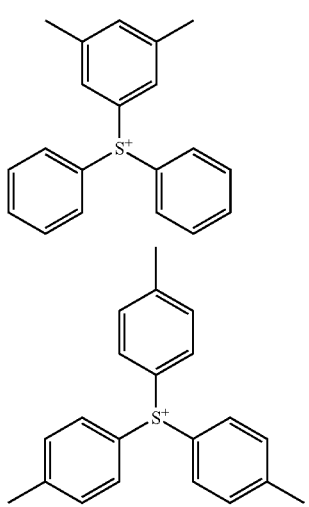
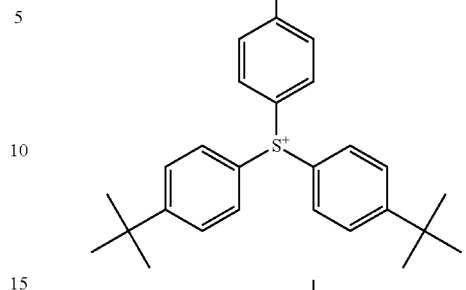
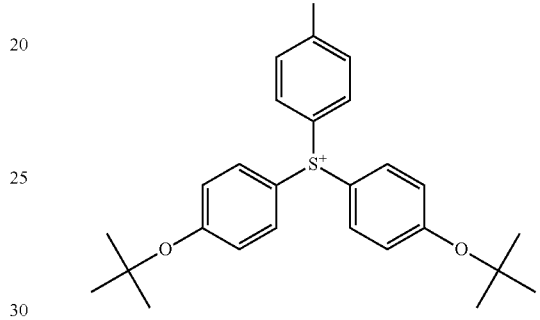
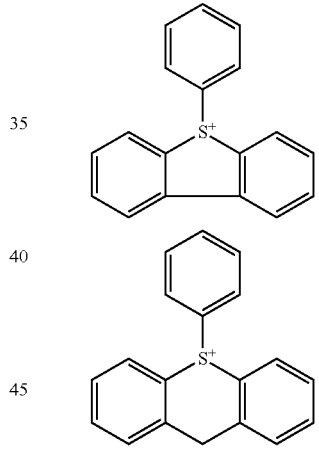
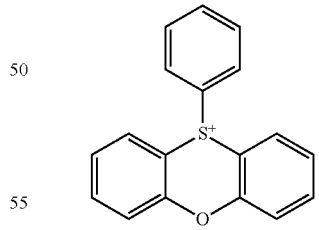
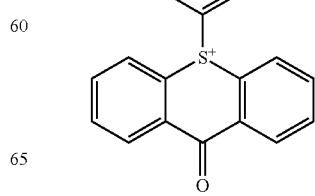

-continued
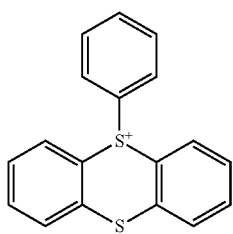
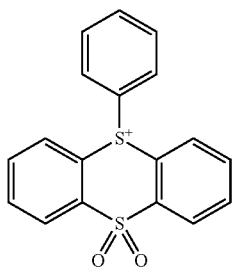
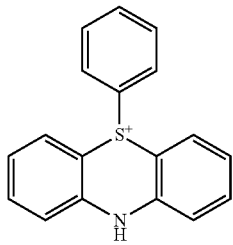
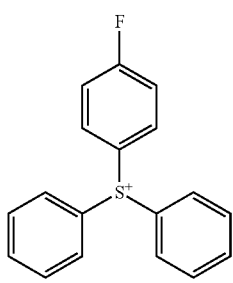
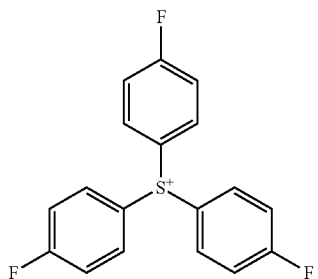
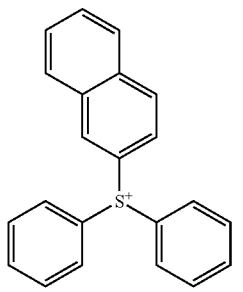
-continued
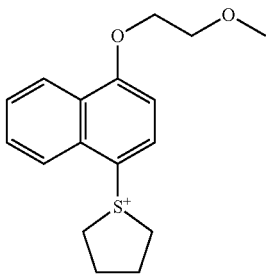
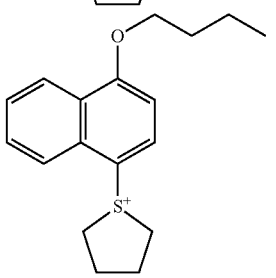
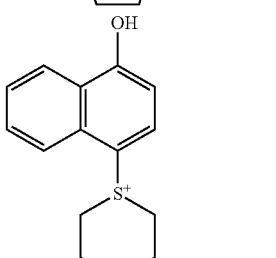
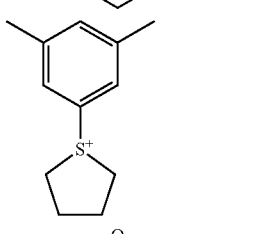
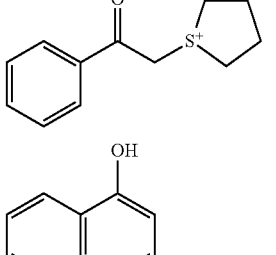
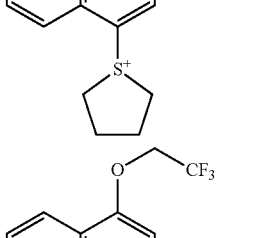
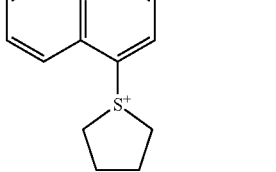

A sulfonic acid salt having the formula (10) is also preferred as the salt.

Herein M⁺ is as defined above. $R^{12}$ is a straight, branched or cyclic $C_1$-$C_{35}$ monovalent hydrocarbon group which may contain an oxygen atom, in which some or all carbon-bonded hydrogen atoms may be substituted by fluorine, with the proviso that the hydrogen atom bonded to the carbon atom at α-position relative to sulfonic acid is not substituted by fluorine.

Of the sulfonic acid salts having formula (10), those having the formula (10') are preferred.

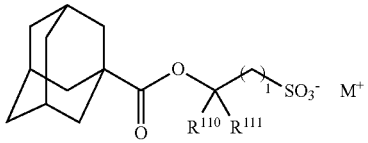

Herein M is as defined above, $R^{110}$ and $R^{111}$ are each independently hydrogen or trifluoromethyl, and 1 is an integer of 1 to 3.

In the shrink material, the salt is preferably used in an amount of 0 to 50 parts, more preferably 0.1 to 20 parts by weight per 100 parts by weight of the polymer.

Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164] (U.S. Pat. No. 7,537,880), and compounds having a carbamate group, as described in JP 3790649. Inter alia, tertiary amine compounds, specifically amine compounds having a hydroxyl, ether, ester group or lactone ring, and compounds having a carbamate group are preferred.

In the shrink material, the basic compound is preferably used in an amount of 0 to 30 parts, more preferably 0.1 to 20 parts by weight per 100 parts by weight of the polymer.

Suitable surfactants include those described in JP-A 2008-111103, paragraphs [0165] to [0166]. The surfactant is preferably used in an amount of 0 to 10 parts, more preferably 0.1 to 5 parts by weight per 100 parts by weight of the shrink material polymer.

Resist Composition

The resist composition used in the pattern forming process of the invention is defined as comprising a base resin, an acid generator (or compound capable of generating an acid in response to high-energy radiation) and an organic solvent. Optionally, the resist composition further comprises a basic compound, dissolution regulator, surfactant, acetylene alcohol, and other additives.

The base resin used herein is defined as comprising recurring units (a) having an acid labile group-substituted carboxyl group, preferably represented by the formula (11).

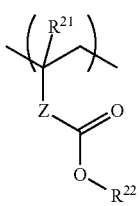

Herein $R^{21}$ is hydrogen or methyl. $R^{22}$ is an acid labile group. Z is a single bond or —C(=O)—O—$R^{23}$— wherein $R^{23}$ is a straight, branched or cyclic $C_1$-$C_{10}$ alkylene group in which an ether or ester bond may intervene in a carbon-carbon bond, or naphthylene group.

Suitable alkylene groups are exemplified above. Suitable acid labile groups are those described in JP-A 2014-088557, paragraphs [0039] to [0044] (U.S. Pat. No. 9,017,918).

The base resin may further comprise recurring units (b) having an adhesive group selected from among hydroxyl, lactone ring, ether, ester, carbonyl and cyano groups, for the purpose of improving substrate adhesion to prevent pattern collapse. The base resin may further comprise recurring units (c) derived from indene, acenaphthylene, chromone, coumarin, and norbornadiene derivatives, as described in JP-A 2012-037867, paragraph [0085]; recurring units (d) derived from styrene, vinylnaphthalene, vinylanthracene, vinylpyrene, and methylene indane derivatives, as described in paragraph [0088]; and/or recurring units (e) derived from onium salts having polymerizable olefin, and functioning as acid generator, as described in paragraphs [0089] to [0091].

In the base resin, recurring units (a) are incorporated in an amount of more than 0 mol % to 100 mol %, preferably 1 mol % to less than 100 mol %, and more preferably 20 to 90 mol %, based on the entire recurring units. Recurring units (b) are incorporated in an amount of 0 mol % to less than 100 mol %, preferably 10 to 80 mol %, based on the entire recurring units. The total of recurring units (a) and (b) is preferably 30 to 100 mol %. When recurring units (c) to (e) are incorporated, preferably recurring units (c) are incorporated in an amount of 0 to 40 mol %, recurring units (d) are incorporated in an amount of 0 to 20 mol %, recurring units (e) are incorporated in an amount of 0 to 30 mol %, and the total of recurring units (c) to (e) is 0 to 70 mol %.

The base resin should preferably have a Mw in the range of 1,000 to 500,000, and more preferably 2,000 to 100,000, as measured by GPC versus polystyrene standards. If Mw is too low, the diffusion distance of acid generated by the acid generator may be extended to invite a drop of resolution. If Mw is too high, the solubility of the polymer in developer may be reduced to invite a drop of resolution.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the base resin should preferably have a narrow dispersity (Mw/Mn) of 1.0 to 2.0, especially 1.0 to 1.5, in order to provide a resist composition suitable for micropatterning to a small feature size.

A blend of two or more polymers which differ in compositional ratio, molecular weight or dispersity is acceptable as the base resin.

The resist composition contains an acid generator such that it may function as a chemically amplified positive resist composition. The acid generator is typically a compound capable of generating an acid in response to actinic light or radiation, known as photoacid generator (PAG). An appropriate amount of the PAG used is 0.5 to 30 parts, more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary of the acid generated by PAG are sulfonic acids, imidic acids and methide acids. Of these, sulfonic acids which are fluorinated at α-position are most commonly used. Where the acid labile group is an acetal group susceptible to deprotection, fluorination at α-position is not always necessary. Where the base resin has recurring units of acid generator copolymerized therein, the acid generator need not be separately added.

Examples of the organic solvent used herein include ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal.

An appropriate amount of the organic solvent is 100 to 10,000 parts, preferably 300 to 8,000 parts by weight, per 100 parts by weight of the base resin.

Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649. Also, onium salts such as sulfonium salts, iodonium salts and ammonium salts of sulfonic acids which are not fluorinated at α-position as described in US 2008153030 (JP-A 2008-158339) and similar onium salts of carboxylic acid as described in JP 3991462 and JP 4226803 may be used as the quencher. They may also be added to the shrink material.

Where the acid labile group is an acetal group which is very sensitive to acid, the acid for eliminating the protective group need not necessarily be a sulfonic acid which is fluorinated at α-position, imidic acid or methide acid. Even with a sulfonic acid which is not fluorinated at α-position, deprotection reaction may take place in some cases. Since an onium salt of sulfonic acid cannot be used as the quencher in this event, an onium salt of imidic acid is preferably used alone.

An appropriate amount of the basic compound is 0.0001 to 30 parts, preferably 0.001 to 20 parts by weight, per 100 parts by weight of the base resin.

Exemplary surfactants are described in JP-A 2008-111103, paragraphs [0165]-[0166]. Exemplary dissolution regulators are described in JP-A 2008-122932 (US 2008090172), paragraphs [0155]-[0178], and exemplary acetylene alcohols in paragraphs [0179]-[0182]. The surfactant, dissolution regulator and acetylene alcohol may be used in any suitable amounts, depending on their purpose of addition.

Also a polymeric additive may be added for improving the water repellency on surface of a resist film as spin coated. The water repellency improver may be used in the topcoatless immersion lithography. The water repellency improver has a specific structure with a 1,1,1,3,3,3-hexafluoro-2-propanol residue and is described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

Pattern Forming Process

Another embodiment is a pattern forming process comprising the steps of applying the resist composition onto a substrate, prebaking to form a resist film; exposing the resist film to high-energy radiation, baking the film; developing the exposed resist film in an organic solvent-based developer to form a negative resist pattern; applying the shrink material onto the negative resist pattern, baking; and removing the excessive shrink material with an organic solvent.

Referring to FIG. 1(A) to FIG. 1(F), the pattern shrinking process of the invention is described. First, as shown in FIG. 1(A), a chemically amplified positive resist composition is applied onto a processable substrate 20 on a substrate 10 to form a resist film 30 thereon. If necessary, a hard mask layer (not shown) may intervene between the resist film 30 and the processable substrate 20. By standard techniques, the resist film 30 is subjected to exposure (FIG. 1(B)), PEB, and organic solvent development to form a negative resist pattern 30a (FIG. 1(C)). A shrink material 40 is applied onto the negative resist pattern 30a to cover the pattern as shown in FIG. 1(D). The shrink material coating is baked, during which the heat functions to evaporate off the solvent and to cause the acid to diffuse from the resist pattern 30a into the shrink material coating 40. With the acid, the polymer in the shrink material coating undergoes deprotection reaction. Thereafter, a solvent is applied to remove the excessive shrink material 40, leaving a shrink material film over the resist pattern 30a. This means that the resist pattern 30a is thickened, that is, the width of spaces in the resist pattern is shrunk as shown in FIG. 1(E). Using the shrunk pattern as a mask, the processable substrate 20 is dry etched as shown in FIG. 1(F).

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask may be of $SiO_2$, SiN, SiON or p-Si. Sometimes, an undercoat in the form of carbon film or a silicon-containing intermediate film may be laid instead of the hard mask, and an organic antireflective coating may be interposed between the hard mask and the resist film.

While a resist film (30) of a chemically amplified positive resist composition is formed on a processable substrate (20) on a substrate (10) directly or via an intermediate intervening layer as mentioned above, the resist film preferably has a thickness of 10 to 1,000 nm and more preferably 20 to 500 nm. Prior to exposure, the resist film is heated or prebaked, preferably at a temperature of 50 to 180° C. for 10 to 300 seconds, especially at 60 to 150° C. for 15 to 200 seconds.

Next the resist film is exposed to high-energy radiation with wavelength 400 nm or shorter or EB. The high-energy radiation is typically i-line of wavelength 364 nm, KrF excimer laser of wavelength 248 nm, ArF excimer laser of wavelength 193 nm, or EUV of wavelength 13.5 nm. The ArF 193-nm lithography is most preferred. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the prebaked resist film is exposed to light through a projection lens, with pure water or another liquid introduced between the resist film and the projection lens. Since this allows lenses to be designed to a NA of 1.0 or higher, formation of finer feature size patterns is possible. The immersion lithography is important for the ArF lithography to survive to finer node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of 4 to 10 carbon atoms, ethers of 8 to 12 carbon atoms, and mixtures thereof. After formation of the resist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably performed in an exposure dose of about 1 to 200 mJ/cm$^2$, more preferably about 10 to 100 mJ/cm$^2$. This is followed by baking (PEB) on a hot plate at 50 to 150° C. for 30 seconds to 5 minutes, preferably at 60 to 120° C. for 30 seconds to 3 minutes.

Thereafter the exposed resist film is developed with a developer consisting of an organic solvent for 0.1 to 3 minutes, preferably 0.5 to 2 minutes by any conventional techniques such as dip, puddle and spray techniques. In this way, a negative resist pattern is formed on the substrate. The organic solvent used as developer is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film may be rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. Suitable aromatic solvents include toluene, xylene, ethylbenzene, isopropylbenzene, t-butylbenzene, and mesitylene. The solvents may be used alone or in admixture. After the rinse liquid is applied, the substrate may be dried by spin drying and bake. However, rinsing is not essential. As long as the step of spin drying the substrate after the developer is applied thereto is included, the rinsing step may be omitted.

Following the development, the shrink material of the invention is applied onto the resist pattern to form a shrink material coating, preferably having a thickness of 1 to 150 nm, more preferably 30 to 80 nm. The shrink material coating is baked at a temperature of 40 to 180° C. for 5 to 300 seconds. Bake functions to evaporate off the solvent and to induce acid diffusion from the resist film to the shrink material and acid-aided elimination reaction to generate olefin or crosslinked structure in the shrink material coating to induce a polarity change, for thereby rendering the shrink material coating insoluble in the organic solvent.

Finally, the excessive shrink material is removed, preferably using an organic solvent. Suitable organic solvents which can be used herein include propyl acetate, butyl acetate, isobutyl acetate, butenyl acetate, pentyl acetate, isopentyl acetate, 2-methylbutyl acetate, hexyl acetate, 2-ethylhexyl acetate, cyclohexyl acetate, methylcyclohexyl acetate, propyl formate, butyl formate, isobutyl formate, pentyl formate, isopentyl formate, hexyl formate, methyl valerate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, methyl crotonate, ethyl crotonate, propyl crotonate, isopropyl crotonate, butyl crotonate, t-butyl crotonate, methyl propionate, ethyl propionate, methyl pentenoate, ethyl pentenoate, propyl pentenoate, isopropyl pentenoate, butyl pentenoate, t-butyl pentenoate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, ethyl pivalate, propyl pivalate, isopropyl pivalate, butyl pivalate, tert-butyl pivalate, butyl propionate, isobutyl propionate, tert-butyl propionate, benzyl propionate, ethyl 3-ethoxypropionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, 2-phenylethyl acetate, 2-heptanone, 3-heptanone, 4-heptanone, 2-hexanone, 3-hexanone, 2-octanone, 3-octanone, 4-octanone, 2-nonanone, 3-nonanone, 4-nonanone, 5-nonanone, methylcyclohexanone, ethylacetophenone, acetophenone, methylacetophenone, etylacetophenone, ethyl n-butyl ketone, di-n-butyl ketone, diisobutyl ketone, 1-butanol, 2-butanol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

The organic solvent used for stripping of the shrink material may be identical with the organic solvent used as the developer. This means that development of the resist film and removal of the shrink material can be performed with an identical organic solvent. Advantageously the nozzle needed is only one.

The pattern forming process using the shrink material, when applied to a negative tone resist pattern formed via organic solvent development, is successful in reducing the size of holes and/or slits of the negative tone resist pattern in a controlled manner.

EXAMPLE

Examples of the invention are given below by way of illustration and not by way of limitation. The abbreviation "pbw" is parts by weight. For all polymers, Mw and Mn are determined by GPC versus polystyrene standards.

[1] Synthesis of Polymers

Synthesis Example 1

Synthesis of Polymer 1

In nitrogen atmosphere, 37.43 g of 4-acetoxystyrene, 5.85 g of acenaphthylene, 21.72 g of 4-(1-hydroxy-1-cyclopropyl)styrene, 7.08 g of dimethyl 2,2'-azobis(2-methyl-propionate) (V-601, Wako Pure Chemical Industries, Ltd.), and 60 g of methyl ethyl ketone as solvent were fed into a 200-mL dropping cylinder to form a monomer solution. A 500-mL flask in nitrogen atmosphere was charged with 48 g of methyl ethyl ketone, which was heated at 80° C. With stirring, the monomer solution was added dropwise to the flask over 4 hours. After the completion of dropwise addition, the polymerization solution was continuously stirred for 18 hours while maintaining its temperature at 80° C. The polymerization solution was cooled to room temperature, whereupon it was added dropwise to 1,000 g of hexane. The precipitated copolymer was collected by filtration and washed twice with 200 g of hexane. The copolymer was dissolved in a mixture of 126 g of tetrahydrofuran and 42 g of methanol in a 1-L flask of nitrogen atmosphere, and 16.9 g of ethanolamine was added to the solution, which was stirred at 60° C. for 3 hours. The reaction solution was concentrated under reduced pressure. The concentrate was dissolved in a mixture of 300 g of ethyl acetate and 80 g of water. The solution was transferred to a separatory funnel, and 8.5 g of acetic acid was added thereto, followed by separatory operation. The lower layer was discarded. To the organic layer, 80 g of water and 11.3 g of pyridine were added, followed by separatory operation. The lower layer was discarded. To the organic layer, 80 g of water was added, followed by water washing and separatory operation. The water washing and separatory operation was repeated 5 times. The organic layer after separation was concentrated and dissolved in 140 g of acetone, whereupon the acetone solution was added dropwise to 2,500 g of water. The crystallized precipitate was filtered, washed with water, and suction filtered for 2 hours. The filter cake was dissolved in 150 g of acetone again, whereupon the acetone solution was added dropwise to 2,800 g of water. The crystallized precipitate was filtered, washed with water, and dried, obtaining 45.0 g of a white polymer. The polymer was analyzed by $^{13}$C-NMR, $^{1}$H-NMR spectroscopy and GPC, with the results shown below.

hydroxystyrene:acenaphthylene:4-(1-hydroxy-1-cyclopropyl)styrene=60.0:10.0:30.0
Mw=4,000
Mw/Mn=1.66

Synthesis Examples 2 to 22 and Comparative Synthesis Examples 1 to 3

Synthesis of Polymers 2 to 22 and Comparative Polymers 1 to 3

Polymers in Table 1 were prepared by the same procedure as in Synthesis Example 1 aside from changing the type and amount of monomers. Table 1 shows the proportion (molar ratio) of units incorporated in the polymer. Tables 2 to 5 show the structure of recurring units.

TABLE 1

|  |  | Unit 1 | Proportion (mol %) | Unit 2 | Proportion (mol %) | Unit 3 | Proportion (mol %) | Unit 4 | Proportion (mol %) | Mw | Mw/Mn |
|---|---|---|---|---|---|---|---|---|---|---|---|
| Polymer | 1 | A-1 | 60 | B-1 | 30 | C-2 | 10 |  |  | 4,000 | 1.66 |
|  | 2 | A-1 | 70 | B-1 | 25 | C-1 | 5 |  |  | 5,300 | 1.67 |
|  | 3 | A-1 | 70 | B-2 | 25 | C-2 | 5 |  |  | 4,000 | 1.63 |
|  | 4 | A-1 | 80 | B-3 | 15 | C-2 | 5 |  |  | 3,900 | 1.64 |
|  | 5 | A-1 | 75 | B-4 | 20 | C-2 | 5 |  |  | 7,100 | 1.69 |
|  | 6 | A-1 | 60 | B-5 | 30 | C-1 | 10 |  |  | 3,800 | 1.68 |
|  | 7 | A-2 | 60 | B-1 | 30 | C-1 | 10 |  |  | 4,000 | 1.64 |
|  | 8 | A-2 | 65 | B-2 | 30 | C-1 | 5 |  |  | 11,500 | 1.79 |
|  | 9 | A-2 | 75 | B-3 | 20 | C-2 | 5 |  |  | 4,100 | 1.66 |
|  | 10 | A-2 | 70 | B-5 | 25 | C-2 | 5 |  |  | 4,000 | 1.65 |
|  | 11 | A-2 | 75 | B-6 | 20 | C-2 | 5 |  |  | 8,400 | 1.70 |
|  | 12 | A-2 | 70 | B-7 | 25 | C-2 | 5 |  |  | 4,300 | 1.63 |
|  | 13 | A-3 | 60 | B-1 | 30 | C-2 | 10 |  |  | 4,400 | 1.64 |
|  | 14 | A-3 | 65 | B-2 | 30 | C-1 | 5 |  |  | 10,000 | 1.75 |

TABLE 1-continued
| | | Unit 1 | Proportion (mol %) | Unit 2 | Proportion (mol %) | Unit 3 | Proportion (mol %) | Unit 4 | Proportion (mol %) | Mw | Mw/Mn |
|---|---|---|---|---|---|---|---|---|---|---|---|
| | 15 | A-3 | 75 | B-3 | 15 | C-1 | 10 | | | 17,200 | 1.81 |
| | 16 | A-3 | 75 | B-4 | 20 | C-2 | 5 | | | 4,300 | 1.63 |
| | 17 | A-3 | 60 | B-7 | 30 | C-2 | 10 | | | 4,400 | 1.64 |
| | 18 | A-3 | 70 | B-8 | 25 | C-2 | 5 | | | 6,900 | 1.65 |
| | 19 | A-1 | 65 | B-3 | 30 | C-6 | 5 | | | 7100 | 1.74 |
| | 20 | A-1 | 70 | B-3 | 25 | C-3 | 5 | | | 6,700 | 1.71 |
| | 21 | A-1 | 70 | B-3 | 25 | C-4 | 5 | | | 7,200 | 1.68 |
| | 22 | A-1 | 70 | B-3 | 25 | C-5 | 5 | | | 7,000 | 1.69 |
| Comparative Polymer | 1 | A-1 | 60 | | | C-1 | 10 | D-1 | 30 | 4,200 | 1.66 |
| | 2 | A-1 | 65 | | | C-2 | 10 | D-1 | 25 | 4,300 | 1.66 |
| | 3 | A-1 | 65 | | | C-2 | 10 | D-2 | 25 | 4,300 | 1.66 |
TABLE 2
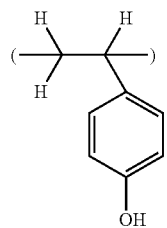
A-1
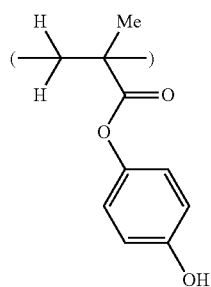
A-2
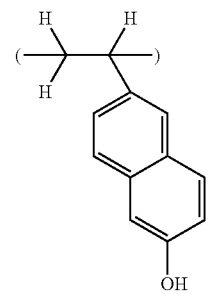
A-3
TABLE 3
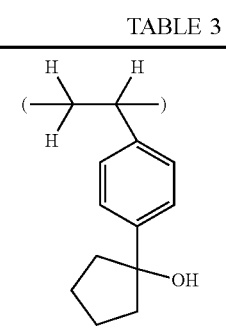
B-1
TABLE 3-continued
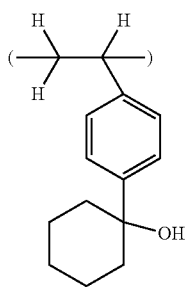
B-2
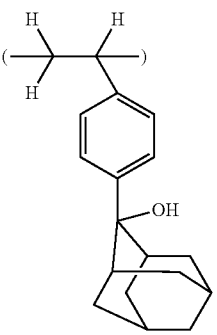 [SMILES: CCC(C)c1ccc(C2(O)C3CC4CC(C3)CC2C4)cc1]
B-3
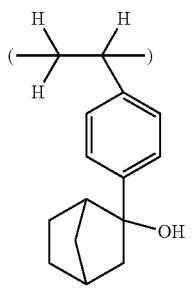
B-4
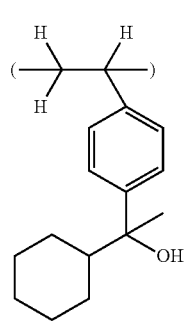 [SMILES: CCC(C)c1ccc(C(C)(O)C2CCCCC2)cc1]
B-5

TABLE 3-continued
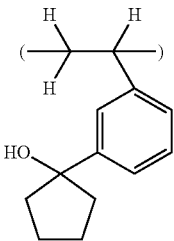 B-6
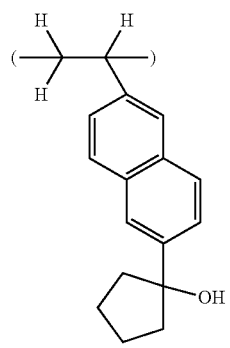 [SMILES: CCC(C)c1ccc2cc(C3(O)CCCC3)ccc2c1] B-7
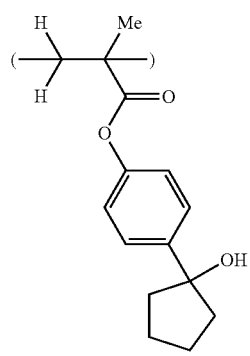 [SMILES: CCC(C)(C)C(=O)Oc1ccc(C2(O)CCCC2)cc1] B-8
TABLE 4
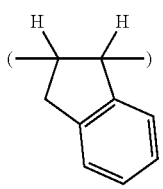 C-1
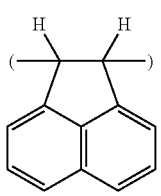 C-2
TABLE 4-continued
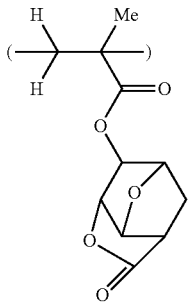 [SMILES: CCC(C)(C)C(=O)OC1C2CC3C(=O)OC1C3O2] C-3
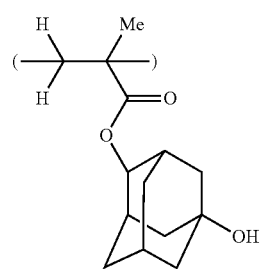 [SMILES: CCC(C)(C)C(=O)OC1C2CC3CC1CC(O)(C3)C2] C-4
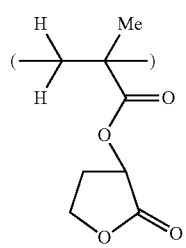 C-5
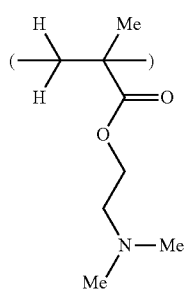 C-6
TABLE 5
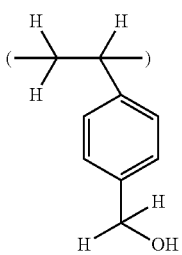 D-1

TABLE 5-continued

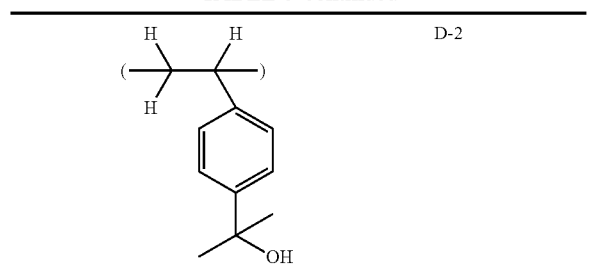

D-2

Synthesis Examples 23, 24

Synthesis of Resist Polymer 1 and Water-Repellent Polymer 1

Polymers were synthesized by combining suitable monomers in tetrahydrofuran solvent, effecting copolymerization reaction, crystallizing from methanol, repeatedly washing with hexane, isolation and drying. There were obtained random copolymers, designated Resist Polymer 1 and Water-repellent Polymer 1. The polymers were analyzed by $^1$H-NMR spectroscopy and GPC. The polymers are identified below with their analytical data.

Resist Polymer 1
Mw=7,500
Mw/Mn=1.61

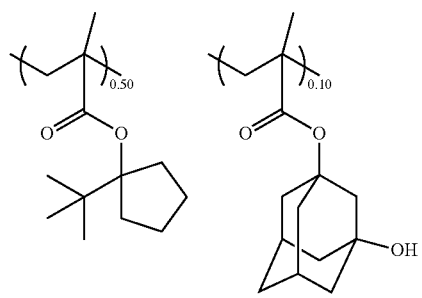

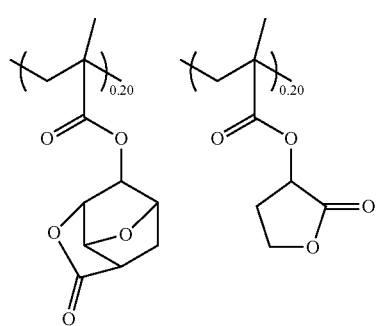

Water-Repellent Polymer 1
Mw=7,800
Mw/Mn=1.55

Water-repellent Polymer 1

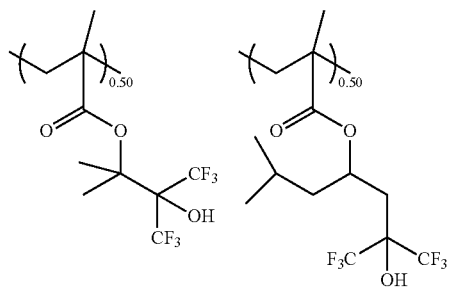

[2] Preparation of Shrink Material

Examples 1 to 42 and Comparative Examples 1 to 6

A shrink material was prepared by mixing the polymer synthesized above (Polymers 1 to 22 or Comparative Polymers 1 to 3), onium salt, basic compound, and solvent in accordance with the formulation of Tables 6 and 7, and filtering through a Teflon® filter having a pore size of 0.2 µm. Components shown in Tables 6 and 7 are identified below.

Sulfonium salt 1

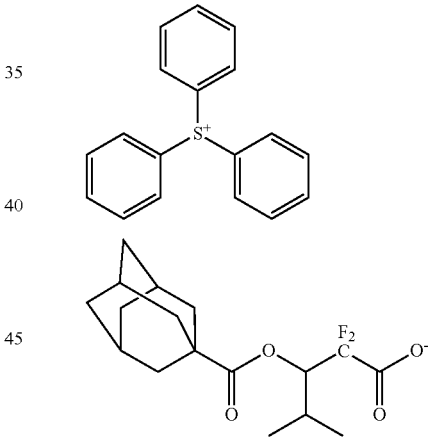

Sulfonium salt 2

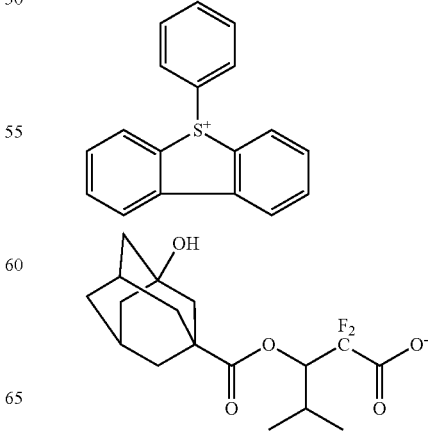

-continued
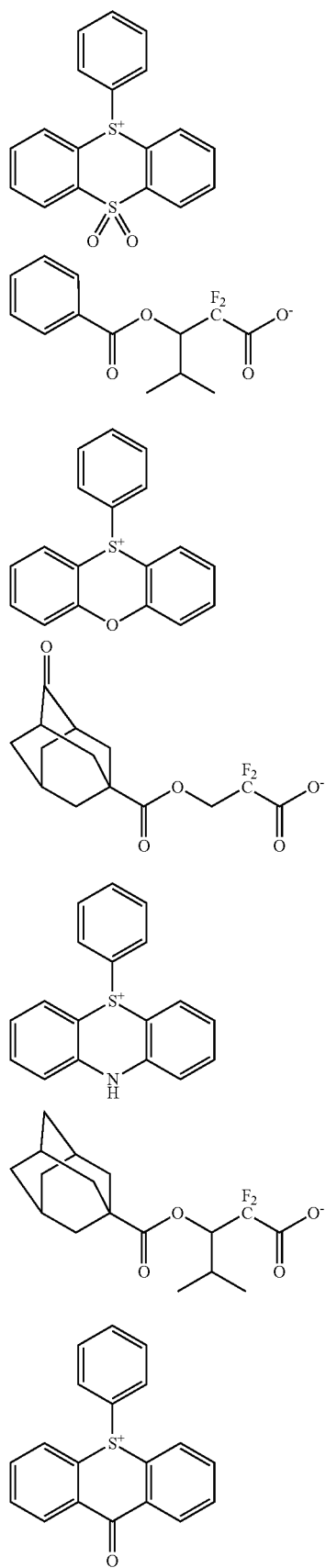
-continued
Sulfonium salt 3
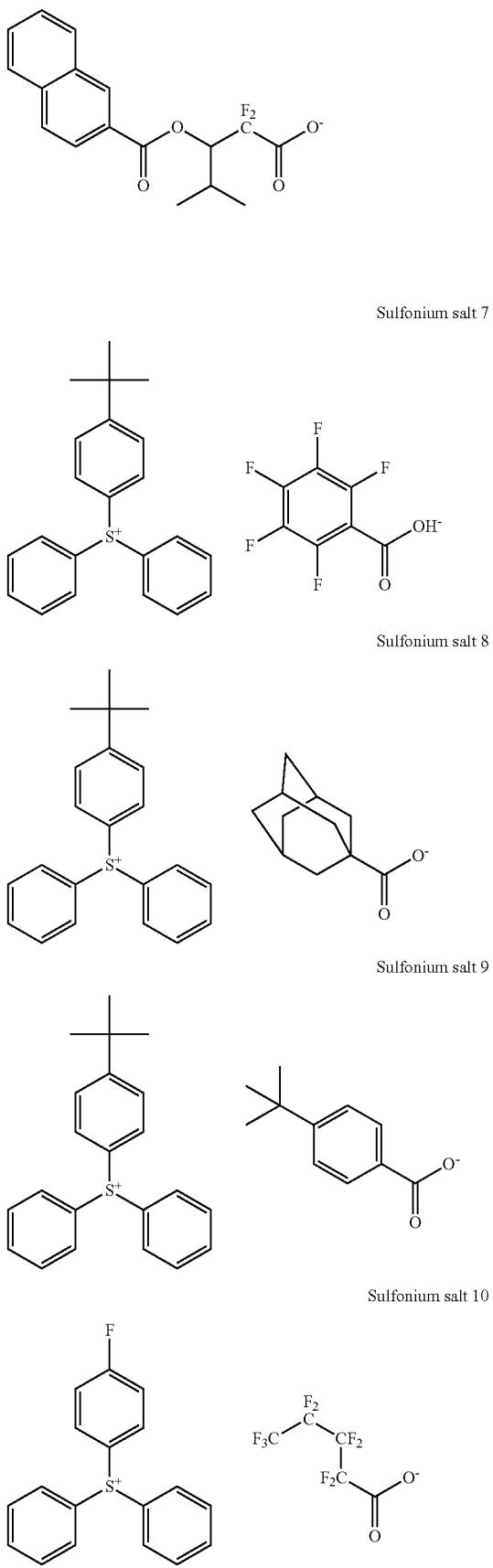
Sulfonium salt 4
Sulfonium salt 5
Sulfonium salt 6
Sulfonium salt 7
Sulfonium salt 8
Sulfonium salt 9
Sulfonium salt 10

-continued

Sulfonium Salt 11

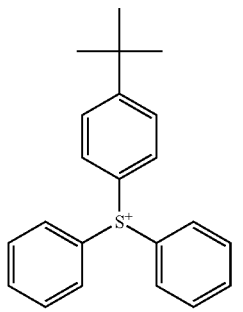 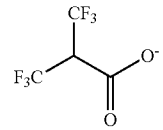

Sulfonium Salt 12

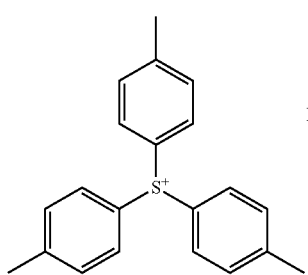 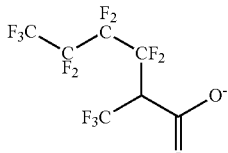

Sulfonium Salt 13

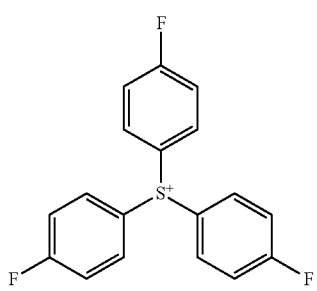 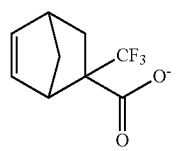

Sulfonium Salt 14

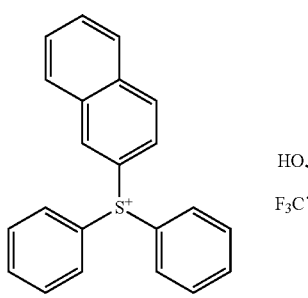 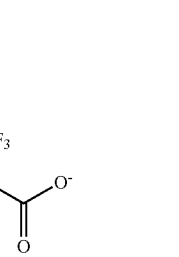

Sulfonium Salt 15

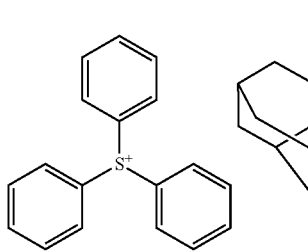 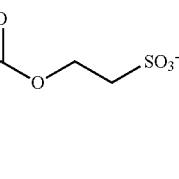

-continued

Iodonium salt 1

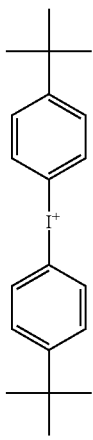 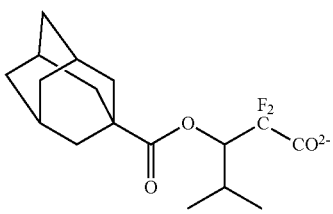

Ammonium salt 1

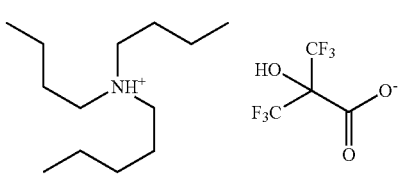

Amine quencher 1

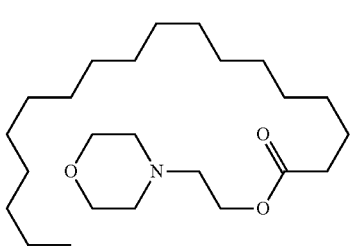

Amine quencher 2

TABLE 6

| Shrink material | Polymer (pbw) | Additive (pbw) | Organic solvent (pbw) |
|---|---|---|---|
| Shrink material 1 | Polymer 1 (100) | Sulfonium salt 1 (2.0) | 4-methyl-2-pentanol (3,000) |
| Shrink material 2 | Polymer 2 (100) | Sulfonium salt 1 (2.0) | 4-methyl-2-pentanol (3,000) |
| Shrink material 3 | Polymer 3 (100) | Sulfonium salt 1 (2.0) | 4-methyl-2-pentanol (3,000) |
| Shrink material 4 | Polymer 4 (100) | Sulfonium salt 1 (2.0) | 4-methyl-2-pentanol (1,500) butyl acetate (1,500) |
| Shrink material 5 | Polymer 5 (100) | Sulfonium salt 1 (2.0) | 4-methyl-2-pentanol (1,500) butyl acetate (1,500) |
| Shrink material 6 | Polymer 6 (100) | Sulfonium salt 1 (2.0) | 4-methyl-2-pentanol (3,000) |
| Shrink material 7 | Polymer 7 (100) | Sulfonium salt 1 (2.0) | 4-methyl-2-pentanol (3,000) |
| Shrink material 8 | Polymer 8 (100) | Sulfonium salt 1 (2.0) | 4-methyl-2-pentanol (1,500) butyl acetate (1,500) |

TABLE 6-continued

| Shrink material | Polymer (pbw) | Additive (pbw) | Organic solvent (pbw) |
|---|---|---|---|
| Shrink material 9 | Polymer 9 (100) | Sulfonium salt 1 (2.0) | 4-methyl-2-pentanol (1,500) butyl acetate (1,500) |
| Shrink material 10 | Polymer 10 (100) | Sulfonium salt 1 (2.0) | 4-methyl-2-pentanol (1,500) isopentyl acetate (1,500) |
| Shrink material 11 | Polymer 11 (100) | Sulfonium salt 1 (2.0) | 4-methyl-2-pentanol (1,500) butyl acetate (1,500) |
| Shrink material 12 | Polymer 12 (100) | Sulfonium salt 1 (2.0) | 4-methyl-2-pentanol (1,500) butyl acetate (1,500) |
| Shrink material 13 | Polymer 13 (100) | Sulfonium salt 1 (2.0) | 4-methyl-2-pentanol (3,000) |
| Shrink material 14 | Polymer 14 (100) | Sulfonium salt 1 (2.0) | 4-methyl-2-pentanol (3,000) |
| Shrink material 15 | Polymer 15 (100) | Sulfonium salt 1 (2.0) | 4-methyl-2-pentanol (3,000) |
| Shrink material 16 | Polymer 16 (100) | Sulfonium salt 1 (2.0) | 4-methyl-2-pentanol (3,000) |
| Shrink material 17 | Polymer 17 (100) | Sulfonium salt 1 (2.0) | 4-methyl-2-pentanol (1,500) butyl acetate (1,500) |
| Shrink material 18 | Polymer 18 (100) | Sulfonium salt 1 (2.0) | 4-methyl-2-pentanol (1,500) butyl acetate (1,500) |
| Shrink material 19 | Polymer 19 (100) | Sulfonium salt 1 (2.0) | 2-heptanone (3,000) |
| Shrink material 20 | Polymer 20 (100) | Sulfonium salt 1 (2.0) | 4-methyl-2-pentanol (3,000) |
| Shrink material 21 | Polymer 21 (100) | Sulfonium salt 1 (2.0) | 4-methyl-2-pentanol (3,000) |
| Shrink material 22 | Polymer 22 (100) | Sulfonium salt 1 (2.0) | 4-methyl-2-pentanol (3,000) |
| Shrink material 23 | Polymer 1 (100) | Sulfonium salt 2 (2.0) | 4-methyl-2-pentanol (3,000) |
| Shrink material 24 | Polymer 1 (100) | Sulfonium salt 3 (2.0) | 4-methyl-2-pentanol (3,000) |
| Shrink material 25 | Polymer 1 (100) | Amine quencher 1 (0.5) | 4-methyl-2-pentanol (3,000) |

TABLE 7

| Shrink material | Polymer (pbw) | Additive (pbw) | Organic solvent (pbw) |
|---|---|---|---|
| Shrink material 26 | Polymer 1 (100) | Sulfonium salt 4 (2.0) | 4-methyl-2-pentanol (1,500) butyl acetate (1,500) |
| Shrink material 27 | Polymer 1 (100) | Sulfonium salt 5 (2.0) | 4-methyl-2-pentanol (1,500) butyl acetate (1,500) |
| Shrink material 28 | Polymer 1 (100) | Sulfonium salt 6 (2.0) | 4-methyl-2-pentanol (1,500) butyl acetate (1,500) |
| Shrink material 29 | Polymer 1 (100) | Sulfonium salt 7 (2.0) | 4-methyl-2-pentanol (3,000) |
| Shrink material 30 | Polymer 1 (100) | Sulfonium salt 8 (2.0) | 4-methyl-2-pentanol (1,500) butyl acetate (1,500) |
| Shrink material 31 | Polymer 1 (100) | Sulfonium salt 9 (2.0) | 4-methyl-2-pentanol (3,000) |
| Shrink material 32 | Polymer 1 (100) | Sulfonium salt 10 (2.0) | 4-methyl-2-pentanol (3,000) |
| Shrink material 33 | Polymer 1 (100) | Sulfonium salt 11 (2.0) | 4-methyl-2-pentanol (3,000) |
| Shrink material 34 | Polymer 1 (100) | Sulfonium salt 12 (2.0) | 4-methyl-2-pentanol (3,000) |
| Shrink material 35 | Polymer 1 (100) | Sulfonium salt 13 (2.0) | 4-methyl-2-pentanol (1,500) butyl acetate (1,500) |
| Shrink material 36 | Polymer 1 (100) | Sulfonium salt 14 (2.0) | 4-methyl-2-pentanol (1,500) butyl acetate (1,500) |
| Shrink material 37 | Polymer 1 (100) | Sulfonium salt 15 (2.0) | diisopentyl ether (1,000) 2-methyl-2-pentanol (2,000) |
| Shrink material 38 | Polymer 1 (100) | Iodonium salt 1 (2.0) | 4-methyl-2-pentanol (1,500) butyl acetate (1,500) |
| Shrink material 39 | Polymer 1 (100) | Ammonium salt 1 (2.0) | 4-methyl-2-pentanol (1,500) butyl acetate (1,500) |
| Shrink material 40 | Polymer 1 (100) | Amine quencher 2 (0.5) | 4-methyl-2-pentanol (3,000) |
| Shrink material 41 | Polymer 1 (100) |  | 4-methyl-2-pentanol (3,000) |
| Shrink material 42 | Polymer 4 (100) |  | 4-methyl-2-pentanol (3,000) |
| Comparative shrink material 1 | Comparative Polymer 1 (100) |  | 4-methyl-2-pentanol (3,000) |
| Comparative shrink material 2 | Comparative Polymer 2 (100) |  | 4-methyl-2-pentanol (3,000) |
| Comparative shrink material 3 | Comparative Polymer 3 (100) |  | 4-methyl-2-pentanol (3,000) |
| Comparative shrink material 4 | Comparative Polymer 1 (100) | Sulfonium salt 1 (2.0) | 4-methyl-2-pentanol (3,000) |
| Comparative shrink material 5 | Comparative Polymer 2 (100) | Sulfonium salt 1 (2.0) | 4-methyl-2-pentanol (3,000) |
| Comparative shrink material 6 | Comparative Polymer 3 (100) | Sulfonium salt 1 (2.0) | 4-methyl-2-pentanol (1,500) diisopentyl ether (1,500) |

[3] Preparation of Resist Composition

A resist composition in solution form was prepared by dissolving a polymer (Resist Polymer 1), acid generator, quencher, and water-repellent polymer in a solvent in accordance with the formulation of Table 8, adding 100 ppm of surfactant FC-4430 (3M) thereto, and filtering through a filter with a pore size of 0.2 μm. In Table 8, PGMEA is propylene glycol monomethyl ether acetate, and PAG1 is identified below.

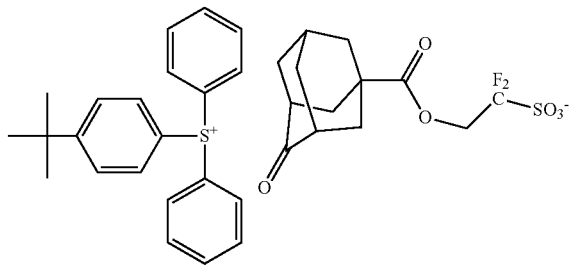

PAG 1

TABLE 8

| Resist | Polymer (pbw) | Acid generator (pbw) | Quencher (pbw) | Water repellent (pbw) | Organic solvent (pbw) |
|---|---|---|---|---|---|
| Resist 1 | Resist Polymer 1 (100) | PAG1 (10.0) | Amine quencher 1 (2.0) | Water-repellent Polymer 1 (3.0) | PGMEA (2,500) γ-butyrolactone (200) |

[4] ArF Lithography Patterning Test

On a silicon wafer, a spin-on carbon film ODL-101 (Shin-Etsu Chemical Co., Ltd.) was deposited to a thickness of 180 nm and a silicon-containing spin-on hard mask SHB-A940 was deposited thereon to a thickness of 40 nm. On this substrate for trilayer process, the resist composition in Table 8 was spin coated, then baked on a hot plate at 100° C. for 60 seconds to form a resist film of 90 nm thick. Using an ArF excimer laser immersion lithography scanner NSR-610C (Nikon Corp., NA 1.30, σ 0.90/0.70, annular illumination), the resist film was exposed through a 6% halftone phase shift mask while varying the exposure dose. After the exposure, the resist film was baked (PEB) at 90° C. for 60 seconds and puddle developed in n-butyl acetate for 30 seconds to form a hole pattern having a hole size of 50 nm and a pitch of 150 nm.

The shrink material shown in Tables 6 and 7 was applied onto the resist pattern after development to cover the pattern. The shrink material coating was baked at the temperature shown in Tables 9 and 10 for 60 seconds. This was followed by puddle development in 4-methyl-2-pentanol for 10 seconds to remove the excessive shrink material. Both after development and after shrink treatment, the pattern was observed under a CD-SEM (CG-4000 by Hitachi, Ltd.) to measure the size of holes at a pitch of 150 nm. The results are shown in Tables 9 and 10.

TABLE 9

| | | Resist | Pattern size after development (nm) | Variation of hole size after development (3σ, nm) | Shrink material | Bake temp. (° C.) | Pattern size after removal of shrink material (nm) | Variation of hole size after removal of shrink material (3σ, nm) |
|---|---|---|---|---|---|---|---|---|
| Example | 1 | Resist 1 (100) | 52 | 6.3 | Shrink material 1 | 130 | 29 | 3.8 |
| | 2 | Resist 1 (100) | 50 | 6.4 | Shrink material 2 | 130 | 27 | 3.5 |
| | 3 | Resist 1 (100) | 51 | 6.2 | Shrink material 3 | 135 | 27 | 3.8 |
| | 4 | Resist 1 (100) | 52 | 6.7 | Shrink material 4 | 130 | 27 | 3.7 |
| | 5 | Resist 1 (100) | 50 | 6.3 | Shrink material 5 | 130 | 29 | 4.0 |
| | 6 | Resist 1 (100) | 50 | 6.4 | Shrink material 6 | 130 | 26 | 3.7 |
| | 7 | Resist 1 (100) | 50 | 6.5 | Shrink material 7 | 130 | 27 | 3.9 |
| | 8 | Resist 1 (100) | 51 | 6.2 | Shrink material 8 | 130 | 28 | 3.9 |
| | 9 | Resist 1 (100) | 49 | 6.6 | Shrink material 9 | 130 | 25 | 4.0 |
| | 10 | Resist 1 (100) | 51 | 6.4 | Shrink material 10 | 135 | 26 | 3.6 |
| | 11 | Resist 1 (100) | 51 | 6.5 | Shrink material 11 | 130 | 26 | 4.0 |
| | 12 | Resist 1 (100) | 52 | 6.1 | Shrink material 12 | 130 | 27 | 3.6 |
| | 13 | Resist 1 (100) | 51 | 6.2 | Shrink material 13 | 135 | 28 | 3.6 |
| | 14 | Resist 1 (100) | 49 | 6.3 | Shrink material 14 | 130 | 27 | 3.7 |
| | 15 | Resist 1 (100) | 50 | 6.2 | Shrink material 15 | 130 | 29 | 3.5 |
| | 16 | Resist 1 (100) | 51 | 6.4 | Shrink material 16 | 130 | 26 | 3.6 |
| | 17 | Resist 1 (100) | 49 | 6.1 | Shrink material 17 | 135 | 27 | 3.4 |
| | 18 | Resist 1 (100) | 50 | 6.5 | Shrink material 18 | 130 | 28 | 3.6 |
| | 19 | Resist 1 (100) | 50 | 6.2 | Shrink material 19 | 130 | 24 | 4.7 |

TABLE 9-continued

|  | Resist | Pattern size after development (nm) | Variation of hole size after development (3σ, nm) | Shrink material | Bake temp. (° C.) | Pattern size after removal of shrink material (nm) | Variation of hole size after removal of shrink material (3σ, nm) |
|---|---|---|---|---|---|---|---|
| 20 | Resist 1 (100) | 49 | 6.1 | Shrink material 20 | 130 | 27 | 3.4 |
| 21 | Resist 1 (100) | 51 | 6.3 | Shrink material 21 | 130 | 26 | 3.7 |
| 22 | Resist 1 (100) | 50 | 6.4 | Shrink material 22 | 130 | 25 | 3.5 |
| 23 | Resist 1 (100) | 49 | 6.1 | Shrink material 23 | 135 | 27 | 3.5 |
| 24 | Resist 1 (100) | 49 | 6.3 | Shrink material 24 | 130 | 24 | 4.7 |
| 25 | Resist 1 (100) | 52 | 6.2 | Shrink material 25 | 130 | 29 | 3.9 |

TABLE 10

|  |  | Resist | Pattern size after development (nm) | Variation of hole size after development (3σ, nm) | Shrink material | Bake temp. (° C.) | Pattern size after removal of shrink material (nm) | Variation of hole size after removal of shrink material (3σ, nm) |
|---|---|---|---|---|---|---|---|---|
| Example | 26 | Resist 1 | 51 | 6.4 | Shrink material 26 | 130 | 28 | 3.6 |
|  | 27 | Resist 1 | 51 | 6.5 | Shrink material 27 | 130 | 28 | 3.3 |
|  | 28 | Resist 1 | 50 | 6.0 | Shrink material 28 | 135 | 28 | 3.9 |
|  | 29 | Resist 1 | 52 | 6.1 | Shrink material 29 | 130 | 29 | 3.8 |
|  | 30 | Resist 1 | 49 | 6.3 | Shrink material 30 | 135 | 26 | 4.0 |
|  | 31 | Resist 1 | 52 | 6.5 | Shrink material 31 | 130 | 26 | 3.5 |
|  | 32 | Resist 1 | 49 | 6.2 | Shrink material 32 | 135 | 27 | 3.8 |
|  | 33 | Resist 1 | 50 | 6.2 | Shrink material 33 | 135 | 25 | 3.9 |
|  | 34 | Resist 1 | 51 | 6.2 | Shrink material 34 | 130 | 26 | 3.6 |
|  | 35 | Resist 1 | 52 | 6.4 | Shrink material 35 | 130 | 28 | 3.9 |
|  | 36 | Resist 1 | 50 | 6.3 | Shrink material 36 | 130 | 28 | 4.1 |
|  | 37 | Resist 1 | 51 | 6.4 | Shrink material 37 | 135 | 25 | 4.0 |
|  | 38 | Resist 1 | 52 | 6.4 | Shrink material 38 | 130 | 25 | 4.2 |
|  | 39 | Resist 1 | 50 | 6.1 | Shrink material 39 | 130 | 27 | 4.8 |
|  | 40 | Resist 1 | 50 | 6.3 | Shrink material 40 | 135 | 31 | 4.9 |
|  | 41 | Resist 1 | 52 | 6.3 | Shrink material 41 | 130 | 31 | 4.8 |
|  | 42 | Resist 1 | 51 | 6.0 | Shrink material 42 | 130 | 24 | 4.7 |
| Comparative Example | 1 | Resist 1 | 50 | 6.0 | Comparative shrink material 1 | 130 | 44 | 11.5 |
|  | 2 | Resist 1 | 51 | 6.5 | Comparative shrink material 2 | 130 | 44 | 10.5 |
|  | 3 | Resist 1 | 48 | 6.4 | Comparative shrink material 3 | 130 | 33 | 7.2 |
|  | 4 | Resist 1 | 50 | 6.0 | Comparative shrink material 4 | 130 | 47 | 7.8 |
|  | 5 | Resist 1 | 50 | 6.1 | Comparative shrink material 5 | 130 | 47 | 7.6 |
|  | 6 | Resist 1 | 50 | 6.2 | Comparative shrink material 6 | 130 | 38 | 5.1 |

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application Nos. 2014-248080 and 2015-077690 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

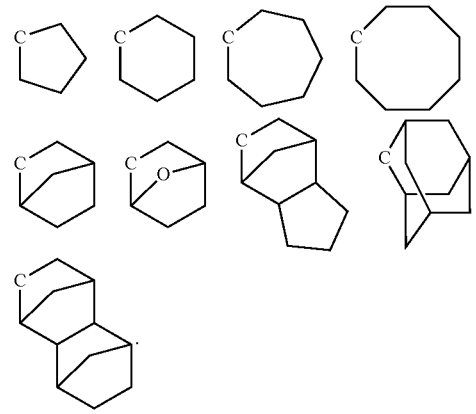

The invention claimed is:

1. A shrink material comprising a polymer and a solvent containing an anti-vanishing solvent which does not cause a resist pattern after development to vanish,
said polymer comprising recurring units having the formula (1a):

(1a)

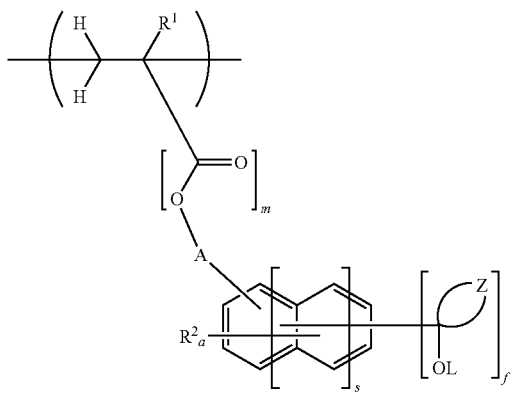

wherein A is a single bond or a $C_1$-$C_{10}$ alkylene group which may contain an ethereal oxygen atom at an intermediate of the chain, $R^1$ is hydrogen, fluorine, methyl or trifluoromethyl, $R^2$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group, L is hydrogen, a straight, branched or cyclic, $C_1$-$C_{10}$ monovalent aliphatic hydrocarbon group which may contain an ethereal oxygen atom, carbonyl moiety or carbonyloxy moiety at an intermediate of the chain, or an optionally substituted, monovalent aromatic ring-containing group, Z bonds with the carbon atom to form a $C_5$-$C_{15}$ alicyclic group, f is an integer of 1 to 3, s is an integer of 0 to 2, a is equal to (5+2s−f), and m is 0 or 1.

2. The shrink material of claim 1 wherein said polymer further comprises recurring units having the formula (2):

(2)

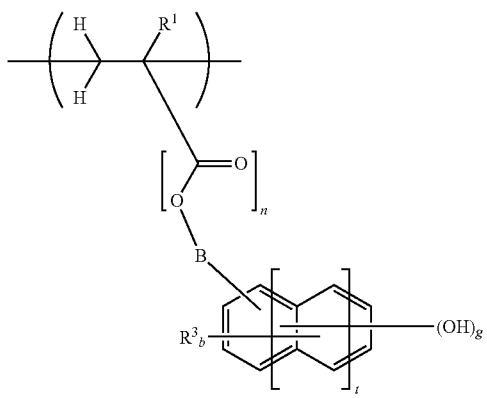

wherein B is a single bond or a $C_1$-$C_{10}$ alkylene group which may contain an ethereal oxygen atom at an intermediate of the chain, $R^1$ is as defined above, $R^3$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group, g is an integer of 0 to 3, t is an integer of 0 to 2, b is equal to (5+2t−g), and n is 0 or 1.

3. The shrink material of claim 1 wherein said polymer further comprises recurring units having the formula (3):

(3)

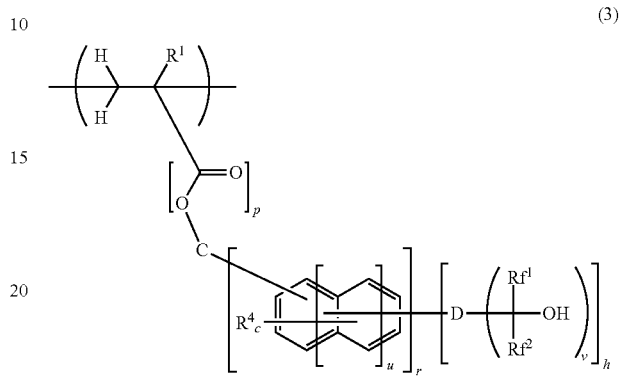

wherein C is a single bond or a $C_1$-$C_{10}$ alkylene group which may contain an ethereal oxygen atom at an intermediate of the chain, $R^1$ is as defined above, $R^4$ is each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group, D is a single bond or a straight, branched or cyclic, $C_1$-$C_{10}$ (v+1)-valent hydrocarbon group which may contain an ethereal oxygen atom, carbonyl moiety or carbonyloxy moiety at an intermediate of the chain, in which some or all carbon-bonded hydrogen atoms may be substituted by fluorine, $Rf^1$ and $Rf^2$ are each independently a $C_1$-$C_6$ alkyl group containing at least one fluorine atom, $Rf^1$ may bond with D to form a ring with the carbon atoms to which they are attached, r is 0 or 1, h is an integer of 1 to 3, u is an integer of 0 to 2, c is equal to (5+2u−h), and v is 1 or 2.

4. The shrink material of claim 1 wherein said polymer further comprises recurring units of at least one type selected from units having the formulae (4) and (5):

(4)

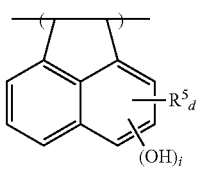

(5)

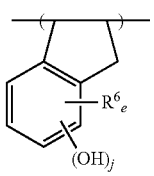

wherein R⁵ and R⁶ are each independently hydrogen, halogen, an optionally halo-substituted, straight, branched or cyclic, $C_2$-$C_8$ acyloxy group, an optionally halo-substituted, straight, branched or cyclic, $C_1$-$C_6$ alkyl group, or an optionally halo-substituted, straight, branched or cyclic, $C_1$-$C_6$ alkoxy group, i and j are each independently an integer of 0 to 2, d is equal to (6−i), and e is equal to (4−j).

5. The shrink material of claim 1 wherein said polymer further comprises recurring units of at least one type selected from units having the formulae (A) to (E):

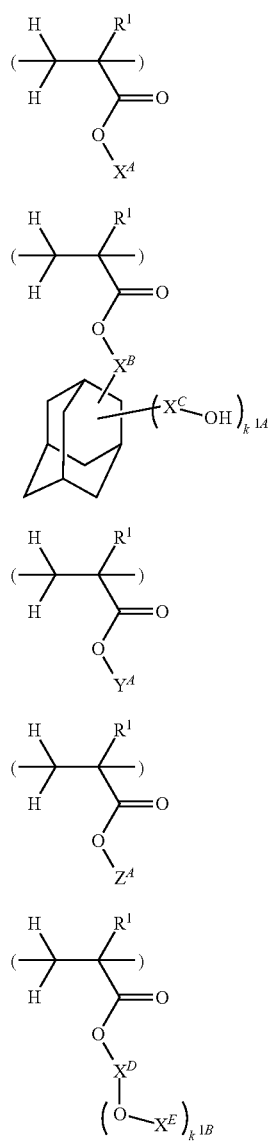

wherein R¹ is as defined above, $X^A$ is an acid labile group, $X^B$ and $X^C$ are each independently a single bond or a straight or branched $C_1$-$C_4$ divalent hydrocarbon group, $X^D$ is a straight, branched or cyclic, $C_1$-$C_{16}$ di- to pentavalent aliphatic hydrocarbon group in which any constituent —CH₂— may be substituted by —O— or —C(=O)—, $X^E$ is an acid labile group, $Y^A$ is a substituent group having a lactone, sultone or carbonate structure, $Z^A$ is hydrogen, a $C_1$-$C_{30}$ fluoroalkyl group or a $C_1$-$C_{15}$ fluoroalcohol-containing substituent group, $k^{1A}$ is an integer of 1 to 3, and $k^{1B}$ is an integer of 1 to 4.

6. The shrink material of claim 1 wherein said polymer further comprises recurring units having the formula (F):

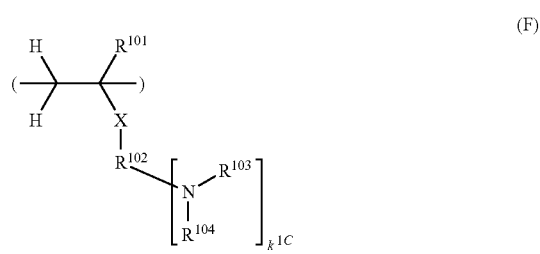

wherein $R^{101}$ is hydrogen or methyl, X is a single bond, —C(=O)—, —C(=O)—O— or —C(=O)—NH—, $R^{102}$ is a single bond or a straight, branched or cyclic $C_1$-$C_{10}$ alkylene group which may contain an ether, ester, carbonyl moiety, —N= or —S—, or a phenylene or naphthylene group, $R^{103}$ and $R^{104}$ are each independently hydrogen, a straight or branched $C_1$-$C_4$ alkyl group, or an acid labile group, or $R^{103}$ and $R^{104}$ may bond together to form a ring with the nitrogen atom to which they are attached, the ring optionally containing an ether bond, or either one of $R^{103}$ and $R^{104}$ may bond with $R^{102}$ to form a ring with the nitrogen atom to which they are attached, and $k^{1C}$ is 1 or 2.

7. The shrink material of claim 1, further comprising a salt having the formula (9):

$$R^{11}-CO_2^- M^+ \qquad (9)$$

wherein $R^{11}$ is a straight, branched or cyclic $C_1$-$C_{20}$ alkyl group, straight, branched or cyclic $C_2$-$C_{20}$ alkenyl group or $C_6$-$C_{20}$ monovalent aromatic ring-containing group, in which some or all carbon-bonded hydrogen atoms may be substituted by fluorine, lactone ring-containing moiety, lactam ring-containing moiety or hydroxyl moiety, and in which an ether, ester or carbonyl moiety may intervene in a carbon-carbon bond, and M⁺ is a sulfonium, iodonium or ammonium cation.

8. The shrink material of claim 1, further comprising a salt having the formula (10):

$$R^{12}-SO_3^- M^+ \qquad (10)$$

wherein $R^{12}$ is a straight, branched or cyclic $C_1$-$C_{35}$ monovalent hydrocarbon group which may contain an oxygen atom, in which some or all carbon-bonded hydrogen atoms may be substituted by fluorine, with the proviso that the hydrogen atom bonded to the carbon atom at α-position relative to sulfonic acid is not substituted by fluorine, and M⁺ is a sulfonium, iodonium or ammonium cation.

9. The shrink material of claim 1, further comprising at least one basic compound selected from the group consisting of primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamates.

10. The shrink material of claim 1 wherein the anti-vanishing solvent is an ester solvent of 7 to 16 carbon atoms, ketone solvent of 8 to 16 carbon atoms, or alcohol solvent of 4 to 10 carbon atoms.

11. The shrink material of claim 10 wherein the anti-vanishing solvent is at least one solvent selected from the group consisting of:
ester solvents of 7 to 16 carbon atoms including pentyl acetate, isopentyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate,
ketone solvents of 8 to 16 carbon atoms including 2-octanone, 3-octanone, 4-octanone, 2-nonanone, 3-nonanone, 4-nonanone, 5-nonanone, diisobutyl ketone, ethylcyclohexanone, ethylacetophenone, ethyl n-butyl ketone, di-n-butyl ketone, and diisobutyl ketone, and
alcohol solvents of 4 to 10 carbon atoms including 1-butanol, 2-butanol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

12. The shrink material of claim 1 wherein said solvent contains the anti-vanishing solvent and an additional solvent,
the additional solvent being selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

13. The shrink material of claim 1 wherein the $C_5$-$C_{15}$ alicyclic group is selected form the group consisting of the following formulae: